(12) United States Patent
Nuzzo et al.

(10) Patent No.: US 7,943,491 B2
(45) Date of Patent: *May 17, 2011

(54) PATTERN TRANSFER PRINTING BY KINETIC CONTROL OF ADHESION TO AN ELASTOMERIC STAMP

(75) Inventors: Ralph G. Nuzzo, Champaign, IL (US); John A. Rogers, Champaign, IL (US); Etienne Menard, Urbana, IL (US); Keon Jae Lee, Tokyo (JP); Dahl-Young Khang, Urbana, IL (US); Yugang Sun, Champaign, IL (US); Matthew Meitl, Champaign, IL (US); Zhengtao Zhu, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 1377 days.

This patent is subject to a terminal disclaimer.

(21) Appl. No.: 11/423,192

(22) Filed: Jun. 9, 2006

(65) Prior Publication Data

US 2009/0199960 A1 Aug. 13, 2009

Related U.S. Application Data

(63) Continuation-in-part of application No. 11/145,542, filed on Jun. 2, 2005, now Pat. No. 7,557,367, and a continuation-in-part of application No. 11/145,574, filed on Jun. 2, 2005, now Pat. No. 7,622,367.

(60) Provisional application No. 60/577,077, filed on Jun. 4, 2004, provisional application No. 60/601,061, filed on Aug. 11, 2004, provisional application No. 60/650,305, filed on Feb. 4, 2005, provisional application No. 60/663,391, filed on Mar. 18, 2005, provisional application No. 60/677,617, filed on May 4, 2005.

(51) Int. Cl.
*H01L 29/72* (2006.01)

(52) U.S. Cl. ........ 438/472; 438/106; 438/484; 438/490; 438/700; 438/735; 257/E21.122; 257/E21.499; 257/E23.065; 257/E23.177; 257/E21.505; 257/E21.567

(58) Field of Classification Search .................. 438/106, 438/484, 490, 700, 735; 257/E21.122, E21.499, 257/E21.505, E21.567, E23.065, E23.177
See application file for complete search history.

(56) References Cited

U.S. PATENT DOCUMENTS 4,761,335 A 8/1988 Aurichio et al.
(Continued)

FOREIGN PATENT DOCUMENTS

JP 2002092984 3/2002
(Continued)

OTHER PUBLICATIONS

Allen et al. (Feb. 20, 2006) "Nanomaterial Transfer Using Hot Embossing for Flexible Electronic Devices," *Appl. Phys. Lett.* 88:083112.

(Continued)

*Primary Examiner* — Edward Wojciechowicz
(74) *Attorney, Agent, or Firm* — Greenlee Sullivan P.C.

(57) ABSTRACT

The present invention provides methods, systems and system components for transferring, assembling and integrating features and arrays of features having selected nanosized and/or microsized physical dimensions, shapes and spatial orientations. Methods of the present invention utilize principles of 'soft adhesion' to guide the transfer, assembly and/or integration of features, such as printable semiconductor elements or other components of electronic devices. Methods of the present invention are useful for transferring features from a donor substrate to the transfer surface of an elastomeric transfer device and, optionally, from the transfer surface of an elastomeric transfer device to the receiving surface of a receiving substrate. The present methods and systems provide highly efficient, registered transfer of features and arrays of features, such as printable semiconductor element, in a concerted manner that maintains the relative spatial orientations of transferred features.

40 Claims, 28 Drawing Sheets

U.S. PATENT DOCUMENTS

| | | | |
|---|---|---|---|
| 4,766,670 | A | 8/1988 | Gazdik et al. |
| 5,545,291 | A | 8/1996 | Smith et al. |
| 5,772,905 | A | 6/1998 | Chou |
| 5,783,856 | A | 7/1998 | Smith et al. |
| 5,817,242 | A | 10/1998 | Biebuyck et al. |
| 5,824,186 | A | 10/1998 | Smith et al. |
| 5,904,545 | A | 5/1999 | Smith et al. |
| 6,225,149 | B1 | 5/2001 | Gan et al. |
| 6,274,508 | B1 | 8/2001 | Jacobsen et al. |
| 6,281,038 | B1 | 8/2001 | Jacobsen et al. |
| 6,291,896 | B1 | 9/2001 | Smith |
| 6,316,278 | B1 | 11/2001 | Jacobsen et al. |
| 6,334,960 | B1 | 1/2002 | Wilson et al. |
| 6,380,729 | B1 | 4/2002 | Smith |
| 6,403,397 | B1 | 6/2002 | Katz |
| 6,417,025 | B1 | 7/2002 | Gengel |
| 6,420,266 | B1 | 7/2002 | Smith et al. |
| 6,468,638 | B2 | 10/2002 | Jacobsen et al. |
| 6,479,395 | B1 | 11/2002 | Smith et al. |
| 6,527,964 | B1 | 3/2003 | Smith et al. |
| 6,555,408 | B1 | 4/2003 | Jacobsen et al. |
| 6,566,744 | B2 | 5/2003 | Gengel |
| 6,580,151 | B2 | 6/2003 | Vandeputte et al. |
| 6,586,338 | B2 | 7/2003 | Smith et al. |
| 6,590,346 | B1 | 7/2003 | Hadley et al. |
| 6,606,079 | B1 | 8/2003 | Smith |
| 6,606,247 | B2 | 8/2003 | Credelle et al. |
| 6,608,370 | B1 | 8/2003 | Chen et al. |
| 6,623,579 | B1 | 9/2003 | Smith et al. |
| 6,655,286 | B2 | 12/2003 | Rogers |
| 6,657,289 | B1 | 12/2003 | Craig et al. |
| 6,665,044 | B1 | 12/2003 | Jacobson et al. |
| 6,683,663 | B1 | 1/2004 | Hadley et al. |
| 6,693,384 | B1 | 2/2004 | Vicentini et al. |
| 6,723,576 | B2 | 4/2004 | Nozawa et al. |
| 6,730,990 | B2 | 5/2004 | Kondo et al. |
| 6,731,353 | B1 | 5/2004 | Credelle et al. |
| 6,780,696 | B1 | 8/2004 | Schatz |
| 6,814,898 | B1 | 11/2004 | Deeman et al. |
| 6,816,380 | B2 | 11/2004 | Credelle et al. |
| 6,844,673 | B1 | 1/2005 | Bernkopf |
| 6,848,162 | B2 | 2/2005 | Arneson et al. |
| 6,850,312 | B2 | 2/2005 | Jacobsen et al. |
| 6,863,219 | B1 | 3/2005 | Jacobsen et al. |
| 6,864,435 | B2 | 3/2005 | Hermanns et al. |
| 6,864,570 | B2 | 3/2005 | Smith |
| 6,872,645 | B2 | 3/2005 | Duan et al. |
| 6,878,871 | B2 | 4/2005 | Scher et al. |
| 6,949,199 | B1 | 9/2005 | Gauzner et al. |
| 6,949,206 | B2 | 9/2005 | Whitford |
| 7,169,669 | B2 | 1/2007 | Blakers et al. |
| 7,195,733 | B2 | 3/2007 | Rogers et al. |
| 7,255,919 | B2 | 8/2007 | Sakata et al. |
| 7,374,968 | B2 | 5/2008 | Kornilovich et al. |
| 7,521,292 | B2 | 4/2009 | Rogers et al. |
| 7,557,367 | B2 | 7/2009 | Rogers et al. |
| 7,622,367 | B1 * | 11/2009 | Nuzzo et al. ............ 438/472 |
| 2003/0006527 | A1 | 1/2003 | Rabolt et al. |
| 2003/0178316 | A1 | 9/2003 | Jacobs et al. |
| 2003/0227116 | A1 | 12/2003 | Halik et al. |
| 2004/0005723 | A1 | 1/2004 | Empedocles et al. |
| 2004/0026684 | A1 | 2/2004 | Empedocles et al. |
| 2004/0079464 | A1 | 4/2004 | Kumakura |
| 2004/0095658 | A1 | 5/2004 | Buretea et al. |
| 2004/0112964 | A1 | 6/2004 | Empedocles et al. |
| 2004/0136866 | A1 | 7/2004 | Pontis et al. |
| 2004/0146560 | A1 | 7/2004 | Whiteford et al. |
| 2004/0178390 | A1 | 9/2004 | Whiteford |
| 2004/0192082 | A1 | 9/2004 | Wagner et al. |
| 2004/0206448 | A1 | 10/2004 | Dubrow |
| 2004/0250950 | A1 | 12/2004 | Dubrow |
| 2005/0038498 | A1 | 2/2005 | Dubrow et al. |
| 2005/0238967 | A1 | 10/2005 | Rogers et al. |
| 2006/0038182 | A1 | 2/2006 | Rogers et al. |
| 2006/0127817 | A1 | 6/2006 | Ramanujan et al. |
| 2006/0134893 | A1 | 6/2006 | Savage et al. |
| 2006/0244105 | A1 | 11/2006 | Forbes et al. |

FOREIGN PATENT DOCUMENTS

| | | |
|---|---|---|
| TW | 367570 | 8/1999 |
| TW | 494257 | 7/2002 |
| WO | 00/46854 | 8/2000 |
| WO | 00/49421 | 8/2000 |
| WO | 00/49658 | 8/2000 |
| WO | 00/55915 | 9/2000 |
| WO | 00/55916 | 9/2000 |
| WO | 01/33621 | 5/2001 |
| WO | 02/27701 | 4/2002 |
| WO | 02/43032 | 5/2002 |
| WO | 02/097708 | 12/2002 |
| WO | 02/097724 | 12/2002 |
| WO | 03/032240 | 4/2003 |
| WO | 03/049201 | 6/2003 |
| WO | 03/063211 | 7/2003 |
| WO | 03/085700 | 10/2003 |
| WO | 03/085701 | 10/2003 |
| WO | 03/092073 | 11/2003 |
| WO | 2004/003535 | 1/2004 |
| WO | 2004/022637 | 3/2004 |
| WO | 2004/022714 | 3/2004 |
| WO | 2004/023527 | 3/2004 |
| WO | 2004/024407 | 3/2004 |
| WO | 2004/027822 | 4/2004 |
| WO | 2004/032190 | 4/2004 |
| WO | 2004/032191 | 4/2004 |
| WO | 2004/032193 | 4/2004 |
| WO | 2004/034025 | 4/2004 |
| WO | 2004/086289 | 10/2004 |
| WO | 2004/094303 | 11/2004 |
| WO | 2004/100252 | 11/2004 |
| WO | 2004/099068 | 12/2004 |
| WO | 2004/105456 | 12/2004 |
| WO | 2005/005679 | 1/2005 |
| WO | 2005/015480 | 2/2005 |
| WO | 2005/017962 | 2/2005 |
| WO | 2005/022120 | 3/2005 |

OTHER PUBLICATIONS

Bachtold et al. (Nov. 9, 2001) "Logic Circuits with Carbon Nanotube Transistors," *Science* 294:1317-1320.

Balmer et al. (2005) "Diffusion of Alkanethiols in PDMS and Its Implications on Microcontact Printing (μCP)," *Langmuir* 21(2):622-632.

Bao et al. (1997) "High-Performance Plastic Transistors Fabricated by Printing Techniques," *Chem. Mater.* 9:1299-1301.

Bietsch et al. (Oct. 1, 2000) "Conformal Contact and Pattern Stability of Stamps Used for Soft Lithography," *J. Appl. Phys.* 88(7):4310-4318.

Blazdell et al. (Nov. 1999) "Preparation of Ceramic Inks for Solid Freeforming Using a Continuous Jet Printer," *J. Mat. Syn. Process.* 7(6):349-356.

Burdinski et al. (2005) "Single Etch Patterning of Stacked Silver and Molybdenum Alloy Layers on Glass Using Microcontact Wave Printing," *J. Am. Chem. Soc.* 127(31)10786-10787.

Cao et al. (2006) "Highly Bendable, Transparent Thin-Film Transistors That Use Carbon-Nanotube-Based Conductors and Semiconductors with Elastomeric Dielectrics," *Adv. Mater.* 18(3):304-309.

Chen et al. (Mar. 24, 2006) "An Integrated Logic Circuit Assembled on a Single Carbon Nanotube," *Science* 311:1735.

Chen et al. (Feb. 27, 2006) "Complementary Carbon Nanotube-Gated Carbon Nanotube Thin-Film Transistor," *Appl. Phys. Lett.* 88:093502.

Chen et al. (2005) "The Role of Metal-Nanotube Contact in the Performance of Carbon Nanotube Field-Effect Transistors," *Nano Lett.* 5(7):1497-1502.

Chen et al. (Sep. 2004) "Herringbone Buckling Patterns of Compressed Thin Films on Compliant Substrates," *J. Appl. Mech.* 71:597-603.

Collins et al. (Apr. 27, 2001) "Engineering Carbon Nanotubes and Nanotube Circuits Using Electrical Breakdown," *Science* 292:706-709.

Creagh et al. (2003) "Design and Performance of Inkjet Print Heads for Non-Graphic-Arts Applications," *MRS Bull.* 28:807-811.

de Gans (2004) "Inkjet Printing of Polymers: State of the Art and Future Developments," *Adv. Mater.* 16(3):203-213.
Derycke et al. (Sep. 2001) "Carbon Nanotube Inter- and Intramolecular Logic Gates," *Nano Lett.* 1(9):453-456.
Durkop et al. (2004) "Extraordinary Mobility in Semiconducting Carbon Nanotube," *Nano Lett.* 4(1):35-39.
Faez et al. (1999) "An Elastomeric Conductor Based on Polyaniline Prepared by Mechanical Mixing," *Polymer* 40:5497-5503.
Geissler et al. (Jun. 2003) "Selective Wet-Etching of Microcontact-Printed Cu Substrates with Control Over the Etch Profile," *Microelec. Eng.* 67-68:326-332.
Geissler et al. (2003) "Fabrication of Metal Nanowires Using Microcontact Printing," *Langmuir* 19(15):6301-6311.
Gray et al. (Dec. 2001) "Screen Printed Organic Thin Film Transistors (OTFTs) on a Flexible Substrate," *Proc. SPIE* 4466:89-94.
Gray et al. (Mar. 5, 2004) "High-Conductivity Elastomeric Electronics," *Adv. Mater.* 16(5):393-397.
Guo et al. (Aug. 19, 2002) "Metal-Insulator-Semiconductor Electrostatics of Carbon Nanotubes," *Appl. Phys. Lett.* 81(8):1486-1488.
Han et al. (2005) "Template-Free Directional Growth of Single-Walled Carbon Nanotubes on a- and r-Plane Sapphire," *J. Am. Chem. Soc.* 127:5294-5295.
Hines et al. (2005) "Nanotransfer Printing of Organic and Carbon Nanotube Thin-Film Transistors on Plastic Substrates," *Appl. Phys. Lett.* 86:163101.
Hsu et al. (Mar. 2004) "Effects of Mechanical Strain on TFTs on Spherical Domes," *IEEE Trans. Electron Dev.* 51(3):371-377.
Huang et al. (2004) "Self-Organizing High-Density Single-Walled Carbon Nanotube Arrays from Surfactant Suspensions," *Nanotechnol.* 15:1450-1454.
Huck et al. (2000) "Ordering of Spontaneously Formed Buckles on Planar Surfaces," *Langmuir* 16:3497-3501.
Hur et al. (205) "Organic Nanodielectrics for Low Voltage Carbon Nanotube Thin Film Transistors and Complementary Logic Gates," *J. Am. Chem. Soc.* 127:13808-13809.
Hur et al. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.
Islam et al. (Jan. 16, 2003) "High Weight Fraction Surfactant Solubilization of Single-Wall Carbon Nanotubes in Water," *Nano Lett.* 3(2):269-273.
Ismach et al. (2004) "Atomic-Step-Templated Formation of Single Wall Carbon Nanotube Patterns," *Angew. Chem. Int. Ed.* 43:6140-6143.
Jabbour et al. (2001) "Screen Printing for the Fabrication of Organic Light-Emitting Devices," *IEEE J. Select. Top. Quantum. Electron.* 7(5):769-773.
Javey et al. (Aug. 7, 2003) "Ballistic Carbon Nanotube Field-Effect Transistors," *Nature* 424:654-657.
Javey et al. (2002) "High-k Dielectrics for Advanced Carbon-Nanotube Transistors and Logic Gates," *Nature Mater.* 1:241-246.
Jin et al. (2004) "Soft Lithographic Fabrication of an Image Sensor Array on a Curved Substrate," *J. Vac. Sci. Technol. B* 22(5):2548-2551.
Kang et al. (Apr. 2007) "High-Performance Electronics Using Dense, Perfectly Aligned Arrays of Single-Walled Carbon Nanotubes," *Nat. Nanotechnol.* 2:230-236.
Kim et al. (2000) "Field Emission from Carbon Nanotubes for Displays," *Diamond and Related Mater.* 9(3-6):1184-1189.
Kocabas et al. (2006) "Spatially Selective Guided Growth of High-Coverage Arrays and Random Networks of Single-Walled Carbon Nanotubes and Their Integration into Electronic Devices," *J. Am. Chem. Soc.* 128:4540-4541.
Kocabas et al. (2005) "Guided Growth of Large-Scale, Horizontally Aligned Arrays of Single-Walled Carbon Nanotubes and Their Use in Thin-Film Transistors," *Small* 1(11):1110-1116.
Kong et al. (Jan. 28, 2000) "Nanotube Molecular Wires as Chemical Sensors," *Science* 287:622-625.
Knipp et al. (2003) "Pentacene Thin Film Transistors on Inorganic Dielectrics: Morphology, Structural Properties, and Electronic Transport," *J. Appl. Phys.* 93:347-355.

Kumar et al. (1994) "Patterning Self-Assembled Monolayers: Applications in Materials Science," *Langmuir* 10:1498-1511.
Lacour et al. (2005) "Stretchable Interconnects for Elastic Electronic Surfaces," *Proc. IEEE* 93:1459-1467.
Lacour et al. (Apr. 14, 2003) "Stretchable Gold Conductors on Elastomeric Substrates," *Appl. Phys. Lett.* 82(15):2404-2406.
Lee et al. (Feb. 2001) "Application of Carbon Nanotubes to Field Emission Displays," *Diamond and Related Mater.* 10(2):265-270.
Li et al. (2004) "Electrospinning of Nanofibers: Reinventing the Wheel," *Adv. Mater.* 16(14)1151-1170.
Lim et al. (2005) "Flexible Membrane Pressure Sensor," *Sens. Act. A* 119:332-335.
Lin et al. (Sep. 2005) "High-Performance Carbon Nanotube Field-Effect Transistor With Tunable Polarities," *IEEE Trans. Nano* 4(5):481-489.
Ling et al. (2004) "Thin Film Deposition, Patterning, and Printing in Organic Thin Film Transistors," *Chem. Mater.* 16:4824-4840.
Marquette et al. (2004) "Conducting Elastomer Surface Texturing: A Path to Electrode Spotting Application to the Biochip Production," *Biosens. Bioelectron.* 20:197-203.
Min, G. (Apr. 4, 2003) "Plastic Electronics and Their Packaging Technologies," *Syn. Metals.* 135:141-143.
Misewich et al. (May 2, 2003) "Electronically Induced Optical Emission from a Carbon Nanotube FET," *Science* 300:783-786.
Moon et al. (2002) "Ink-Jet Printing of Binders for Ceramic Components," *J. Am. Ceram. Soc.* 85(4):755-762.
Moore et al. (Sep. 9, 2003) "Individually Suspended Single-Walled Carbon Nanotubes in Various Surfactants," *Nano Lett.* 3(10):1379-1382.
O'Connell et al. (Jul. 26, 2002) "Bang Gap Fluorescence from Individual Single-Walled Carbon Nanotubes," *Science* 297:593-596.
Origin Energy (May 2004) "Fact Sheet—Sliver Cells," www.orginenergy.com.au/sliver.
Pardo et al. (2000) "Application of Screen Printing in the Fabrication of Organic Light-Emitting Devices," *Adv. Mater.* 12(17):1249-1252.
Reuss et al. (Jul. 2005) "Macroelectronics: Perspectives on Technology and Applications," *Proc. IEEE* 93(7):1239-1256.
Rogers et al. (1999) Printing Process Suitable for Reel-to-Reel Production of High-Performance Organic Transistors and Circuits, *Adv. Mater.* 11(9):741-745.
Rogers at al. (Mar. 2000) "Organic Smart Pixels and Complementary Inverter Circuits Formed on Plastic Substrates by Casting and Rubber Stamping," IEEE Electron Dev. Lett. 21(3):100-103.
Rosenblatt et al. (2002) "High Performance Electrolyte Gated Carbon Nanotube Transistors," *Nano Lett.* 2(8):869-872.
Sazonov et al. (2005) "Low-Temperature Materials and Thin-Film Transistors for Flexible Electronics," *Proc. IEEE* 93:1420-1428.
Sekitani at al. (2005) „Bending Experiment on Pentacene Field-Effect Transistors on Plastic Films, *Appl. Phys. Lett.* 86:073511.
Shtein et al. (Oct. 15, 2004) "Direct Mask-Free Patterning of Molecular Organic Semiconductors Using Organic Vapor Jet Printing," *J. Appl. Phys.* 96(8):4500-4507.
Someya et al. (Jul. 6, 2004) "A Large-Area, Flexible Pressure Sensor Matrix with Organic Field-Effect Transistors for Artificial Skin Applications," *Proc. Nat. Acad. Sci. USA* 101(27):9966-9970.
Stafford et al. (Aug. 2004) "A Buckling-Based Metrology for Measuring the Elastic Moduli of Polymeric Thin Films," *Nature Mater.* 3:545-550.
Suo et al. (Feb. 22, 1999) "Mechanics of Rollable and Foldable Film-on-Foil Electronics," *Appl. Phys. Lett.* 74(8):1177-1179.
Tate et al. (2000) "Anodization and Microcontact Printing on Electroless Silver: Solution-Based Fabrication Procedures for Low-Voltage Electronic Systems with Organic Active Components," *Langmuir* 16:6054-6060.
Weber et al. (Jan. 2004) "A Novel Low-Cost, High Efficiency Micromachined Silicon Solar Cell," *IEEE Electron Device Lett.* 25(1):37-39.
Wind et al. (May 20, 2002) "Vertical Scaling of Carbon Nanotube-Field-Effect Transistors Using Top Gate Electrodes," *Appl. Phys. Lett.* 80(20):3871-3819.
Yao et al. (Mar. 2000) "High-Field Effect Electrical Transport in Single-Walled Carbon Nanotubes," *Phys. Rev. Lett.* 84(13):2941-2944.

Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.

Zhou et al. (2005) "Band Structure, Phonon Scattering, and the Performance Limit of Single-Walled Carbon Nanotube Transistors," *Phys. Rev. Lett.* 95:146805.

Office Action, Corresponding to U.S. Appl. No. 11/145,542, Mailed Apr. 5, 2007.

Search Report for Patent Application, Corresponding to Republic of China (Taiwan) Patent Application No. 094118507 dated Feb. 24, 2007.

Search Report for Corresponding International PCT Application No. PCT/US05/19354 dated Apr. 18, 2007.

Duan et al. (2000) "General Synthesis of Compound Semiconductor Nanowires," Adv. Mater. 12:298-302.

Duboz et al. (1998) "Transistors and Detectors Based on GaN-Related Materials," In; Group III Nitride Semiconductor Compounds, Gill, B. ed., Clarendon, Oxford, pp. 343-387.

Duffy et al. (1998) "Rapid Prototyping of Microfluidic Systems in Poly(dimethylsiloxane)," Anal. Chem. 70 (23):4974-4984.

Edrington et al. (2001)"Polymer-Based Photonic Crystals," Adv. Mater. 13:421-425.

Eftekhari, G. (1993) "Variation in the Effective Richardson Constant of Metal—GaAs and Metal—InP Contacta Due to the Effect of Processing Parameters," Phys. Status Solid A-Appl. Res. 140:189-194.

Felgner et al. (1996) "Flexural Rigidity of Microtubules Measured with the Use of Optical Tweezers," J. Cell Sci. 109:509-516.

Fink et al. (1999) "Block Copolymers as Photonic Bandgap Materials," J. Lightwave Tech. 17:1963-1969.

Flewitt et al. (2005) "Low-Temperature Deposition of Hydrogenated Amorphous Silicon in an Electron Cyclotron Resonance Reactor for Flexible Displays," Proc. IEEE 93:1364-1373.

Folch et al. (1999) "Wafer-Level In-Registry Microstamping," J. Microelectromech. Syst. 8:85-89.

Forment et al. (2004) "Influence of Hydrogen Treatment and Annealing Processes Upon the Schottky Barrier Height of Au/n-GaAs and Ti/n-GaAs Diodes," Semicond. Sci. Technol. 19:1391-1396.

Forrest et al. (2004) "The Path to Ubiquitous and Low-Cost Organic Electronic Appliances on Plastic," Nature 428:911-918.

Fortunato et al. (2005) "Flexible a-Si: H Position-Sensitive Detectors," Proc. IEEE 93:1281-1286.

Freund, L.B. (2000) "The Mechanics of Electronic Materials," Int. J. Solids Struct. 37:185-196.

Friedman et al. (2005) "Nanotechnology: High-Speed Integrated Nanowire Circuits," Nature 434:1085.

Furneaux et al. (1989) "The Formation of Controlled-Porosity Membranes from Anodically Oxidized Aluminum," Nature 337:147-149.

Gan et al. (2002) "Preparation of Thin-Film Transistors with Chemical Bath Deposited CdSe and CdS Thin Films," IEEE Trans. Electron. Dev. 49:15-18.

Garnier et al. (1994) "All-Polymer Field-Effect Transistor Realized by Printing Techniques," Science 265:1684-1686.

Gelinck et al. (2000) "High-Performance All-Polymer Integrated Circuits," Appl. Phys. Lett. 77:1487-1489.

Gelinck et al. (2004) "Fleible Active-Matrix Displays and Shift Registers Based on Solution-Processed Organic Transistors," Nat. Mater. 3:106-110.

Georgakilas et al. (2002) "Wafer-Scale Integration of GaAs Optoelectronic Devices with Standard Si Integrated Circuits Using a Low-Temperature Bonding Procedure," Appl. Phys. Lett. 81:5099-5101.

Givargizov, E.I. (1991) "Applications," In; Oriented Crystallization on Amorphous Substrates, Plenum Press, New York, pp. 341-363.

Goetting et al. (1999) "Microcontact Printing of Alkanephosphonic Acids on Aluminum: Pattern Transfer by Wet Chemical Etching," Langmuir 15:1182-1191.

Goldmann et al. (2004) "Hole Mobility in Organic Single Crystals Measured by a "Flip-Crystal" Field-Effect Technique," J. Appl. Phys. 96:2080-2086.

Goldman et al. (1996) "Correlation of Buffer Strain Relaxation Modes with Transport Properties of Two-Dimensional Electron Gases," J. Apple. Phys. 80:6849-6854.

Gur et al. (2005) "Air-Stable All-Inorganic Nanocrystal Solar Cells Processed from Solution," Science 310:462-465.

Haisma et al. (2002) "Contact Bonding, Including Direct-Binding in a Historical and Recent Context of Materials Science and Technology, Physics and Chemistry—Historical Review in a Broader Scope and Comparative Outlook," Mater. Sci. Eng. R 37:1-60.

Halik et al. (2004) "Low-Voltage Organic Transistors with an Amorphous Molecular Gate Dielectric," Nature 431:963-966.

Hamilton et al. (2004) "Field-Effect Mobility of Organic Polymer Thin-Film Transistors," Chem. Mater. 16:4699-4704.

Harada et al. (2001) "Catalytic Amplification of the Soft Lithographic Patterning of Si. Nonelectrochemical Orthogonal Fabrication of Photoluminescent Porous Si Pixel Arrays," J. Am. Chem. Soc. 123:8709-8717.

Horn et al. (1992) "Contact Electrification and Adhesion Between Dissimilar Materials," Science 256:362-364.

Hoyer, P. (1996) "Semiconductor Nanotube Formation by a Two-Step Template Process," Adv. Mater. 8:857-859.

Hsia et al. (2005) "Collapse of Stamps for Soft Lithography Due to Interfacial Adhesion," Appl. Phys. Lett. 86:154106.

Hsu et al. (2002) "Amorphous Si TFTs on Plastically Deformed Spherical Domes," J. Non-Crystalline Solids 299-302:1355-1359.

Hsu et al. (2003) "Nature of Electrical Contacts in a Metal-Molecule-Semiconductor System," J. Vac. Sci. Technol. B 21(4):1928-1935.

Hu et al. (1999) Chemistry and Physics in One Dimension: Synthesis and Properties of Nanowires and Nanotubes, Acc. Chem. Res. 32:435-445.

Hu et al. (1997) "Using Soft Lithography to Fabricate GaAs/AlGaAs Heterostructure Field Effect Transistors," Appl. Phys. Lett. 71:2020-2022.

Huang et al. (2001) "Room-Temperature Ultraviolet Nanowire Nanolasers," Science 292:1897-1899.

Huang et al. (2001) "Directed Assembly of One-Dimensional Nanostructures into Functional Networks," Science 291:630-633.

Huang et al. (2005) "Nonlinear Analyses of Wrinkles in a Film Bonded to a Compliant Substrate," J. Mech. Phys. Solids 53:2101-2118.

Huang et al. (2005) "Stamp Collapse in Soft Lithography," Langmuir 21:8058-8068.

Huie, J.C. (2003) "Guided Molecular Self Assembly: A review of Recent Efforts," Smart Mater. Struct. 12:264-271.

Huitema et al. (2001) "Plastic Transistors in Active-Matrix Displays," Nature 414:599.

Hutchinson et al. (1992) "Mixed Mode Cracking in Layered Materials," Adv. Appl. Mech. 29:63-191.

Iparato et al. (2005) "Excimer Laser Induced Crystallization of Amorphous Silicon on Flexible Polymer Substrates," Thin Solid Films 487:58-62.

Itoh et al. (1991) "Cathodoluminescence Properties of Undoped and Zn-Doped AlxGa1-xN Grown by Metaloganic Vapor Phase Epitaxy," Jap. J. Appl. Phys. 30:1604-1608.

Jacobs et al. (2002) "Fabrication of a Cylindrical Display by Patterned Assembly," Science 296:323-325.

Jain et al. (2000) "III-Nitrides: Growth, Characterization, and Properties," J. Appl. Phys. 87:965-1006.

Jain et al. (2005) "Flexible Electronics and Displays: High-Resolution, Roll-to-Roll, Projection Lithography and Photoblation processing Technologies for Hiogh-Throughput Production," Proc. IEEE 93:1500-1510.

James et al. (1998) "Patterned Protein Layers on Solid Substrates by This Stamp Microcontact Printing," Langmuir 14:742-744.

Jang et al. (2006) "Low-Voltage and High-Field-Effect Mobility Organic Transistors with a Polymer Insulator," Appl. Phys. Lett. 88:072101.

Jenkins et al. (1994) "Gallium Arsenide Transistors: Realization Through a Molecularly Designed Insulator," Science 263:1751-1753.

Jeon et al. (2004) "Fabricating Complex Three-Dimensional Nanostructures with High Resolution Conformable Phase Masks," Proc. Natl. Acad. Sci. USA 101:12428-12433.

Jeon et al. (2004) "Three Dimensional Nanofabrication with Rubber Stamps and Conformable Photomasks," Adv. Mater. 16:593-600.

Jeon et al. (1995) "Patterning of Dielectric Oxide Thin Layers by Microcontact Printing of Self-Assembled Monolayers," J. Mater. Res. 10:2996-2999.

Jiang et al. (1999) "Preparation of Macroporous Metal Films from Colloidal Crystals," J. Am. Chem. Soc. 121:7957-7958.

Jiang et al. (2002) "Polymer-on-Polymer Stamping: Universal Approaches to Chemically Patterned Surfaces," Langmuir 18:2607-2615.

Jin et al. (2004) "Scalable Interconnection and Integration of Nanowire Devices Without Registration," Nano Lett. 4:915-919.

Jiyun, C.H. (2003) "Guided Molecular Self-Assembly: A Review of Recent Efforts," Smart Mater. Struct. 12:264-271.

Johnson et al. (1999) "Ordered Mesoporous Polymers of Tunable Pore Size from Colloidal Silica Templates," Science 283:963-965.

Kagan et al. (2001) "Patterning Organic-Inorganic Thin-Film Transistors Using Microcontact Printed Templates," Appl. Phys Lett. 79(21):3536-3538.

Kagan (1999) "Organic-Inorganic Hybrid Materials as Semiconducting Channels in Thin-Film Field-Effect Transistors," Science 286:945-947.

Kagan et al. (2003) Thin Film Transistors, Dekker, New York, pp. 1-34.

Kane et al. (2000) "Analog and Digital Circuits Using Organic Thin-Film Transistors on Polyester Substrates," IEEE Electron. Dev. Lett. 21:534-536.

Karnik et al. (2003) "Multiple Lateral Polysilicon Diodes as Temperature Sensors for Chemical Microreaction Systems," Jpn. J. Appl. Phys. 42:1200-1205.

Karnik et al. (2003) "Lateral Polysilicon p+-p-n+ and p+-n-n+ Diodes," Solid-State Electronics 47:653-659.

Katz et al. (2001) "Synthetic Chemistry for Ultrapure, Processable, and High-Mobility Organic Transistor Semiconductors," Acc. Chem. Res. 34:359-369.

Katz, H.E. (2004) "Recent Advances in Semiconductor Performance and Printing Processes for Organic Transistor-Based Electronics," Chem. Mater. 16:4748-4756.

Kawata et al. (2001) "Finer Features for Functional Microdevices," Nature 412:697-698.

Kendall, D.L. (1979) "Vertical Etching of Silicon at Very High Apect Ratios," Ann. Rev. Mater. Sci. 9:373-403.

Khan et al. (1993) "High Electron Mobility Transistor Based on a GaN-AlxGa1-xN Heterojunction," Appl. Phys. Lett. 63:1214-1215.

Khang et al. (2006) "A Stretchable Form of Single-Crystal Silicon for High-Performance Electronics on Rubber Substraights," Science 311:208-212.

Kilby, J.S. (1976) "Invention of the Integrated Circuit," IEEE Trans. Electron. Dev. 23:648-654.

Kim et al. (2003) "Epitaxial self-assembly of block copolymers on lithographically defined nanopatterned substrates," Nature 424:411-414.

Kim et al. (2002) "Nanolithography Based on Patterned Metal Transfer and its Application to Organic Electronic Devices," Appl. Phys. Lett. 80:4051-4053.

Klauk et al. (2002) "High-Mobility Polymer Gate Dielectric Pentacene Thin Film Transistors," J. Appl. Phys. 92:5259-5263.

Klein-Wiele et al. (2003) "Fabrication of Periodic Nanostructures by Phase-Controlled Multiple-Beam Interference," Appl. Phys. Lett. 83(23):4707-4709.

Koide et al. (2000) "Patterned Luminescence of Organic Light-Emitting Diodes by Hot Microcontact Printing (H CP) of Self-Assembled Monolayers," J. Am. Chem. Soc. 122:11266-11267.

Kong et al. (2004) "Single-Crystal Nanorings Formed by Epitaxial Self-Coiling of Polar Nanobelts," Science 303:1348-1351.

Knipp et al. (2003) "Pentacene Thin Film Transistors on Inorganic Dielectrics: Mprphology, Structural Properties, and Electronic Transport," J. Appl. Phys. 93:347-355.

Kumar et al. (2002) "Thermally-Stable Low-Resistance Ti/Al/Mo/Au Multilayer Ohmic Contacts on n-GaN," J. Appl. Phys. 92:1712-1714.

Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," Appl. Phys. Lett. 63(14):2002-2004.

Kuo et al. (1985) "Effect of Mismatch Strain on Band Gap in III-V Semiconductors," J. Appl. Phys. 57:5428-5432.

Lambacher et al. (2004) "Electrical Imaging of Neuronal Activity by Multi-Transistor-Array (MTA) Recording at 7.8 μm Resolution," Appl. Phys. A 79:1607-1611.

Law et al. (2004) "Semiconductor Nanowires and Nanotubes," Ann. Rev. Mater. Res. 34:83-122.

Leclercq et al. (1998) "III-V Micromachined Devices for Microsystems," Microelectronics J. 29:613-619.

Lee et al. (2003) "High-Performance Poly-Si TFTs on Plastic Substrates Using a Nano-Structured Separation Layer Approach," IEEE Elec. Dev. Lett. 24:19-21.

Lee et al. (2000) "Thin Film Transistors for Displays on Plastic Substrates," Solid State Electron. 44:1431-1434.

Lee et al. (2005) "Large-Area, Selective Transfer of Microstructured Silicon (μs-Si): A Printing-Based Approach to High-Performance Thin0Film Transistors Supported on Flexible Substraights," Adv. Mater. 17:2332-2336.

Lee et al. (2005) "A Printable Form of Single-Crystalline Gallium Nitride for Flexable Optoelectronic Systems," Small 1:1164-1168.

Lee et al. (2004)"Organic Light-Emitting Diodes Formed by Soft Contact Lamination," Proc. Natl. Acad. Sci. USA 101 (2):429-433.

Li et al. (2002) "High-Resolution Contact Printing with Dendrimers," Nano Lett. 2(4):347-349.

Li et al. (2003) "Ultrathin Single-Crystalline-Silicon Cantilever Resonators: Fabrication Technology and Significant Specimen Size Effect on Young's Modulus," Appl. Phys. Lett. 83:3081-3083.

Lieber, C. (2001) "The Incredible Shrinking Circuit," Sci. Am. 285(3):58-64.

Lieber, C.M. (2003) "Nanoscale Science and Technology: Building a Bog Future from Small Things," MRS. Bull. 28:486.

Long et al. (1990) "Heterostructure FETs and Bipolar Transistors," In; Gallium Arsenide Digital Integrated Circuit Design, McGraw-Hill, New York, pp. 58-69.

Loo et al. (2003) "Electrical Contacts to Molecular Layers by Nanotransfer Printing," Nano Lett. 3(7):913-917.

Loo et al. (2002) "Additive, Nanoscale Patterning of Metal Films with a Stamp and a Surface Chemistry Mediated Transfer Process: Applications in Plastic Electronics," Appl. Physics Lett. 81:562-564.

Loo et al. (2002) "Interfacial Chemistries for Nanoscale Transfer Printing," J. Am. Chem. Soc. 124:7654-7655.

Loo et al. (2002) "High-Resolution Transfer Printing on GaAs Surfaces Using Alkane Dithiol Monolayers," J. Vac. Sci. Technol. B 20(6):2853-2856.

Loo et al. (2002) "Soft, Conformable Electrical Contacts for Organic Semiconductors: High-Resolution Plastic Circuits by Lamination," Proc. Natl. Acad. Sci. USA 99(16):10252-10256.

Adachi et al. (1983) "Chemical Etching Characteristics of (001)GaAs," J. Electrochem. Soc. 130:2427-2435.

Adachi et al (1982) "Chemical Etching of InGaAsP/InP DH Wafer," J. Electrochem. Soc. 129:1053-1062.

Alivisatos et al. (1996) "Semiconductor Clusters, Nanocrystals, and Quantum Dots," Science 271:933-937.

Alivisatos et al. (1998) "From Molecules to Materials: Current Trends and Future Directions," Adv. Mater. 10:1297-1336.

Ambrosy et al. (1996) "Silicon Motherboards for Multichannel Optical Modules," IEEE Trans. Compon. Pack. A 19:34-40.

Ando et al. (2004) "Self-Aligned Self-Assembly Process for Fabricating Organic Thin-Film Transistors," Appl. Phys. Lett. 85:1849-1851.

Aoki et al. (2003) "Microassembly of Semiconductor Three Dimensional Photonic Crystals," Nat. Mater. 2:117-121.

Bao et al. (1999) "Printable Organic and Polymeric Semiconducting Materials and Devices," J. Mater. Chem. 9:1895-1904.

Barquins, M. (1992) "Adherence, Friction and Wear of Rubber-Like Materials," Wear 158:87-117.

Bates, F.S. (1991) "Polymer-Polymer Phase Behavior," Science 251:898-905.

Battaglia et al. (2003) "Colloidal Two-Dimensional Systems: CdSe Quantum Shells and Wells," Angew. Chem. Int. Ed. 442:5035-5039.

Bauer et al. (2004) "Biological Applications of High Aspect Ratio Nanoparticles," J. Mater. Chem. 14:517-526.

Berg et al. (2003) "Tailored Micropatterns Through Weak Polyelectrolyte Stamping," Langmuir 19:2231-2237.

Bernard et al. (1998) "Printing Patterns of Proteins," Langmuir 14(9):2225-2229.

Bhunia et al. (2004) "Free-Standing and Vertically Aligned InP Nanowires Grown by Metalorganic Vapor Phase Epitaxy," Physica E 21:583-587.

Blanchet et al. (2003) "Large Area, High Resolution, Dry Printing of Conducting Polymers for Organic Electronics," Appl. Phys. Lett. 82:463-465.

Blanchet et al. (2003) "Printing Techniques for Plastic Electronics," J. Imag. Sci. Tech. 47(4):296-303.

Boltau et al. (1998) "Surface-Induced Structure Formation of Polymer Blends on Patterned Substrates," Nature 391:877-879.

Bowden et al. (2001) "Molecule-Mimetic Chemistry and Mesoscale Self-Assembly," Acc. Chem. Res. 34:231-238.

Bowden et al. (1998) "Spontaneous Formation of Ordered Structures in Thin Films of Metals Supported on an Elastomeric Polymer," Nature 393:146-149.

Bowden et al. (1997) "Self Assembly of Mesoscale Objects into Ordered Two-Dimensional Arrays," Science 276:233-235.

Braun et al. (1999) "Electrochemically Grown Photonic Crystals," Nature 402:603-604.

Bruschi et al. (2001) "Micromachined Silicon Suspended Wires With Submicrometric Dimensions," Microelectron. Eng. 57-58:959-965.

Buma et al. (2001) "High-Frequency Ultrasound Array Element Using Thermoelastic Expansion in an Elastomeric Film," Appl. Phys. Lett. 79:548-550.

Burgin et al. (2000) "Large Area Submicrometer Contact Printing Using a Contact Aligner," Langmuir 16:5371-5375.

Burns et al. (2003) "Printing of Polymer Thin-Film Transistors for Active-Matrix-Display Applications," J. Soc. Inf. Display 11:599-604.

Brown, H.R. (1991) "The Adhesion Between Polymers," Ann. Rev. Mater. Sci. 21:463-489.

Campbell et al. (2000) "Fabrication of Photonic Crystals for the Visible Spectrum by Holographic Lithography," Nature 404:53-56.

Carr et al. (1998) "Measurement of Nanomechanical Resonant Structures in Single-Crystal Silicon," J. Vac. Sci. Technol. B 16:3821-3824.

Chadhury et al. (1991) "Direct Measurement of Interfacial Interactions Between Semispherical Lenses and Flat Sheets of Poly(dimethylsiloxane) and their Chemical Derivatives," Langmuir 7:1013-1025.

Chang et al. (1994) "Process Techniques, Lithography and Device-Related Physics and Principles," In; GaAs High-Speed Devices: Physics, Technology and Circuit Application, John Wiley and Sons, New York, pp. 115-278.

Chen et al. (2003) "Electronic Paper: Flexible Active-Matrix Electronics Ink Display," Nature 423:136.

Chen et al. (2003) "Characterization of Pd-GaAs Schottly Diodes Prepared by the Electrodes Plating Technique," Semiconductor. Sci. Technol. 18:620-626.

Cheng et al. (2005) "Ink-Jet Printing, Self-Assembled Polyelectrolytes, and Electroless Plating: Low Cost Fabrication of Circuits on a Flexible Substrate at Room Temperature," Macromol. Rapid Commun. 26:247-264.

Childs et al. (2002) "Decal Transfer Microlithography: A New Soft-Lithographic Patterning Method," J. Am. Chem. Soc. 124:13583-13596.

Chou et al. (2004) "An Orientation-Controlled Pentacene Film Aligned by Photoaligned Polyimide for Organic Thin-Film Transistor Applications," Adv. Func. Mater. 14:811-815.

Chu et al. (2005) "High-Performance Organic Thin-Film Transistors with Metal Oxide/Metal Bilayer Electrode," Appl. Phys. Lett. 87:193508.

Chung et al. (2000) "Silicon Nanowire Devices," Appl. Phys. Lett. 76(15):2068-2070.

Crowder et al. (1998) "Low-Temperature Single-Crystal Si TFTs Fabricated on Si Films Processed via Sequential Lateral Solidification," IEEE Electron. Dev. Lett. 19:306-308.

Cui et al. (2001) "Nanowire Nanosensors for Highly Sensitive and Selective Detection of Biological and Chemical Species," Science 293:1289-1292.

Dai et al. (2003) "Novel Nanostructures of Functional Oxides Synthesized by Thermal Evaporation," Adv. Funct. Mater. 13:9-24.

Davidson et al. (2004) "Supercritical Fluid-Liquid-Solid Synthesis of Gallium Arsenide Nanowires Seeded by Alkanethiol-Stabilized Gold Nanocrystals," Adv. Mater. 16:646-649.

DeBoer et al. (2004) "Organic Single-Crystal Field-Effect Transistors," Phys. Stat. Sol. 201:1302-1331.

Deen et al. (2004) "Electrical Characterization of Polymer-Based FETs Fabricated by Spin-Coating Poly(3-alkylthiophene)s," IEEE Trans. Electron Devices 51:1892-1901.

Delmerche et al. (1997) "Stability of Molded Polydimethylsiloxane Microstructures," Adv. Mat. 9:741-746.

Deruelle et al. (1995) "Adhesion at the Solid-Elastomer Interface: Influence of Interfacial Chains," Macromol. 28:7419-7428.

Dinsmore et al. (2002) "Colloidosomes: Selectively Permeable Capsules Composed of Colloidal Particles," Science 298:1006-1009.

Divliansky et al. (2003) "Fabrication of Three-Dimensional Polymer Photonic Crystal Structures Using Single Diffraction Element Interference Lithography," Appl. Phys. Lett. 82(11):1667-1669.

Dodabalapur et al. (1995) "Organic Transistors: Two-Dimensional Transport and Improved Electrical Characteristics," Science 268:270-271.

Duan et al. (2003) "High-performance Thin-Film Transistors Using Semiconductor Nanowires and Nanoribbons," Nature 425:274-278.

Ridley et al. (1999) "All-Inorganic Field Effect Transistors Fabricated by Printing," Science 286:746-749.

Roberts et al. (1979) "Looking at Rubber Adhesion," Rubber Chem. Technol. 52:23-42.

Robinson et al. (1983) "GaAs Readied for High-Speed Microcircuits," Science 219:275-277.

Rogers et al. (1997) "Using an Elastomeric Phase Mask for Sub-100 nm Photolithography in the Optical Near Field," Appl. Phys. Lett. 70:2658-2660.

Rogers et al. (2002) "Printed Plastic Electronics and Paperlike Displays," J. Polym. Sci. Part A. Polym. Chem. 40:3327-3334.

Rogers et al. (1998) "Quantifying Distortions in Soft Lithography," J. Vac. Sci. Technol. 16:88-97.

Rogers et al. (1998) "Generating ~90 Nanometer Features Using Near Field Contact Mode Photolithography with an Elastomeric Phase Mask," J. Vac. Sci. Technol. 16(1):59-68.

Rogers et al. (1998) "Using Printing and Molding Techniques to Produce Distributed Feedback and Bragg Reflector Resonators for Plastic Lasers," Appl. Phys. Lett. 73:1766-1768.

Rogers et al. (2001) "Paper-Like Electronic Displays: Large-Area Rubber-Stamped Plastic Sheets of Electronics and Microencapsulated Electrophoretic Inks," Proc. Natl. Acad. Sci. USA 98:4835-4840.

Rogers, J.A. (2001) "Toward Paperlike Displays," Science 291:1502-1503.

Rogers, J.A. (2001) "Rubber Stamping for Plastic Electronics and Fiber Optics," MRS Bulletin 26(7):530-534.

Rotkin et al. (2003) "Universal Description of Channel Conductivity for Nanotube and Nanowire Transistors," Appl. Phys. Lett. 83:1623-1625.

Roundy et al. (2003) "Photonic Crystal Structure with Square Symetry within Each Layer and a Three-Dimensional Band Gap," Appl. Phys Lett. 82:3835-3837.

Samuelson et al. (2004) "Semiconductor Nanowires for Novel One-Dimensional Devices," Physica E 21:560-567.

Sazonov et al. (2005) "Low-Temperature Materials and Thin-Film Transistors for Flexible Electronics," Proc. IEEE 93:1420-1428.

Schmid et al. (2003) "Preparation of Metallic Films on Elastomeric Stamps and Their Application for Contact Processing and Contact Printing," Adv. Funct. Mater. 13:145-153.

Schnable et al. (1969) "Aluminum Metallization; Advantages and Limitations for Integrated Circuit Applications," IEEE 57:1570-1580.

Schon et al. (1995) "Ambipolar Pentacene Field-Effect Transistors and Inverters," Science 287:1022-1023.

Schrieber et al. (1998) "The Effectiveness of Silane Adhesion Promoters in the Performance of Polyurethane Adhesives," J. Adhesion 68:31-44.

Servanti et al. (2005) "Functional Pixel Circuits for Elastic AMOLED displays," Proc. IEEE 93:1257-1264.

Sharp et al. (2003) "Holographic Photonic Crystals with Diamond Symmetry," Phys. Rev. B 68:205102/1-205102/6.

Sheraw et al. (2002) "Organic Thin-Film Transistor-Driven Polymer-Dispersed Liquid Crystal Displays on Flexible Polymeric Substrates," Appl. Phys. Lett. 80:1088-1090.

Shetty et al. (2005) "Formation and Characterization of Silicon Films on Flexible Polymer Substrates," Mater. Lett. 59:872-875.

Shull et al. (1998) "Axisymmetric Adhesion Tests of Soft Materials," Macromol. Chem. Phys. 199:489-511.

Sim et al. (1993) "An Analytical Back-Gate Bias Effect Model for Ultrathin SOI CMOS Devices," IEEE Trans. Elec. Dev. 40:755-765.

Sirringhaus et al. (2003) "Inkjet Printing of Functional Materials," MRS Bull. 28:802-806.

Sirringhaus, H. (2005) "Device Physics of Solution-Processed Organic Field-Effect Transistors," Adv. Mater. 17:2411-2425.

Smay et al. (2002) "Colloidal Inks for Directed Assembly of 3-D Periodic Structures," Langmuir 18:5429-5437.

Smith et al. (2000) "Electric-Field Assisted Assembly and Alignment of Metallic Nanowires," Appl. Phys. Lett. 77 (9):1399-1401.

Someya et al. (2005) "Integration of Organic FETs with Organic Photodiodes for a Large Area, Flexible, and Lightweight Sheet Image Scanners," IEEE Trans. Electron Devices 52:2502-2511.

Someya et al. (2005) "Conformable, Flexible, Large-Area Networks of Pressure and Thermal Sensors with Organic Transistor Active Matrixes," Proc. Nat. Acad. Sci. USA 102:1232112325.

Sun et al. (2004) "Fabricating Semiconductor Nano/Microwires and Transfer Printing Ordered Arrays of them onto Plastic Substrates," Nano Lett. 4:1953-1959.

Sun et al. (2005) "Photolithographic Route to the Fabrication of Micro/Nanowires of III-V Semiconductors," Adv. Funct. Mater. 15:30-40.

Sun et at (2005) "Bendable GaAs Metal-Semiconductor Field-Effect Transistors Formed with a Printed GaAs Wire Arrays on Plastic Substrates," Appl. Phys. Lett. 87:083501.

Sun et at (2005) "Advances in Organic Field-Effect Transistors," J. Mater. Chem. 15:53-65.

Sundar et al. (2004) "Elastomeric Transistor Stamps: Reversible Probing of CHaarge Transport in Organic Crystals," Science 303:1644-1646.

Sze, S. (1994) "Semiconductor Sensor Technologies," In; Semiconductor Sensors, John Wiley and Sons: New York pp. 17-95.

Sze, S. (1985) "Lithography and Etching," In; Semiconductor Devices: Physics and Technology, New York: Wiley, pp. 428-467.

Sze, S. (1988) "Ion Implantation," In; VLSI Technology, Mcgraw-Hill, 327-374, 566-611.

Sze et al. (1985) Semiconductor Devices, Physics and Technology, 2nd ed., Wiley, New York, pp. 190-192.

Tanase et al. (2002) "Magnetic Trapping and Self-Assembly of Multicomponent Nanowires," J. Appl. Phys. 91:8549-8551.

Tang et al. (2005) "One-Dimensional Assemblies of Nanoparticles: Preparation, Properties, and Promise," Adv. Mater. 17:951-962.

Tao et al. (2003) "Langmuir-Blodgett Silver Nanowire Monolayers for Molecular Sensing Using Surface-Enhanced Raman Spectroscopy," Nano Lett. 3:1229-1233.

Theiss et al. (1998) "PolySilicon Thin Film Transistors Fabricated at 100° C. on a Flexible Plastic Substrate," IEDM 98:257-260.

Toader et al. (2004) "Photonic Band Gaps Based on Tetragonal Lattices of Slanted Pores," Phys. Rev. Lett. 90:233901/1-233901/4.

Toader et al. (2004) "Photonic Band Gap Architectures for Holographic Lithography," Phy. Rev. Lett. 043905/1-043905/4.

Tong (1999) "Stresses in Bonded Wafers," In; Semiconductor Wafer Bonding: Science and Technology, John Wiley; New York, pp. 187-221.

Trau et al. (1997) "Microscopic Patterning of Orientated Mesoscopic Silica Through Guided Growth," Nature 390:674-676.

Trentler et al. (1995) "Solution-Liquid-Solid Growth of Crytalline III-V Semiconductors: An Analogy to Vapor-Liquid-Solid Growth," Science 270:1791-1794.

Ucjikoga, S. (2002) "Low-Temperature Polycrystalline Silicon Thin-Film Transistor Technologies ofr System-on-Glass Displays," MRS Bull. 27:881.

Luan et al. (1992) "An Experimental Study of the Source/Drain Parasitic Resistance Effects in Amorphous Silicon Thin Film Transistors," J. Appl. Phys. 72:766-772.

Madou, M. (1997) "Erch-Stop Techniques," In; Fundamentals of Microfabrication, CRC Press, New York, pp. 193-199.

Maikap et al. (2004) "Mechanically Strained-Si NMOSFETs," IEEE Electron. Dev. Lett. 25:40-42.

Maldovan et al. (2004) "Diamond-Structured Photonic Crystals," Nature Materials 3:593-600.

Markovich et al. (1999) "Architectonic Quantum Dot Solids," Acc. Chem. Res. 32:415-423.

Martensson et al. (2004) "Nanowire Arrays Defined by Nanoimprint Lithography," Nano Lett. 4:699-702.

Martin, C.R. (1995) "Template Synthesis of Electronically Conductive Polymer Nanostructures," Acc. Chem. Res. 28:61-68.

Mas-Torrent et al. (2006) "Large Photoresponsivity in High-Mobility Single-Crystal Organic Field-Effect Phototransistors," ChemPhysChem 7:86-88.

Matsunaga et al. (2003) "An Improved GaAs Device Model for the Simulation of Analog Integrated Circuit," IEEE Trans. Elect. Dev. 50:1194-1199.

McAlpine et al. (2005) "High-Performance Nanowire Electronics and Photonics and Nanoscale Patterning on Flexible Plastic Substrates," Proc. IEEE 93:1357-1363.

McAlpine et al. (2003) "High-Performance Nanowire Electronics and Photonics on Glass and Plastic Substrates," Nano Lett. 3:1531-1535.

McCaldin et al. (1971) "Diffusivity and Solubility of Si in the Al Metallization of Integrated Circuits," Appl. Phys. Lett. 19:524-527.

Meisel et al. (2004) "Three-Dimensional Photonic Crystals by Holographic Lithography Using the Umbrella Configuration: Symmetries and Complete Photonic Band Gaps," Phys. Rev. B. 70:165101:1-10.

Meitl et al. (2004) "Solution Casting and Transfer Printing Single-Walled Carbon Nanotube Films," Nano Lett. 4:1643-1947.

Meitl et al. (2006) "Transfer Printing by Kinetic Control of Adhesion to an Elastomeric Stamp," Nat. Mater. 5:33-38.

Melosh at al. (2003) "Ultrahigh-Density Nanowire Lattices and Circuits," Science 300:112-115.

Menard et al. (2004) "A Printable Form of Silicon for High Performance Thin Film Transistors on Plastic Substrates," Appl. Phys. Lett. 84:5398-5400.

Menard et al. (2004) "High-Performance n- and p-Type Single-Crystal Organic Transistors with Free-Space Gate Dielectrics," Adv. Mat. 16:2097-2101.

Menard et al. (2005) Bendable Single Crystal Silicon Thin Film Transistors Formed by Printing on Plastic Substrates Appl. Phys. Lett. 86(093507):1-3.

Menard et al. (2004) "Improved Surface Chemistries, Thin Film Deposition Techniques, and Stamp Designs for Nanotransfer Printing," Langmuir 20:6871-6878.

Michel et al. (2001) Printing Meets Lithography: Soft Approaches to High-Resolution Patterning, IBM J. Res. Dev. 45:697-719.

Milliron et al. (2004) "Colloidal Nanocrystal Heterostructures with Linear and Branched Topology," Nature 430:190-195.

Mirkin et al. (Jul. 2001) "Emerging Methods for Micro- and Nanofabrication," MRS Bull. 26(7):506-507.

Mishra et al. (2002) "AlGaN/GaN HEMTs—an Overview of Device Operation and Applications," Proc. IEEE 90:1022-1031.

Mitzi et al. (2004) "High-Mobility Ulltrathin Semiconducting Films Prepared by Spin Coating," Nature 428:299-303.

Mori et al. (1978) "A New Etching Solution System, H3PO4—H2O2—H2O, for GaAs and Its Kinetics," J. Electrochem. Soc. 125:1510-1514.

Morkoc et al. (1995) "High-Luminosity Blue and Blue-Green Gallium Nitride Light-Emitting Diodes," Science 267:51-55.

Morkved et al. (1994) "Mesoscopic Self-Assembly of Gold Islands on Diblock-Copolymer Films," Appl. Phys. Lett. 64:422-424.

Morra et al. (1990) "On the Aging of Oxygen Plasma-Treated Polydimethylsiloxane Surfaces," J. Colloid Interface Sci. 137:11-24.

Namazu et al. (2000) "Evaluation of Size Effect on Mechanical Properties of Single Crystal Silicon by Nanoscale Bending Test Using AFM," J. MEMS 9:450-459.

Nathan et al. (2002) "Amorphous Silicon Technology for Large Area Digital X-Ray and Optical Imaging," Microelectronics Reliability 42:735-746.

Newman et al. (2004) "Introduction to Organic Thin Film Transistors and Design of n-Channel Organic Semiconductors," Chem. Mater. 16:4436-4451.

Nirmal et al. (1999) "Luminescence Photophysics in Semiconductor Nanocrystals," Acc. Chem. Res. 32:407-414.

Noda et al. (1996) "New Realization Method for Three-Dimensional Photonic Crystal in Optical Wavelength Region," Jpn. J. Appl. Phys. 35:L909-L912.

Nomura et al. (2004) "Room-Temperature Fabrication of Transparent Flexible Thin-Film Transistors Using Oxide Semiconductors," Nature 432:488-492.

Odom et al. (2002) "Improved Pattern Transfer in Soft Lithography Using Compasite Stamps," Langmuir 18:5314-5320.

Ong et al. (2004) "High-Performance Semiconducting Poolythiophenes for Organic Thin-Film Transistors," J. Am. Chem. Soc. 126:3378-3379.

Ong et al. (2005) "Design of High-Performance Regioreular Polythiophenes for Organic Thin-Film Transistors," Proc. IEEE 93:1412-1419.

O'Riordan et al. (2004) "Field Configured Assembly: Programmed Manipulation and Self-Assembly at the Mesoscale," Nano Lett. 4:761-765.

Ouyang et al. (2002) "High-Performance, Flexible Polymer Light-Emitting Diodes Fabricated by a Continuous Polymer Coating Process," Adv. Mat. 14:915-918.

Pan et al. (2001) "Nanobelts of Semiconducting Oxides," Science 291:1947-1949.

Panev et al. (2003) "Sharp Exciton Emission from Single InAs Quantum Dots in GaAs Nanowires," Appl. Phys. Lett. 83:2238-2240.

Park et al. (1998) "Fabrication of Three-Dimensional Macroporous Membranes with Assemblies of Microspheres as Templates," Chem. Mater. 10:1745-1747.

Park et al. (1997) "Block Copolymer Lithography: Periodic Arrays of ~1011 Holes in 1 Square Centimeter," Science 276:1401-1404.

Pearton et al. (1999) "GaN: Processing, Defects, and Devices," J. Appl. Phys. 86:1-78.

Podzorov et al. (2005) "Hall Effect in the Accumulation Layers on the Surface of Orgaic Semiconductors," Phys. Rev. lett. 95:226601.

Quake et al (2000) "From Micro- to Nanofabrication with Soft Materials," Science 290:1536-1540.

Raman et al. (1989) "Study of Mesa Undercuts Produced in GaAs with H3PO4-Based Etchants," J. Electrochem. Soc. 136:2405-2410.

Razeghi et al. (1994) "High-Power Laser Diodes Based on InGaAsP Alloys," Nature 369:631-633.

Ribas et al. (1998) "Bulk Micromachining Characterization of 0.2 Micro-Meter HEMT MMIC Technology for GaAs MEMS Design," Mater. Sci. Eng. B 51:267.

Velev et al. (1997) "Porous silica via colloidal crystallization," Nature 389:447-448, Sep. 2002.

Vilan et al. (2000) "Molecular Control Over Au/GaAs Diodes," Nature 404:166-168, Mar. 9, 2000.

Vlasov et al. (2001) "On-Chip Natural Assembly of Silicon Photonic Bandgap Crystals," Nature 414:289-293, Nov. 15, 2001.

Voss, D. (2000) "Cheap and Cheerful Circuits," Nature 407:442-444, Sep. 28, 2000.

Wagner et al. (2003) "Silicon for Thin-Film Transistors," Thin Solid Films 430:15-19, Jul. 28, 2004.

Wagner et al. (2005) "Electronic Skin: Architecture and Components," Physica E 25:326-334, Jan. 1, 2003.

Wang et al. (2003) "A Solution-Phase, Precursor Route to Polycrystalline SnO2 Nanowores That Can Be Used for Gas Sensing under Ambient Conditions," J. Am. Chem. Soc. 125:16176-16177, Aug. 4, 2003.

Whang et al. (2003) "Large-Scale Hierarchical Organization of Nanowire Arrays for Integrated Nanosystems," Nano Lett. 3(9):1255-1259, Jul. 11, 2003.

Won et al. (2004) "Effect of Mechanical and Electrical Stresses on the Performance of an a-Si:H TFT on Plastic Substrate," J. Electrochem. Soc. 151:G167-G170, Jan. 29, 2004.

Wu et al. (2002) "Growth of Au-Catalyzed Ordered GaAs Nanowire Arrays by Molecular-Beam Epitaxy," Appl. Phys. Lett. 81:5177-5179, Dec. 30, 2002.

Wu et al. (2003) "Growth, Branching, and Kinking of Molecular-Beam Epitaxial (110) GaAs Nanowires," Appl. Phys. Lett. 83:3368-3370, Oct. 20, 2003.

Wu et al. (2001) "Amorphous Silicon Crystallization and Polysilicon Thin Film Transistors on SiO2 Passivated Steel Foil Substrates," Apple. Surf. Sci 175-176:753-758, Dec. 25, 2000.

Wu et al. (2001) "Thermal Oxide of Polycrystalline Silicon on Steel Foil as a Thin-Film Transitor Gate Dielectric," Appl. Phys. Lett. 78:3729-2731, Jun. 4, 2001.

Xia et al. (2003) "One-Dimensional Nanostructures: Synthesis, Characterization and Applications," Adv. Mater. 15:353-389, Mar. 4, 2003.

Xia et al. (1998) "Soft Lithography," Annu. Rev. Mater. Sci. 28:153-184, Jan. 1998.

Xia et al. (1999) "Unconventional Methods for Fabricating and Patterning Nanostructures," Chem. Rev. 99:1823-1848, Mar. 15, 1999.

Xia (1998) "Soft Lithography" Angew. Chem. Int. Ed. 37:550-575, Jan. 1998.

Yang et al. (1997) "Mesoporous Silica with Micrometer-Scale Desgns," Adv. Mater. 9:811-814, Oct. 1997.

Yang et al. (2002) "Creating Periodic Three-Dimensional Structures by Multibeam Interface of Visible Laser," Chem. Mater. 14:2831-2833, Jun. 3, 2002.

Yang et al. (2000) "Stability of Low-Temperature Amorphous Silicon Thin Film Transistors Formed on Glass and Transparent Plastic Substrates," J. Vac. Sci. Technol. B 18:683-689, Jan. 3, 2000.

Yang, P. (2005) "The Chemistry and Physics of Semiconductor Nanowires," MRS Bull. 30:85, Feb. 2005.

Yeh et al. (1994) "Fluidic Self-Assembly for the Integration of GaAs Light-Emitting Diodes on Si Substrates," IEEE Photon. Technol. Lett. 6:706-708, Jun. 1994.

Yin et al. (2000) "A Soft Lithography Approach to the Fabrication of Nanostructures of Single Crystalline Silicon with Well-Defined Dimensions and Shapes," Adv. Mater. 12:1426-1430, Oct. 2, 2000.

Yin et al. (2005) "Colloidal Nanocrystal Synthesis and the Organic-Inorganic Interface," Nature 437:664-670, Sep. 29, 2005.

Yoon et al. (2005) "Low-Voltage Organic Field-Effect Transistors and Inverters Enabled by Ultrathin Cross-Linked Polymers as Gate Dielectrics," J. Am. Chem. Soc. 127:10388-10395, Apr. 16, 2005.

Yu et al. (2003) "Two- Versus Three-Dimensional Quantum Confinement in Indium Phosphide Wires and Dots," Nat. Mater. 2:517-520, Aug. 2003.

Yu et al. (2003) "Solution-Liquid-Solid Growth of Soluble GaAs Nanowires," Adv. Mater. 15:416-419, Mar. 4, 2003.

Zakhidov et al. (1998) "Carbon Structure with Three-Dimensional Periodicity at Optical Wavelengths," Science 282:897-901, Oct. 30, 1998.

Zaumseil et al. (2003) "Nanoscale Organic Transistors that use Source/Drain Electrodes Supported by High Resolution Rubber Stamps," Appl. Phys. Lett. 82(5):793-795, Nov. 29, 2002.

Zaumseil et al. (2003) "Three-Dimensional and Multilayer Nanostructures Formed by Nanotransfer Printing," Nano Lett. 3(9):1223-1227, Jul. 15, 2003.

Zheng et al. (2004) "Shape-and Solder-Directed Self-Assembly to Package Semiconductor Device Segments," Appl. Phys. Lett. 85:3635-3637, Aug. 17, 2004.

Zhou et al. (2004) "p-Channel, n-Channel Thin Film Transistors and p-n Diodes Based on Single Wall Carbon Nanotube Networks," Nano Lett. 4:2031-2035, May 26, 2004.

Zhou et al. (2002) "An Efficient Two-Photon-Generated Photoacid Applied to Positive-Tone 3D Microfabrication," Science 296:1106-1109, May 10, 2002.

Zhu et al. (2005) "Spin on Dopants for High-Performance Singel-Crystal Silicon Transistors on Flexible Plastic Substrates," Appl. Phys. Lett. 86:133507, Mar. 23, 2005.

Jortner et al. (2002) "Nanostructured Advanced Materials Perspectives and Directions," Pure Appl. Chem. 74 (9):1491-1506, Sep. 2002.

Kulkarni et al. (2002) "Mesoscale Organization of Metal Nanocrystals," Pure Appl. Chem 74(9):1581-1591, Sep. 2002.

Landes et al. (2002) "Some Properties of Spherical and Rod-Shaped Semiconductor and Metal Nanocrystals," Pure Appl. Chem. 74(9):1675-1692, Sep. 2002.

Nath et al. (2002) "Nanotubes of the Disulfides of Groups 4 and 5 Metals," Pure Appl. Chem. 74(9):1545-1552, Sep. 2002.

Pushpa et al. (2002) "Stars and Stripes. Nanoscale Misfit Dislocation Patterns on Surfaces," Pure Appl. Chem. 74 (9):1663-1671, Sep. 2002.

Sanyal et al. (2002) "Morphology of Nanostructures Materials," Pure Appl. Chem. 74(9):1553-1570, Sep. 2002.

Sen et al. (2002) "Nonequilibrium Processes for Generating Silicon Nanostructures in Single-Crystalline Silicon," Pure Appl. Chem. 74(9):1631-1641, Sep. 2002.

Willner et al. (2002) "Functional Nanoparticle Architectures for Senoric, Optoelectronic, and Bioelectronic Applications," Pure Appl. Chem. 74(9):1773-1783, Sep. 2002.

* cited by examiner a b

PATTERN TRANSFER PRINTING BY KINETIC CONTROL OF ADHESION TO AN ELASTOMERIC STAMP

CROSS-REFERENCE TO RELATED APPLICATIONS

This application is a continuation-in-part of U.S. patent application Ser. Nos. 11/145,542, filed Jun. 2, 2005 and U.S. patent application Ser. No. 11/145,574, filed Jun. 2, 2005, both of which claim the benefit under 35 U.S.C. 119(e) of U.S. Provisional Patent Application Nos. 60/577,077, 60/601,061, 60/650,305, 60/663,391 and 60/677,617 filed on Jun. 4, 2004, Aug. 11, 2004, Feb. 4, 2005, Mar. 18, 2005, and May 4, 2005, respectively, all of which are hereby incorporated by reference in their entireties to the extent not inconsistent with the disclosure herein.

STATEMENT REGARDING FEDERALLY SPONSORED RESEARCH OR DEVELOPMENT

This invention was made, at least in part, with United States governmental support awarded by National Science Foundation under grant DMI-0328162, DARPA-funded AFRL-managed Macroelectronics Program Contract FA8650-04-C-7101, the US Department of Energy under grant DEFG02-91-ER45439. The United States government has certain rights in this invention.

BACKGROUND OF THE INVENTION

An increasing number of technologies require large-scale integration of disparate classes of separately fabricated objects into spatially organized, functional systems. Here we introduce an approach for heterogeneous integration based on kinetically controlled switching between adhesion and release of solid objects to and from an elastomeric stamp. We describe the physics of soft adhesion that govern this process and demonstrate the method by printing objects with a wide range of sizes and shapes, made of single-crystal silicon and GaN, mica, highly ordered pyrolytic graphite, silica and pollen, onto a variety of substrates, even without specially designed surface chemistries or separate adhesive layers. The process is compatible with procedures that use special surface chemistries or adhesive layers to bind objects to their printing targets. Printed p-n junctions and photodiodes fixed directly on highly curved surfaces illustrate some unique device-level capabilities of this approach.

Examples of systems that rely critically on heterogeneous integration range from optoelectronic systems that integrate lasers, lenses and optical fibers with control electronics, to tools for neurological study that involve cells interfaced to arrays of inorganic sensors, to flexible 'macroelectronic' circuits and actuators that combine inorganic device components with thin plastic substrates. The most significant challenges associated with realizing these types of system derive from the disparate nature of the materials and the often vastly different techniques needed to process them into devices. As a result, all broadly useful integration strategies begin with independent fabrication of components followed by assembly onto a single device substrate. The present invention addresses a need in the art for a reliable and robust transfer printing process that can assemble disparate components onto a single device substrate.

The present invention encompasses a deterministic, high-speed approach for manipulation and heterogeneous integration that uses kinetically controlled adhesion to elastomeric transfer devices, or stamps, to transfer print solid objects from one substrate to another. This technique provides an important combination of capabilities that is not offered by other assembly methods, such as those based on 'pick and place' technologies, wafer bonding, or directed self-assembly.

The method presented herein allows manipulation of arrays of objects based on kinetically controllable adhesion to a viscoelastic stamp in a massively parallel and deterministic manner. The mechanics suggest paths for optimizing the material properties of the stamps in ways that have not been explored in soft lithography or related areas. Even with existing materials, the printing procedure provides robust capabilities for generating microstructured hybrid materials systems and device arrays with applications in optoelectronics, photonics, non-planar fabrication and biotechnology without the use of precision moving parts, applied electric or magnetic fields. The stamp-based methods of the present invention are invaluable tools for handling the building blocks of nano- and other emerging technologies to construct devices based on these technologies.

SUMMARY OF THE INVENTION

The present invention provides methods, systems and system components for transferring, assembling and integrating features and arrays of features having selected nanosized and/or microsized physical dimensions, shapes and spatial orientations. Methods of the present invention utilize principles of 'soft adhesion' to guide the transfer, assembly and/or integration of features, such as printable semiconductor elements or other components of electronic devices. Methods of the present invention are useful for transferring features from a donor substrate to the transfer surface of an elastomeric transfer device and, optionally, from the transfer surface of an elastomeric transfer device to the receiving surface of a receiving substrate. The present methods and systems provide highly efficient, registered transfer of features and arrays of features, such as printable semiconductor elements, in a concerted manner that maintains the relative spatial orientations of transferred features.

In one embodiment, the present methods and systems exploit the viscoelastic properties of elastomeric transfer devices to provide kinetic control of adhesion between a transfer surface of the transfer device and features subject to processing via transfer, assembly or integration. The viscoelastic nature of the elastomeric material of the transfer device results in an adhesion force that depends, at least in part, on the rate that the transfer surface is peeled away or otherwise separated from a donor substrate having features disposed thereon, or the rate that the transfer surface having features disposed thereon is peeled away or otherwise separated from a receiving substrate. High separation rates are used in the present invention, for example, to generate adhesion forces large enough to transfer features, such as printable semiconductor elements, from a donor substrate to a transfer surface of an elastomeric transfer device. Low separation rates are used in the present invention, for example, to generate adhesion forces low enough to facilitate transfer of features, such as printable semiconductor elements, disposed on a transfer surface of an elastomeric transfer device to a donor substrate. Methods of this aspect of the present invention are useful for transferring, assembling and integrating a wide range of useful materials and structures, device components and/or functional devices onto or into a receiving substrate with high placement accuracy and pattern fidelity, particularly in the context of transfer contact printing. The methods and systems of the present invention are compatible with a range of receiving substrate compositions including polymer, ceramic, metal, semiconductor, paper, and glass substrates, substrate geometries including planar and contoured substrates, and substrate surface morphologies including smooth and rough substrates.

The invention is particularly useful for generating patterns of features on surfaces of substrates exhibiting excellent reproducibility, pattern fidelity and resolution. The present invention is capable of high throughput patterning of large receiving substrate areas (greater than or equal to about 232 cm$^2$) and, thus, enable a robust and commercially attractive manufacturing pathway to a range of functional systems and devices including electronic device arrays, nano- and micro-electromechanical systems, nano and micro-biological systems, sensors, energy storage devices and integrated electronic circuits. Further, nanopatterning and micropatterning methods and systems of the present invention are compatible with a wide range of substrates and materials, including semiconductors, wafers, metals, metal alloys, semimetals, insulators, crystalline materials, amorphous materials, biological materials, and the methods can be employed under a wide range of processing conditions, including low temperature (<about 400 degrees Celsius) processing.

In one embodiment, the present invention provides methods for transferring features, including nanosized and/or microsized structures, using an elastomeric transfer device to transfer a feature from a first substrate surface to a second substrate surface by applying different kinetic separation (e.g., using a different peeling rate and/or separation rate for example) of surfaces to variably control adhesion of the feature to the transfer surface of an elastomeric transfer device.

In one aspect, the invention provides a method of transferring a feature from a donor substrate surface to a receiving substrate surface, optionally providing registered transfer of features and feature arrays from the donor substrate to the receiving substrate. In one embodiment, a method of this aspect of the present invention comprises the step of providing an elastomeric transfer device having a transfer surface and providing a donor substrate having a donor surface. The donor surface has at least one feature disposed thereon. The method further comprises the step of contacting at least a portion of the transfer surface with at least a portion of the donor surface feature and physically separating the transfer surface from the donor surface at a first separation rate such that at least a portion of the feature is transferred from the donor surface to the transfer surface. The method further comprises the step of providing a receiving substrate having a receiving surface, and contacting at least a portion of the feature disposed on the transfer surface with the receiving surface. The transfer surface having features disposed thereon is separated from the receiving surface at a second separation rate, that is less than the first separation rate, such that at least a portion of the feature disposed on the transfer surface is transferred to the receiving surface, thereby transferring a feature from the donor surface to the receiving surface. In this embodiment, use of a first separation rate greater than the second separation is beneficial for providing efficient transfer from the donor substrate to the receiving substrate. The terms "separation rate" and peel rate" are used synonymously in the present description.

In the context of this description, a "feature" refers to a structure on, or an integral part of, a donor surface to be transferred to an elastomeric transfer device and/or a receiving surface of a receiving substrate. The term feature encompasses a free-standing structure supported by a donor surface, such as an entirely undercut free-standing structure and encompasses a feature that is integral connected to the donor surface (e.g., a monolithic structure, or discrete structures connected by an adhesive layer or by surface forces including van der Waals forces, etc.), such as a completely or partially undercut structure connected to the donor surface via one or more bridge elements and/or other alignment maintenance elements. In some useful embodiments, feature comprises one or more printable semiconductor elements, patterns of printable semiconductor elements and arrays of printable semiconductor elements. Some features useful in the present invention are micro-sized structures or nano-sized structures. The term feature, as used herein, also refers to a pattern or an array of structures, and encompasses patterns of nanostructures, patterns of microstructures or a pattern of microstructures and nanostructures. In an embodiment, a feature comprises a functional device component or functional device.

In the present methods, the viscoelastic properties of an elastomeric transfer device enables precise control of adhesion forces involved in transfer of features from a donor substrate to a transfer surface of a transfer device and from the transfer surface of a transfer device to a receiving substrate. Elastomeric transfer devices of the present invention may comprise any elastomer material, including composite materials, so long as the transfer device exhibits viscoelastic behavior such that adhesion between a feature and the transfer device is rate-sensitive. Accordingly, selection of the composition, physical dimensions (e.g. thickness) and mechanical properties of the elastomeric transfer device used in the present methods is important to provide high yield transfer efficiencies, and optionally registered transfer. In an embodiment, the elastomeric transfer device comprises at least one elastomer layer having a Young's modulus between about 1 MPa and about 20 MPa. In an embodiment, the elastomeric transfer device comprises at least one elastomer layer having a thickness between about 1 micron and about 100 microns. In an embodiment, the elastomeric transfer device comprises an elastomeric stamp, elastomeric mold or elastomeric photomask. In one embodiment, the elastomeric transfer device comprises polydimethylsiloxane. In another embodiment, the transfer device comprises perfluorinated polyether. In another embodiment, the transfer device comprises Scotch® tape.

Use of an elastomeric transfer device is also beneficial in the present methods because it is capable of providing conformal contact with the surfaces of features, donor substrates and/or receiving substrates. In an embodiment, conformal contact is established between the transfer surface of the elastomeric transfer device and an external surface of the feature and optionally, conformal contact is established between the transfer surface having the feature disposed thereon and the receiving surface of the receiving substrate. In the context of this description, the term "external surface" refers to a feature surface that is accessible to the transfer surface.

In the present invention, the rate that the elastomeric transfer device is separated from substrates and/or features on substrates is selected so as to generate adhesive forces useful for transferring, assembling and integrating features. In an embodiment, the first separation rate is at least 10 times larger than the second separation rate, and in some embodiments the first separation rate is at least 100 times larger than the second separation rate. In an embodiment, the first separation rate is greater than or equal to about 10 cm/s so as to provide efficient transfer of one or more features from the surface of a donor substrate to the transfer surface of the transfer device and the second separation rate is less than or equal to about 1 mm/s so as to provide efficient transfer of one or more features from the transfer surface of the transfer device to the receiving surface of a receiving substrate. In one embodiment, features undergoing transfer have lengths selected over the range of about 100 nanometers to about 1000 microns, widths selected over the range of about 100 nanometers to about 1000 microns and thicknesses selected over the range of about 1 nanometer to about 1000 microns, and the first separation rate is selected over the range of about 100 cm/s to 0.1 mm/s and/or the second separation rate is selected over the range of about 0.1 mm/s to 100 cm/s. In an embodiment, the first separation rate selected so as to generate a separation energy between the feature and the transfer surface of the elastomeric transfer device per unit area equal to or greater than 4 J/m$^2$.

Separation rates useful in the present invention may be constant, substantially constant, or variable with respect to time. In this context, the expression "substantially constant with respect to time" refers to a separation rate that varies by less than 10% over a separation time (or peel time) interval. Similarly, a separation rate that is "substantially constant" refers to a separation rate that varies less than 10% over a separation time interval and/or less than 10% over a separation region. The invention optionally further comprises use of a first separation rate, a second separation rate or both first and second separation rates that are substantially constant as a function of time. In another embodiment, the first separation rate, the second separation rate or both the first and second separation rate varies selectively as a function of time, for example increasing, decreasing, or having an interval or region over which the rate increases and a second interval or region over which the rate decreases as separation proceeds across distance or time.

Use of large first separation rates in the present invention is also useful for releasing features connected to and/or supported by a donor substrate. The present invention includes methods wherein the feature is connected to the donor surface, for example by one or more bridge elements or other alignment maintenance elements, and the first separation rate is large enough so as to cause release of the feature from the donor surface. In one embodiment, for example, the feature is connected to the donor surface via at least one bridge element and the first separation rate is large enough to cause fracture of the bridge element(s), thereby resulting in release of the feature from the donor surface. Alternatively, the present invention includes methods wherein the feature is a free standing structure supported by the donor surface, wherein the first separation rate is large enough to release the structure from the donor surface onto the transfer surface of the transfer element.

In an embodiment, the invention provides methods wherein the steps of: contacting at least a portion of the transfer surface with at least a portion of the feature; separating the transfer surface from the donor surface at the first separation rate; contacting at least a portion of the feature disposed on the transfer surface with the receiving surface of the receiving substrate; separating the transfer surface from the feature at a second separation rate or any combination of these steps are carried out via an actuator, such as a roller printing or flexographic printing assembly or a mechanical stage, operationally connected to the transfer device.

In an embodiment, the invention further comprises the steps of: providing a plurality of printable semiconductor elements wherein each of the printable semiconductor element is optionally connected to the donor substrate via at least one bridge element; the method further comprising the steps of: contacting at least a portion of the transfer surface with at least a portion of the pattern of printable semiconductor element; separating the transfer surface from the donor surface at a first separation rate such that at least a portion of the bridge elements are fractured and at least a portion of the pattern of printable semiconductor elements is transferred from the donor surface to the transfer surface, thereby forming the transfer surface having the printable semiconductor elements disposed thereon; contacting at least a portion of the printable semiconductor elements disposed on the transfer surface with the receiving surface of the receiving substrate; and separating the transfer surface from the feature at a second separation rate, wherein the first separation rate is larger than the second separation rate, thereby transferring at least a portion of the pattern of printable semiconductor elements to the receiving surface. In an embodiment, the printable semiconductor element is connected to the donor substrate via one or more bridge elements (or other alignment maintenance elements), wherein the separation rate is large enough to cause fracture of the bridge element(s) (or other alignment maintenance elements), thereby resulting in release of the printable semiconductor element from the donor surface and transfer to the transfer surface of the elastomeric transfer device. In an embodiment, the portion of the pattern of printable semiconductor elements is transferred with good fidelity. In another embodiment, the portion of the pattern of printable semiconductor elements is transferred to a selected region of the receiving surface with a placement accuracy better than or equal to about 25 microns over a receiving surface area equal to about 5 cm$^2$.

In an embodiment, the transferred feature comprises a semiconductor structure composed of one or more of silicon, single crystal silicon, polycrystalline silicon, doped silicon, n-type silicon, p-type silicon, GaN (gallium nitride), GaAs (gallium arsenide), and InP (indium phosphide). Alternatively, the transferred features comprise mica, highly ordered pyrolytic graphite, silica, or pollen. In an embodiment, the transferred feature comprises a silicon photodiode. The feature, in an embodiment, is selected from the group consisting of: an electronic device, a component of an electronic device, a diode, a transistor, a photovoltaic device, a sensor, a light emitting diode, a microelectromechanical device, a nanoelectromechanical device, a photodiode, a laser, a P-N junction, a wire, a pill, and a small container. In an embodiment, the feature comprises a pattern of microstructures, nanostructures or both; and the invention further comprises transferring the pattern of microstructures, nanostructures or both from the donor surface to the receiving surface. The feature, in an embodiment, comprises a pattern of structures wherein substantially all the structures in contact with the transfer surface are transferred to the receiving surface.

Any of the methods disclosed herein can further comprise repeating at least a portion of the steps. In some embodiments, for example, processing steps are repeated so as to generate multi-layered structures on a receiving surface. In some methods, processing steps of the present invention are repeated so as to transfer, assemble and integrate different features, optionally from different donor surfaces, into a multicomponent electronic device or array of electronic devices.

The invention disclosed herein further comprises a method of making an electronic device, array of electronic devices or components of an electronic device such as a p-n junction; a photodiode, a transistor, a light emitting diode, a laser, a photovoltaic device, a memory device, a microelectromechanical device; a nanoelectromechanical device; and a complementary logic circuit.

In an embodiment, the process comprises a transfer device comprising an elastomer layer having a transfer surface, such as a PDMS layer, wherein the rate of separation of the transfer surface from a donor surface or receiving surface is selectively controllable. In some embodiments, a transfer device of the present invention is capable of providing a separation rate of the transfer surface from a donor surface that is about 10 cm/second or greater and providing a separation rate of the transfer surface having a feature disposed thereon from the receiving surface that is about 1 mm/second or less.

In an embodiment, only a portion of the feature is transferred to the receiving substrate. In an embodiment, substantially all the features in contact with the transfer surface are transferred to the transfer surface. In an embodiment, substantially all the features in contact with the receiving surface are transferred from the transfer surface to the receiving surface.

In an embodiment, the donor surface and/or receiving surface is substantially flat. Flatness can be assessed by measuring the surface height relative to a reference line positioned at the average surface location and normalizing the maximum deviation to the length of the surface. Substantially flat refers to a normalized maximum deviation from the reference line that is less than 1%. A surface that is not substantially flat is contoured. In an embodiment one or more of the donor surface, receiving surface and/or transfer surface is contoured. Donor surfaces, receiving surface and transfer surfaces useful in the present methods can have both contoured and flat portions.

In an embodiment, the donor substrate, the receiving substrate, the transferable features, the transfer element, or any combination of the above items may comprise molded, embossed, machined, or otherwise defined topographical relief features that may either aid in the fabrication processes described in the present invention or in the function of the devices and systems fabricated by methods described by the present invention.

In an embodiment, the invention is a method of manufacturing a device comprising: providing an elastomeric stamp having a stamp surface; providing a donor substrate having a donor surface, wherein the donor surface has at least one feature; contacting at least a portion of the stamp surface with at least a portion of the donor surface feature; separating the stamp surface from the donor surface at a first separation rate such that at least a portion of the feature is transferred from the donor surface to the stamp surface; providing a device substrate having a device surface; contacting at least a portion of the stamp surface having the transferred feature with the device surface; and separating the stamp surface from the device surface at a second separation rate such that at least a portion of the stamp surface feature is transferred to the device surface to generate a device on the device substrate.

In an embodiment, the device comprises a p-n junction. In an embodiment, the device is a photodiode. In an embodiment, the device is a component of an optoelectronic system. In an embodiment, the device comprises an actuator. In an embodiment, the device comprises a feature that is a biological entity and the device interacts with a biological system, including a cell isolated from the body.

In an embodiment, the invention comprises means and methods of separating with controlled separation rates, as known in the art. Exemplary means and methods of separation with controlled rate include, but are not limited to, use of rolled and flexographic printer configurations, axis-symmetric separation, and non-axis-symmetric separation. "Axis-symmetric separation" refers to a means of separating a transfer element from a donor or receiver substrate by applying an approximately (within 10%) uniform separation force across the contacted area. "Non-axis-symmetric separation" refers to a means of separating a transfer element from a donor or receiver substrate by applying a non-uniform separation force across the contacted area, for example, by applying a greater separation force at the edges or corners of the contacted area, for example, using a "peeling" motion.

In an embodiment, the radius of curvature or induced radius of curvature of the transfer elements are controlled to facilitate transfer of features, especially rigid features.

The invention provides important functional benefits compared to conventional printing techniques known in the art, including: (1) good placement accuracy, (2) high pattern fidelity, (3) general applicability to systems regardless of surface chemistry, surface curvature and/or geometry and surface morphology, (4) switchable/controllable adhesion strength levels of printed materials to the printing element and (5) good transfer efficiency (i.e. percentage of elements transferred from donor surface to receiving surface).

The receiving surface and/or receiving substrate can be of any composition, so long as the feature to be printed is capable of transferring from the transfer surface to the receiving surface at the second separation rate. In addition, the receiving surface can be of any shape including, but not limited to, planar, contoured, convex, concave or a combination of convex and concave. The surface can be smooth or rough. A surface is said to be "smooth" when there is less than about 3 nm variation in surface height as determined by atomic force microscopy within a region having an area of 1 $um^2$. In an embodiment, the receiving surface has no specially designed surface chemistries, nor any separate adhesive layers. Alternatively, the receiving surface may have one or more planarization or smoothing layers (e.g. spin-on glass), adhesive layers (e.g. a conformable layer), or functionalized regions (e.g. hydrophilic or hydrophobic regions) to facilitate transfer, assembly and integration of features. Embodiments of this aspect of the present invention, therefore, may further comprise the step of providing one or more adhesive layer or functionalized region(s) on the receiving surface, wherein the feature disposed on the transfer surface contacts the adhesive layer. In an embodiment, the receiving substrate is a material selected from the group consisting of: a polymer, a semiconductor wafer, a ceramic material, a glass, a metal, paper, a dielectric material or any combination of these. In an embodiment the receiving substrate comprises a semiconductor, such as silicon, GaAs or InP. In an embodiment, the receiving substrate comprises a wafer, including a single-crystal wafer.

The receiving substrate may comprise one or more viscoelastic and/or elastomeric adhesive layers exhibiting kinetically controllable adhesive strengths. In one embodiment, a receiving substrate is coated with thin layers of PDMS. In this embodiment, features are transferred to the receiving substrate with efficiencies determined by the rate of separation between a transfer element and the receiving substrate and determined by the thickness of the thin PDMS layer (generally from 10 to 100000 nm). In this embodiment transfer printing efficiency may be best at either high or low rates, depending upon the thickness of the thin PDMS layer.

The receiving substrate may comprise a soft, conformable layer partially or fully coated with gold to accept features in a manner that allows electrical connection to the interface between the features and the receiving substrate. In one embodiment, the features may be coated with gold to allow strong bonding of the features and the receiving substrate by cold-welding of the gold layers joined during printing.

The transfer devices of the present invention include use of a transfer device that is a stamp, a mask, or a mold. In an embodiment, the transfer device comprises a single elastomer layer. In an embodiment, the transfer device comprises multiple elastomer layers. In an embodiment, any of the transfer devices comprise ridged backing to facilitate handling. In an embodiment, the invention further comprises incorporation of an actuator for facilitating surface-feature contact including, but not limited to, an actuator that is a roller printing assembly, or a roller that is a flexographic printer assembly. In an embodiment, the transfer device is moved into contact with a donor/receiving surface. In another embodiment, the receiving/donor surface is moved into contact with the transfer device. In yet another embodiment, both the transfer stamp and the receiving/donor surfaces are both moved into contact with each other.

The present invention is particularly suited for methods of transferring, assembling and/or integrating printable semiconductor elements. In an embodiment, the invention transfers features via contact printing, including dry contact printing. In an embodiment the invention transfers features via registered transfer, assembly and/or integration processes. In an embodiment the invention transferred features coated with layers, optionally sacrificial layers, including but not limited to layers composed of polymeric or dielectric materials, that separate features from the surface of the transfer element in order to avoid possible contamination of the feature by the transfer element.

An advantage of the use of controlled separation rates in the transfer methods of the present invention is that patterns of printable semiconductors elements may be transferred and assembled onto substrate surfaces in a manner preserving selected spatial orientations of semiconductor elements which define the pattern. This aspect of the present invention is particularly beneficial for applications wherein a plurality of printable semiconductor elements are fabricated in well defined positions and relative spatial orientations which directly correspond to a selected device configuration or array of device configurations. Transfer methods of the present invention are capable of transferring, positioning and assembling printable semiconductor elements and/or printable semiconductor containing functional devices including, but not limited to, transistors, optical waveguides, microelectromechanical systems, nanoelectromechanical systems, laser diodes, or fully formed circuits.

Another advantage of the use of controlled separation rates in transfer methods is that the levels of adhesion necessary for the removal of certain relatively strongly bound features from donor substrates (including relatively thick (>2 μm) silicon beams joined to SOI substrates by bridge elements and mica sheets ionically bound across their entire footprint to a mica substrate) can be accomplished without chemical modification of the transfer elements or of the features themselves. As a result, a relatively weakly adhering interface (e.g. one bound by van der Waals forces) may be used to divide, thickness-wise, and print features comprised of layered materials, including mica, graphite, and transition-metal chalcogenides.

In an embodiment, the surface of the transfer element may be treated chemically or physically (e.g. roughened by plasma etching, metallized, oxidized, chemically functionalized) to tune the strength of adhesion of features to the transfer surface. In one embodiment, the strength of adhesion of features to the transfer surface may be increased by treating the transfer element with ozone. In another embodiment, the strength of adhesion of features to the transfer surface may be decreased by depositing a thin metal layer (0.1 to 1000 nm) onto the transfer element.

In another embodiment, the present invention provides selective transfer and assembly methods wherein some, but not all, of the printable semiconductors provided are transferred and assembled onto or into a substrate. In this embodiment, the elastomeric transfer device is capable of binding selectively to specific printable semiconductor elements provided. For example, the elastomeric transfer device may have a selected three dimensional relief pattern on its external surface having recessed regions and relief features. In this embodiment, recessed regions and relief features may be positioned such that only selected printable semiconductor elements are contacted by one or more contact surfaces provided by the relief pattern, and subsequently transferred and assembled onto the substrate surface. Alternatively, the elastomeric transfer device may have a contact surface or plurality of contact surfaces having a selected pattern of binding regions, such as chemically modified regions having hydroxyl groups extending from the contact surface and/or regions having one or more adhesive surface coatings. In this embodiment, only those semiconductor elements that are contacted with the binding regions on the contact surface(s) are bound to the transfer device, and subsequently transferred and assembled onto the substrate surface. In another embodiment, the elastomeric transfer device may have a contact surface or plurality of contact surfaces having a selected pattern of anti-binding regions, such as chemically or physically modified regions having, for example, metallized regions extending from the contact surface and/or regions having one or more anti-adhesive surface coatings. In this embodiment, only those semiconductor elements that are contacted with the regions on the contact surface(s) that are not treated with anti-binding modifications are bound to the transfer device, and subsequently transferred and assembled onto the substrate surface. An advantage of selective transfer and assembly methods of the present invention is that a first pattern of printable semiconductor elements characterized by a first set of positions and spatial orientations may be used to generate a second pattern of printable semiconductor elements different from the first pattern and characterized by a second set of positions and spatial orientations, corresponding to a selected device configuration or array of device configurations. Another advantage of selective transfer and assembly in the present invention is that the methods described herein may be used to distribute features on a given donor substrate to features on a larger receiving substrate by successive repetitions of retrieving the features from the donor using a transfer element suitable for selective transfer and transferring those features onto the larger receiving substrate.

An exemplary elastomeric transfer device of the present invention comprises a dry transfer stamp, such as an elastomeric transfer stamp or composite, multi-layer transfer device or other patterning devices. Elastomeric transfer devices useful for the present invention include transfer devices comprising a plurality of polymer layers as described in U.S. patent application Ser. No. 11/115,954, entitled "Composite Patterning Devices for Soft Lithography", filed with the U.S. Patent and Trademark Office on Apr. 27, 2005, which is hereby incorporated by reference in its entirety. An exemplary patterning device useable as a transfer device in the methods of the present invention comprises a polymer layer having a low Young's Modulus, such as a poly(dimethylsiloxane) (PDMS) layer, preferably for some applications having a thickness selected from the range of about 1 micron to about 100 microns. Use of a low modulus polymer layer is beneficial because it provides transfer devices capable of establishing good conformal contact with one or more printable semiconductor elements, particularly printable semiconductor elements having curved, rough, flat, smooth and/or contoured exposed surfaces, and capable of establishing good conformal contact with substrate surfaces having a wide range of surface morphologies, such as curved, rough, flat, smooth and/or contoured substrate surfaces.

Optionally, transfer devices of the present invention may further comprise a second layer having an external surface opposite an internal surface, and having a high Young's modulus, such as high modulus polymer layer, ceramic layer, glass layer or metal layer. In this embodiment, the internal surface of the first polymer layer and the internal surface of the second high modulus layer are arranged such that a force applied to the external surface of the second high modulus layer is transmitted to the first polymer layer. Use of a high modulus second polymer layer (or backing layer) in transfer devices of the present invention is beneficial because it provides transfer devices having a net flexural rigidity large enough to provide good binding, transfer and assembly characteristics. For example, use of a transfer device having a net flexural rigidity selected from the range of about $1 \times 10^{-7}$ Nm to about $1 \times 10^{-5}$ Nm minimizes distortions of the positions of semiconductor elements and/or other structures bound to the contact surface(s) upon establishing conformal contact with a substrate surface. Use of a high modulus, rigid backing layer also is beneficial for preventing degradation of the printable semiconductor elements during transfer, for example by prevent cracking of the printable semiconductor layers. This attribute provides methods and devices of assembling printable semiconductor elements exhibiting high placement accuracy and good pattern fidelity. Transfer devices of the present invention may comprise additional layers, including polymer layers, for providing easy handling and maintenance, good thermal properties and for providing uniform distribution of a force applied to the transfer device to the entire contact surface(s), as taught in U.S. patent application Ser. No. 11/115,954, entitled "Composite Patterning Devices for Soft Lithography, filed with the U.S. Patent and Trademark Office on Apr. 27, 2005 which is incorporated by reference in its entirety herein.

In one aspect, the invention provides a method of transferring a feature from a donor substrate surface to a receiving surface of a receiving substrate, the method comprising: providing an elastomeric transfer device having a transfer surface; providing a donor substrate having a donor surface, the donor surface having at least one feature; contacting at least a portion of the transfer surface with at least a portion of the feature; separating the transfer surface from the donor surface at a first separation rate such that at least a portion of the feature is transferred from the donor surface to the transfer surface, thereby forming the transfer surface having the feature disposed thereon; contacting at least a portion of the feature disposed on the transfer surface with the receiving surface of the receiving substrate; and separating the transfer surface from the feature at a second separation rate, wherein the first separation rate is larger than the second separation rate, thereby transferring the feature to the receiving surface.

In another aspect, the invention provides a method of transferring a feature from a donor substrate surface to a receiving surface of a receiving substrate temporarily for processing, and subsequently removing said feature from said receiving substrate, the method comprising: providing an elastomeric transfer device having a transfer surface; providing a donor substrate having a donor surface, the donor surface having at least one feature; contacting at least a portion of the transfer surface with at least a portion of the feature; separating the transfer surface from the donor surface at a first separation rate such that at least a portion of the feature is transferred from the donor surface to the transfer surface, thereby forming the transfer surface having the feature disposed thereon; contacting at least a portion of the feature disposed on the transfer surface with the receiving surface of the receiving substrate; and separating the transfer surface from the feature at a second separation rate, wherein the first separation rate is larger than the second separation rate, thereby transferring the feature to the receiving surface; processing the feature on the receiving surface; contacting at least a portion of the transfer surface with at least a portion of the feature; separating the transfer surface from the receiving surface at a third separation rate such that at least a portion of the feature is transferred from the receiving surface to the transfer surface, thereby removing the feature from the receiving surface. In an embodiment, the same transfer device is used to apply the feature to the receiving surface and to remove the processed feature from the receiving surface. Alternatively, a different transfer device is used.

In another aspect, the invention provides a method of transferring a feature from a donor substrate surface to a receiving surface of a receiving substrate, and subsequently removing said feature from said receiving substrate if said feature is unwanted on said receiving substrate, the method comprising: providing an elastomeric transfer device having a transfer surface; providing a donor substrate having a donor surface, the donor surface having at least one feature; contacting at least a portion of the transfer surface with at least a portion of the feature; separating the transfer surface from the donor surface at a first separation rate such that at least a portion of the feature is transferred from the donor surface to the transfer surface, thereby forming the transfer surface having the feature disposed thereon; contacting at least a portion of the feature disposed on the transfer surface with the receiving surface of the receiving substrate; and separating the transfer surface from the feature at a second separation rate, wherein the first separation rate is larger than the second separation rate, thereby transferring the feature to the receiving surface; contacting at least a portion of the transfer surface with at least a portion of an unwanted feature; separating the transfer surface from the receiving surface at a third separation rate such that at least a portion of the unwanted feature is transferred from the receiving surface to the transfer surface, thereby removing at least a portion of the unwanted feature from the receiving surface.

In another aspect, the invention provides a method of assembling a printable semiconductor element on a receiving surface of a receiving substrate, the method comprising: providing an elastomeric transfer device having a transfer surface; providing a donor substrate having a donor surface, the donor surface having at least one printable semiconductor element, wherein the printable semiconductor element is connected to the donor substrate via at least one bridge element; contacting at least a portion of the transfer surface with at least a portion of the printable semiconductor element; separating the transfer surface from the donor surface at a first separation rate such that the bridge element is fractured and the printable semiconductor element is transferred from the donor surface to the transfer surface, thereby forming the transfer surface having the printable semiconductor element disposed thereon; contacting at least a portion of the printable semiconductor element disposed on the transfer surface with the receiving surface of the receiving substrate; and separating the transfer surface from the feature at a second separation rate, wherein the first separation rate is larger than the second separation rate, thereby transferring the printable semiconductor element to the receiving surface. Optionally, the present invention provides a method of assembling an array of pattern of printable semiconductor elements on a receiving surface of a substrate.

In another aspect, the invention is a method of transferring a printable semiconductor element from a donor substrate surface to a transfer surface of an elastomeric transfer device, the method comprising: providing an elastomeric transfer device having the transfer surface; providing a donor substrate having a donor surface, the donor surface having the printable semiconductor element; contacting at least a portion of the transfer surface with at least a portion of the printable semiconductor element; separating the transfer surface from the donor surface at a separation rate greater than or equal to about 10 cm second$^{-1}$ such that at least a portion of the printable semiconductor element is transferred from the donor surface to the transfer surface.

In another aspect, the invention provides a method of transferring an array of printable semiconductor elements from a donor substrate surface to a transfer surface of an elastomeric transfer device, the method comprising: providing an elastomeric transfer device having the transfer surface; providing a donor substrate having a donor surface, the donor surface having the array of printable semiconductor elements; contacting at least a portion of the transfer surface with at least a portion of the array printable semiconductor elements; separating the transfer surface from the donor surface at a separation rate greater than or equal to about 10 cm second$^{-1}$ such that at least a portion of the array of printable semiconductor elements is transferred from the donor surface to the transfer surface.

BRIEF DESCRIPTION OF THE DRAWINGS

FIG. 22 (a) is a drawing (not to scale) of a PDMS transfer element that is fixed to the actuator stage. (b) shows the donor substrate after successive retrieval experiments (labeled i-vi) at various separation rates, listed in (c). The rates listed in (c) are vertical separation rates and are not equal to the speed of the propagation of the boundary of the contacted region between the transfer element and the donor substrate (in the x-y plane of the donor substrate), which is generally much faster than the vertical separation rate in this configuration. (d), (e), and (f) show optical micrographs of the regions on the donor substrate after experiments i, iii, and iv, at vertical separation speeds of 1 cm/s, 1 μm/s, and 100 μm/s, respectively. The four lightly colored patches in (d) are regions from which nearly all of the features on the donor substrate were retrieved onto the transfer element due to the fast separation rates. (e) shows that no features were retrieved onto the transfer element at the slow vertical separation rate of 1 μm/s. (f) shows that at an intermediate separation rate (100 μm/s), only a few features are retrieved among the many in the region that was previously in contact between the donor substrate and the transfer element. Only those features in the center of the previously contacted region were retrieved off of the donor, where presumably the speed of the propagation of the contacted area boundary (in the x-y plane of the donor substrate) was greatest.

DETAILED DESCRIPTION OF THE INVENTION

Figure 1A:
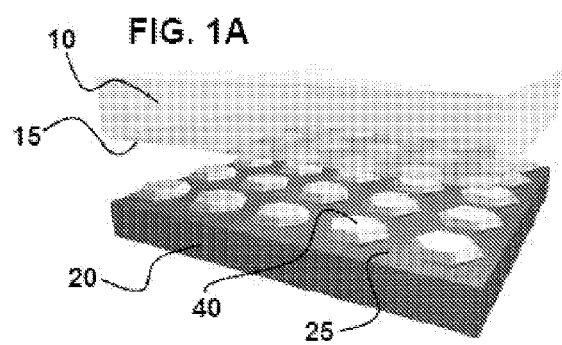
FIG. 1A illustrates a feature on the surface of a donor substrate and a stamp in proximity to the donor substrate. The stamp is brought in physical contact with at least a portion of the feature on the donor substrate and the stamp is subsequently quickly separated from the donor substrate such that the features are removed (e.g., separated from) from the donor substrate (FIG. 1B).
Figure 1B:
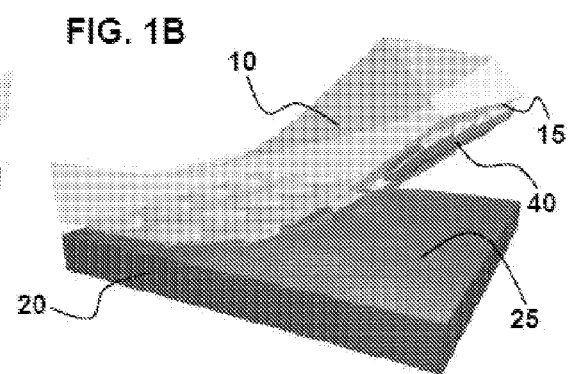
FIG. 1 is a schematic illustration of a general process for transfer printing solid objects.
FIG. 1C depicts the stamp containing the feature being brought into contact with a receiving substrate.
In FIG. 1D the stamp is slowly separated to transfer features from the stamp to the receiving substrate surface.
Figure 1C:
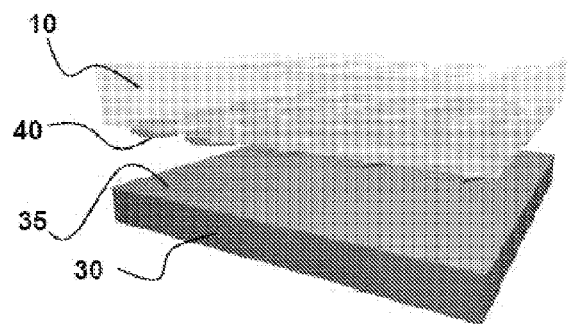
Figure 1D:
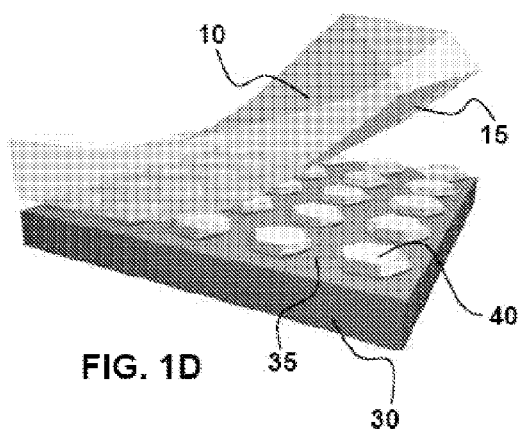

The invention may be further understood by the following non-limiting examples. All references cited herein are hereby incorporated by reference to the extent not inconsistent with the disclosure herewith. Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

In the context of the present invention, the term "transferring" or "transfer" relates to features, materials, structures, device components and/or integrated functional devices that are removed from the surface of one substrate and "printed" or applied to the surface of another substrate.

As used herein, "feature" is used broadly to refer to a material, structure, device component and/or functional device to be transferred, for example via printing techniques such as contact printing. The definition of feature encompasses any element that can be transferred from a donor substrate to a stamp and subsequently printed to a receiving surface including, but not limited to, semiconductor structures, metallic structures, ceramic structures, dielectric structures, composite structures. In some embodiments, features of the present invention are printable semiconductor elements and patterns of printable semiconductor elements. The structure can be a three-dimensional pattern, having a pattern on a surface with a depth and/or height to the pattern. Accordingly, the term feature encompasses geometrical features including, but not limited to, any two-dimensional pattern or shape (circle, triangle, rectangle, square), three-dimensional volume (any two-dimensional pattern or shape having a height/depth), as well as systems of interconnected etched "channels" or deposited "walls." In an embodiment, a feature comprises a biological material or element. In an embodiment, a feature is globular. A globular feature refers to a generally rounded material, for example, microspheres, seeds and other curved objects. The dimensions of the feature can be microsized, nanosized, or both microsized and nanosized. A microstructure is a feature with a dimension on the order of greater than a micron including millimeters and several millimeters. In an embodiment, the transferred feature comprises a plurality of silicon microstructures. A nanostructure is a feature with a dimension on the order of less than about one micron. In an embodiment, a nanosized feature is less than about 100 nm. A "lateral dimension" refers to a distance that is parallel to the contacting transfer surface and partner surface. A "vertical dimension" refers to the vertical height of the feature relative to the supporting surface.

In an embodiment, the feature comprises "microstructures" and/or "nanostructures." As used herein the terms "microstructures" and "microsized structures" are used synonymously, and the terms "nanostructures" and "nanosized structures" are used synonymously. As used herein, "nanostructures" refer to structures having at least one dimension that is on the order of nanometers to microns, including in the range of tens of nanometers to hundreds of nanometers. In an embodiment the nanostructure has at least one feature that is on the order of tens of nm or smaller. For example, the width of the structure can be on the order of 10's to 100's of nm and the length can be on the order of microns to 1000's of microns. In an embodiment the nanostructure has one or more features that range from an order of tens of nm to hundreds of nm. As used herein microstructures refer to structures that are larger than nanostructures. In an embodiment, a microstructure has at least one feature physical dimension ranging from about 1 micron to about 5000 microns.

Feature encompasses a layer or a layer portion, wherein the thickness of the layer or layer portion is between an order of nanometers to microns, including, but not limited to, between about 3 nm to 12 nm. Feature transfer can involve transfer of one or more of biologics, chemicals or geometrical elements. A biologic is a feature that has use in a device for studying biological systems and encompasses, DNA, RNA, proteins and polypeptides. A device of the present invention is said to interact with a cell when the device can detect a physical property associated with the cell. In an embodiment, the biologic or chemical is integrated within another feature to facilitate transfer of the biologic or chemical from a donor surface to a transfer device surface, and then to a receiving surface.

A "pattern" refers to a plurality of features that are deposited and/or etched on a donor surface. Accordingly, the term encompasses a plurality of geometrical features etched onto a surface, as well as a plurality of geometrical features deposited onto a surface and a plurality of geometrical features freestanding on a surface. The present methods and system are capable of transfer printing patterns of structures, including the features discussed herein, having well defined and selected physical dimensions, spatial orientations and positions.

"Circuit" refers to a feature that is an electrical network and encompasses integrated circuits and arrays of integrated circuits.

As used herein, "substrate" refers to a material that has at least one surface that contains a feature or at least one surface for receiving a feature. In an embodiment, the surface to receive a feature is smooth, preferably with a roughness less than about 3 nm over a 1 $\mu m^2$ region.

An "elastomeric transfer device" refers to an elastomeric material having a surface that can receive as well as transfer a feature. Exemplary elastomeric transfer devices include stamps, molds and masks. The transfer device affects and/or facilitates feature transfer from a donor material to a receiver material. "Elastomer" or "elastomeric" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, silicon-based organic polymers including polydimethylsiloxane (PDMS), polybutadiene, polyisobutylene, poly(styrene-butadiene-styrene), polyurethanes, polychloroprene and silicones.

"Contact" refers to the configuration of two or more surfaces such that a feature on the surface of one element is capable of transfer to another surface. For example, a stamp or transfer device is in contact with a donor material when a transfer surface facing a donor surface is in physical contact with the donor surface. Similarly, a transfer surface is in contact with a receiver substrate surface when the transfer surface physically contacts the receiver substrate surface. In an embodiment, contact refers to at least a portion of the feature is in physical contact with at least a portion of another surface. In an embodiment, contact refers to substantially all the features on a surface in contact with another surface. Elements are in physical contact when they are observable as touching. Preferably, physical contact occurs under an applied force to ensure uniform and intimate contact over the portion of contacting surfaces.

"Pattern" refers to a pair of surfaces that have regions of physical contact and regions of no physical contact. For example, in the processes disclosed herein, a transfer device of the present invention is said to have a "pattern of contacts" with a donor surface so as to generate an inked transfer surface having a surface with relief features.

Figure 20:
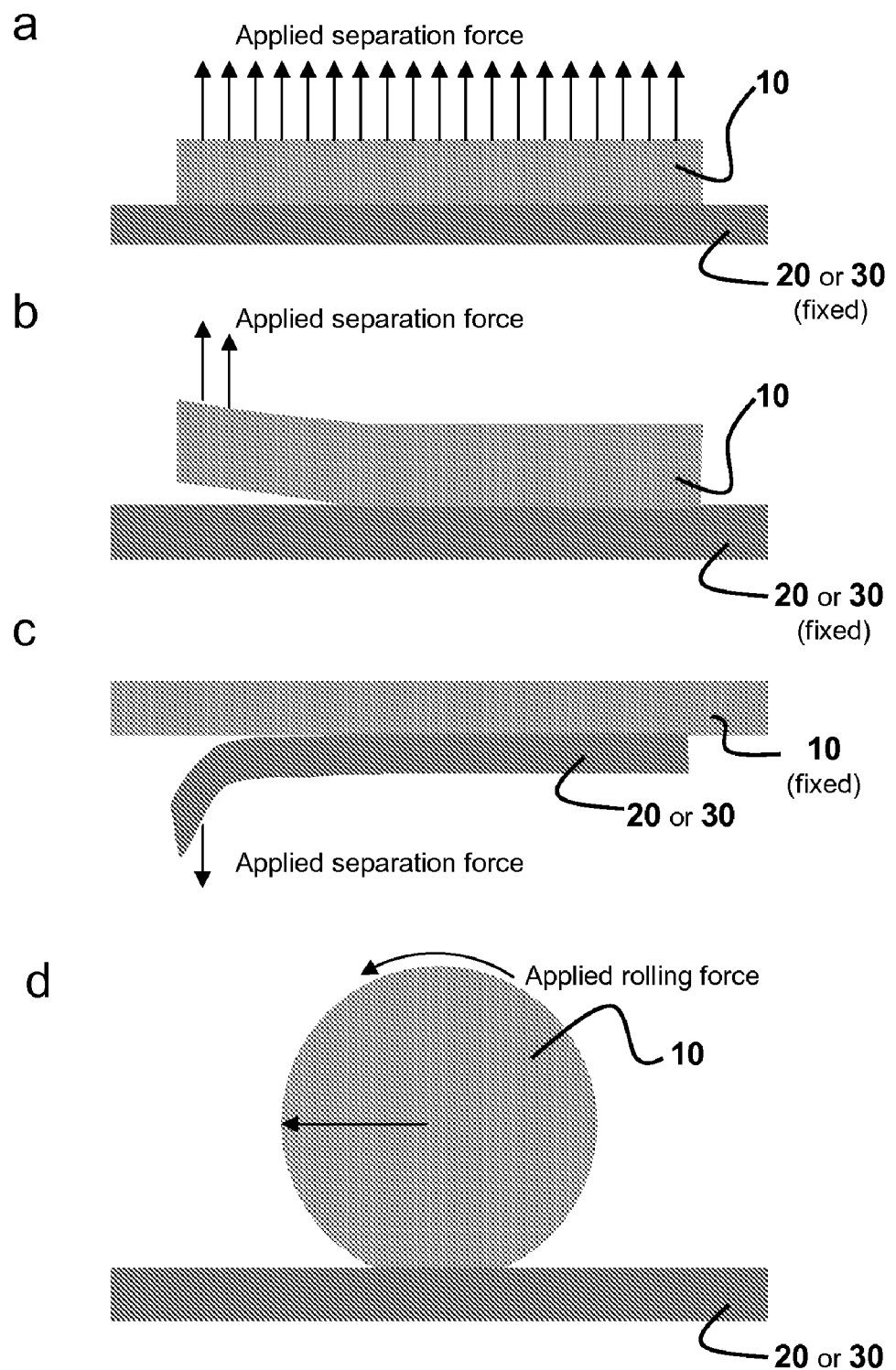
FIG. 20 is a schematic of different means of separation of a transfer element from a receiving or donor substrate. A. depicts axis-symmetric separation. B and C depict non axis-symmetric separation, performed in a peeling motion in which the transfer element is peeled back (B), or in which the substrate is peeled away (C). D. illustrates another type of non axis-symmetric separation provided by applying a rolling force to a curved element, in this case a curved transfer element.
Figure 21:
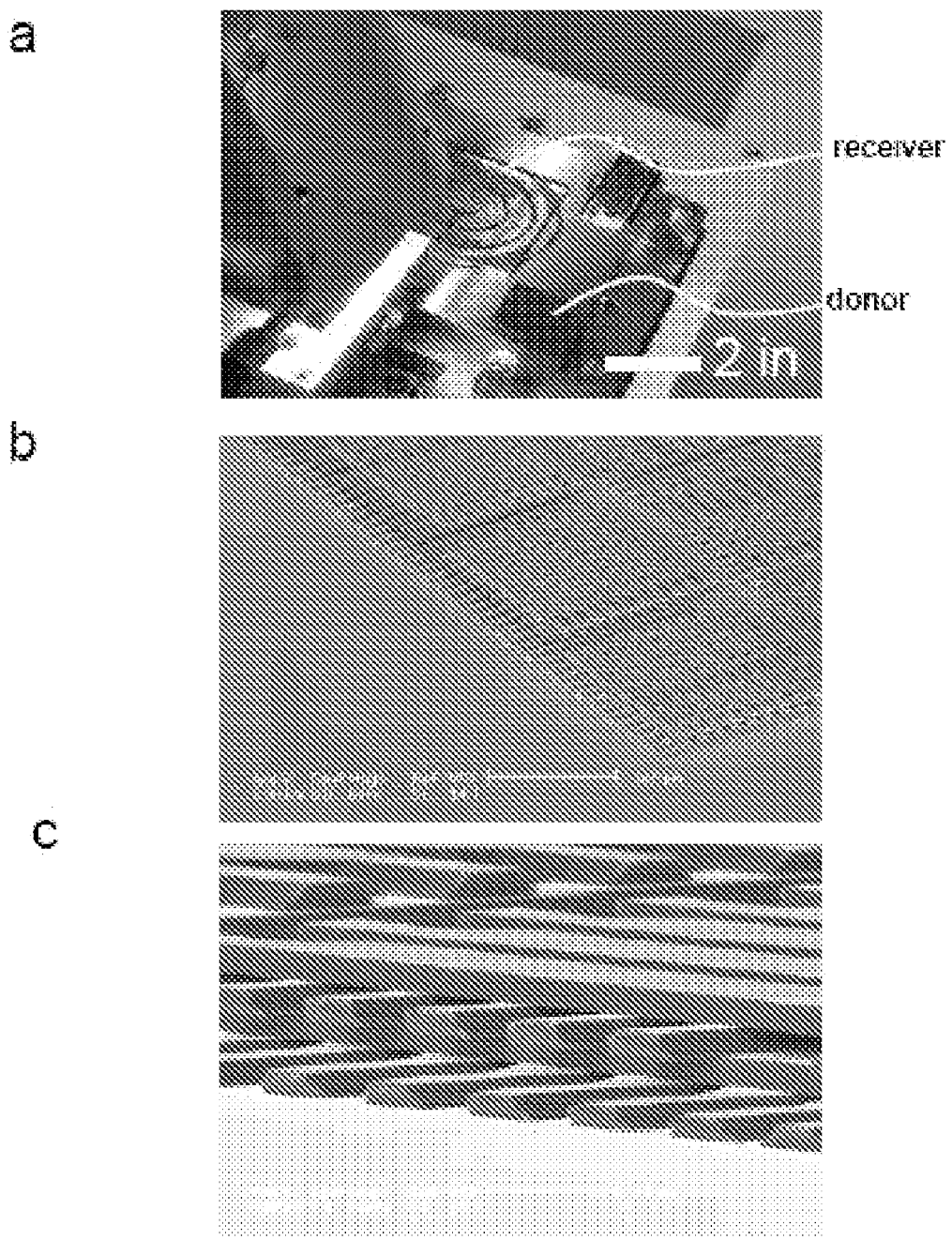
FIG. 21 (a) shows an actuator stage that moves donor and receiver substrates relative to a transfer element in the x-y plane and moves a transfer element in the z-direction with controllable separation rates (scale bar is 2 inches). (b) and (c) show scanning electron micrographs of silicon multilayer structures printed on silicon wafers printed by four successive repetitions of slow separation of a PDMS transfer element from the receiving substrate, transferring silicon features to the substrate one layer at a time.

The transfer device has mechanical attributes and characteristics, including Young's modulus, compressibility modulus, flexural rigidity, that are optimized as known in the art to ensure suitable structures are obtained from any of the processes disclosed herein. At least a portion of the transfer device is elastomeric and/or viscoelastic so that the adhesive force between a solid object and the transfer device is rate-sensitive. As used herein, "separation" and "peeling" are used synonymously and refer to a process at which a first surface in contact with a second surface is separated from the second surface. Separation may be carried out by vertical displacement, horizontal displacement, displacement initiated from the ends of two surfaces and displacement initiated from the interior of two surfaces. Separation encompasses axis-symmetric and non axis-symmetric ("axis-unsymmetric") separation, as illustrated in FIG. 20. For the systems described herein the adhesive force between a feature and an elastomeric transfer device surface is usually, but not always, larger for faster separation rates. In an embodiment, the transfer device comprises a single material, wherein the material is elastomeric. The material properties of the transfer device ensure that as the deposition and/or removal process proceeds, physical contact is maintained between the transfer device and surface during feature transfer. In an embodiment, a force actuator is connected to the transfer device for applying a constant and uniform force, and corresponding pressure, between the transfer device and partner substrate. A force is said to be uniformly applied to a surface such that the pressure distribution between the transfer device's stamping surface and partner surface is substantially uniform, thereby ensuring the transfer device remains level relative to the partner surface. Removal of the transfer device from the partner substrate is by any means known in the art including, but not limited to, removal by hand or controllable displacement rate actuator (see FIGS. 20A and 21A), so long as the rate of removal is controllable. Other methods for removal of the transfer element include rolling (FIG. 20D) and/or peeling (FIG. 20B-C) methods in which a transfer device and donor or receiver substrate are separated by non axis-symmetric separation, e.g., by rolling, where one or more of the contacted bodies is contoured (FIG. 20D), and/or by peeling where one or more of the contacted bodies is flexible (FIG. 20B or C). In an embodiment, the transfer device comprises an elastomeric layer and at least one other material.

As used herein, transfer of "substantially all" the features in contact with the transfer surface refers to at least 90%, at least 95% and at least 99% of the features in contact with the transfer surface are transferred.

A "multi-layered feature" refers to sequential printing of features onto a receiving surface so that a first printed layer corresponds to features on a first donor surface and a second printed layer corresponds to a second donor surface. Alternatively, the donor surfaces can be identical, and instead the transfer devices contacts different donor surface locations.

A "substantially constant peeling rate" and a "substantially constant separation rate" are used synonymously and refer to the rate of surface-feature separation that does not significantly vary over the separation or peeling time. "Substantially constant" refers to a rate that does not vary by more than 2% relative to the average separation and/or peeling rate during the separation and/or peel time, including variation of less than 1%.

"Printable" relates to materials, structures, device components and/or integrated functional devices that are capable of transfer, assembly, patterning, organizing and/or integrating onto or into substrates, via printing techniques including but not limited to, contact printing and solution printing.

"Printable semiconductor elements" of the present invention comprise semiconductor structures that are able to be assembled and/or integrated onto substrate surfaces, for example using by dry transfer contact printing and/or solution printing methods. In one embodiment, printable semiconductor elements of the present invention are unitary single crystalline, polycrystalline or microcrystalline inorganic semiconductor structures. In one embodiment, printable semiconductor elements are connected to a substrate, such as a mother wafer, via one or more bridge elements. In this context of this description, a unitary structure is a monolithic element having features that are mechanically connected. Semiconductor elements of the present invention may be undoped or doped, may have a selected spatial distribution of dopants and may be doped with a plurality of different dopant materials, including P and N type dopants. The present invention includes microstructured printable semiconductor elements having at least one cross sectional dimension greater than or equal to about 1 micron and nanostructured printable semiconductor elements having at least one cross sectional dimension less than or equal to about 1 micron. Printable semiconductor elements useful in many applications comprises elements derived from "top down" processing of high purity bulk materials, such as high purity crystalline semiconductor wafers generated using conventional high temperature processing techniques. In one embodiment, printable semiconductor elements of the present invention comprise composite structures having a semiconductor operational connected to at least one additional device component or structure, such as a conducting layer, dielectric layer, electrode, additional semiconductor structure or any combination of these. In one embodiment, printable semiconductor elements of the present invention comprise stretchable semiconductor elements and/or heterogeneous semiconductor elements.

"Supported by a substrate" refers to a structure that is present at least partially on a substrate surface or present at least partially on one or more intermediate structures positioned between the structure and the substrate surface. The term "supported by a substrate" may also refer to structures partially or fully embedded in a substrate.

"Semiconductor" refers to any material that is a material that is an insulator at a very low temperature, but which has a appreciable electrical conductivity at a temperatures of about 300 Kelvin. In the present description, use of the term semiconductor is intended to be consistent with use of this term in the art of microelectronics and electrical devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $Pbl_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electrical properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electrical properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Conformal contact" refers to contact established between surfaces, coated surfaces, and/or surfaces having materials deposited thereon which may be useful for transferring, assembling, organizing and integrating structures (such as printable semiconductor elements) on a substrate surface, such as a receiving substrate surface. In one aspect, conformal contact involves a macroscopic adaptation of one or more contact surfaces of an elastomeric transfer device to the overall shape of a substrate surface. In another aspect, conformal contact involves a microscopic adaptation of one or more contact surfaces of an elastomeric transfer device to a substrate surface leading to an intimate contact with out voids. The term conformal contact is intended to be consistent with use of this term in the art of soft lithography. Conformal contact may be established between one or more bare contact surfaces of an elastomeric transfer device and a substrate surface. Alternatively, conformal contact may be established between one or more coated contact surfaces, for example contact surfaces having a transfer material, printable semiconductor element, device component, and/or device deposited thereon, of an elastomeric transfer device and a substrate surface. Alternatively, conformal contact may be established between one or more bare or coated contact surfaces of an elastomeric transfer device and a substrate surface coated with a material such as a transfer material, solid photoresist layer, prepolymer layer, liquid, thin film or fluid "Placement accuracy" refers to the ability of a transfer method or device to transfer a printable element, such as a printable semiconductor element, to a selected position, either relative to the position of other device components, such as electrodes, or relative to a selected region of a receiving surface. "Good placement" accuracy refers to methods and devices capable of transferring a printable element to a selected position relative to another device or device component or relative to a selected region of a receiving surface with spatial deviations from the absolutely correct position less than or equal to 50 microns, more preferably less than or equal to 20 microns for some applications and even more preferably less than or equal to 5 microns for some applications. The present invention provides devices comprising at least one printable element transferred with good placement accuracy.

"Fidelity" refers to a measure of how well a selected pattern of elements, such as a pattern of printable semiconductor elements, is transferred to a receiving surface of a substrate. Good fidelity refers to transfer of a selected pattern of elements wherein the relative positions and orientations of individual elements are preserved during transfer, for example wherein spatial deviations of individual elements from their positions in the selected pattern are less than or equal to 500 nanometers, more preferably less than or equal to 100 nanometers.

"Young's modulus" is a mechanical property of a material, device or layer which refers to the ratio of stress to strain for a given substance. Young's modulus may be provided by the expression;

$$E = \frac{(\text{stress})}{(\text{strain})} \quad \text{(II)}$$
$$= \left(\frac{L_0}{\Delta L} \times \frac{F}{A}\right);$$

wherein E is Young's modulus, $L_0$ is the equilibrium length, $\Delta L$ is the length change under the applied stress, F is the force applied and A is the area over which the force is applied. In an embodiment, Young's modulus varies with stress. Young's modulus may also be expressed in terms of Lame constants via the equation:

$$E = \frac{\mu(3\lambda + 2\mu)}{\lambda + \mu}; \quad \text{(III)}$$

wherein $\lambda$ and $\mu$ are Lame constants. High Young's modulus (or "high modulus") and low Young's modulus (or "low modulus") are relative descriptors of the magnitude of Young's modulus in a give material, layer or device. In the present invention, a high Young's modulus is larger than a low Young's modulus, preferably about 10 times larger for some applications, more preferably about 100 times larger for other applications and even more preferably about 1000 times larger for yet other applications.

"Polymer" refers to a molecule comprising a plurality of repeating chemical groups, typically referred to as monomers. Polymers are often characterized by high molecular masses. Polymers useable in the present invention may be organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

In the context of this description, the expressions "registered transfer", "registered assembly" and "registered integration" refer to concerted processes that maintain the relative spatial orientation of transferred elements, preferably to with about 50% and more preferably for some application to within about 1%. Registered processes of the present invention may also refer to the ability of methods of the present invention to transfer, assemble and/or integrate printable semiconductor elements to specific regions of a receiving substrate preselected to within 100 microns and preferably for some embodiments to with 50 nanometers Bridge elements are alignment maintaining elements which connect a feature, such as printable semiconductor elements, to a donor substrate, such as a semiconductor wafer. In one embodiment, a bridge element is a partially or fully undercut structure that connects one or more ends of the feature to a donor substrate. In another embodiment, a bridge element connects the bottom of a feature to the donor substrate. Bridge elements are useful for maintaining selected orientations and/or positions of features, such as printable semiconductor elements, during transfer, assembly and/or integration processing steps. Bridge elements are also useful for maintaining relative positions and orientations of a pattern or array of features, such as printable semiconductor elements, during transfer, assembly and/or integration processing steps. In methods of the present invention, bridge elements preserve the positions and spatial orientations of features, such as printable semiconductor elements, during contact, bonding and transfer processes involving a contact surface of a transfer device, such as a conformable elastomeric stamp, thereby enabling registered transfer from a mother wafer to the transfer device. Bridge elements in this aspect of the present invention are capable of disengaging from the printable semiconductor elements without significantly changing the positions and orientations of the printable semiconductor elements upon contact and/or movement of the transfer device. Disengagement is typically achieved by fracture of the bridge elements during contact and/or movement of the transfer device.

In the following description, numerous specific details of the devices, device components and methods of the present invention are set forth in order to provide a thorough explanation of the precise nature of the invention. It will be apparent, however, to those of skill in the art that the invention can be practiced without these specific details.

This invention provides methods for transferring features, including micropatterns, nanopatterns and a combination of micro and nanopatterns. The present invention provides methods of patterning by elastomeric stamping, to provide relief and/or recess features directly to a surface. The viscoelastic nature of the surface material on the transfer device leads to a separation force (i.e. the force that can lift objects from a surface) that depends on separation rate. In one useful embodiment, at high separation rates, this force is large enough to remove objects from a substrate and transfer them onto a transfer device, even when the static surface energy of the transfer device is lower than that of the substrate. At low separation rates, this separation force is low. Contacting a transfer device that supports an array of objects against a final substrate and then separating the element away slowly leads to the transfer of these objects from the transfer device to the substrate. The process of controlled separation rates for transfer printing disclosed herein can be used in combination with other transfer approaches, including those transfer approaches described in U.S. patent application Ser. No. 11/145,574 filed Jun. 2, 2005, hereby incorporated by reference.

FIG. 1 schematically illustrates a process for transfer printing solid objects from one substrate to another. FIG. 1A illustrates the start of the process wherein the donor substrate 20 that supports fully formed, organized arrays of solid objects ("features" 40) (for example, devices, materials, elements, biological entities, etc.) is prepared. The donor substrate can be prepared using top-down fabrication, bottom-up growth, self-assembly or other means. Contacting a soft elastomeric transfer device (stamp) 10 against these solid objects leads to conformal contact, driven by generalized adhesion forces that are typically dominated by van derWaals interactions. The adhesion between the features 40 and the transfer surface 15 is rate-sensitive (that is, kinetically controllable) owing to the viscoelastic behavior of the elastomer separating the transfer device 10 from the donor substrate 20 with sufficiently high separation velocity (typically about 10 cm/s or faster for the systems presented herein) leads to adhesion that is sufficient to adhere preferentially the features 40 to the surface 15 of the transfer device 10, lifting them off the donor substrate surface 25 (FIG. 1B). The transfer device 10, now 'inked' with these features 40, is brought into contact with a receiving (device) substrate 30 (FIG. 1C). Removing the transfer device 10 with sufficiently low separation velocity (about 1 mm/s or slower) causes the features 40 to adhere preferentially to the receiving substrate surface 35 and separate from the transfer surface 15 (FIG. 1D). The transfer can be carried out uniformly with a flat stamp or with a structured element that contacts and transfers only some set of objects from the donor substrate. The embodiment illustrated in FIG. 1 depicts the flat surfaces (when the surfaces are unstressed). As discussed herein below, however, any of the transfer surface 15, donor surface 25, and receiving surface 35 can be curved (see FIG. 20D).

The physics that governs the kinetic dependence of the adhesion process has its origin in the viscoelastic response of the elastomeric stamp. We performed rolling experiments to yield quantitative information on this dependence for the case of a commercially available polydimethylsiloxane (PDMS) rubber (Sylgard® 184, DowCorning). A slab of PDMS (Dow- Sylgard 184) is cast between two 200 mm silicon wafers separated by about 7 mm using PDMS spacers and cured at 65° C. The wafers are treated with (tridecafluoro-1,1,2,2-tetrahydrooctyl)-1-trichlorosilane (United Chemical Technologies) for 1 h in a vacuum desiccator to facilitate the removal of the PDMS slab. The slab is placed against a sturdy inclined glass plate, the inclination of which is measured relative to a level countertop. A steel cylinder (McMaster-Carr, diameter 12.7 mm, length 75.5 mm, 75.2 g) is placed at the top of the slab and allowed to roll. The slab is cleaned with a lint roller (3M) between successive roll tests. Rolling speed is measured with a ruler and a stopwatch. Video footage is captured and analyzed to confirm that the cylinder rolled against the slab at a constant speed.

Figure 2:
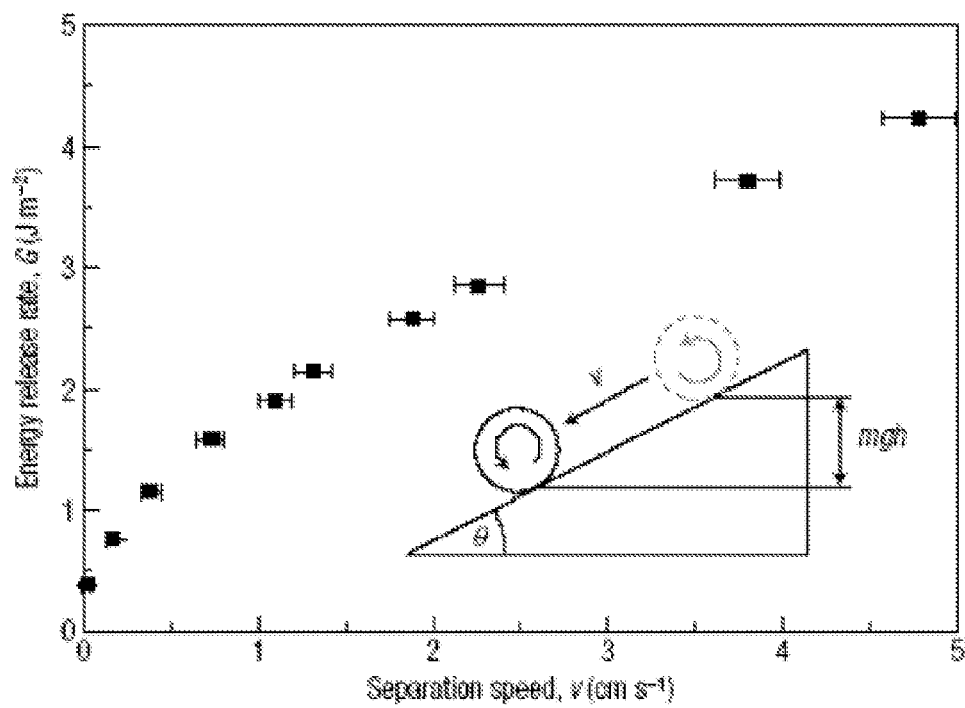
FIG. 2 graphically illustrates the rate dependence of stamp adhesion by evaluating the speed at which a steel cylinder rolls down an inclined slab of polydimethylsiloxane (PDMS) (see inset). The graph is a plot of the separation energy, or the Energy Release Rate G (J/m$^2$) as a function of Separation speed, v (cm/s). Separation speed is varied by changing the inclination angle of the PDMS slab, and the corresponding G is calculated by the loss of the cylinder's gravitational potential energy. G varies by more than an order of magnitude across the range of speeds measured in this demonstration. Consequently, transfer elements of PDMS adhere more strongly or weakly to printable features depending upon the speed separation. Appropriate separation speed ranges for retrieval and release of specific features from transfer elements in specific systems may be in principle be calculated by detailed modeling, but in practice, retrieval and release speed ranges are determined experimentally.

In these experiments, a steel cylinder rolling down an inclined slab of PDMS rubber reaches a terminal velocity, where gravity works to separate the steel from the PDMS at the trailing edge of the contact region. The loss in gravitational potential is taken as the adhesion energy hysteresis (the difference between the work required to separate the steel from the PDMS and the energy evolved at the advancing contact edge) at the measured rolling or separation speed v. The energy associated with the advancing contact area at the front of the rolling cylinder is typically small, so the adhesion energy hysteresis is taken as the separation energy, or the energy release rate, G. FIG. 2 shows the dependence of G on v. For the range of speeds measured here (0.02 to 4.8 cm/s), the energy release rate varies by more than an order of magnitude.

Pick-up and printing efficiencies in transfer-printing experiments follow a similar trend qualitatively. When a PDMS stamp delaminates slowly from a substrate that supports microstructures, the separation energy $G_{PDMS}$ for the elastomer-microstructure interface is smaller than its counterpart $G_{substrate}$ for the interface between the microstructures and the substrate. Consequently the elastomer-microstructure interface breaks more easily than the microstructure-substrate interface. However, the separation energy $G_{PDMS}$ depends strongly on the speed of delamination (or "separation rate"), v (see, for example, FIG. 2) owing to the viscous behavior of PDMS. The separation energy and speed of delamination can be expressed as:

$$G_{PDMS} = G_0[1 + \phi(v)]$$

where $\phi$ is an increasing function of v and $G_0$ is a constant.

In contrast, the separation energy for the microstructure-substrate interface $G_{substrate}$ is typically independent of rate. As the speed of delamination increases, $G_{PDMS}$ increases relative to $G_{substrate}$ until the elastomer-microstructure interface becomes strong enough to break the microstructure-substrate interface. Determining which interface fails depends on the geometry of the microstructures and can be established by energy-based arguments similar to those used to compare competing fracture modes in layered materials. Geometrical design considerations can be useful in guiding the transfer of microstructures, for example by providing stress concentration zones to facilitate controlled fracture or by engineering contact zone areas to alter levels of adhesion. A key concept for the transfer-printing criteria is the strongly rate-dependent separation energy of solid objects from an elastomer and the rate-independent separation of solid objects from a substrate interface.

Figure 3A:
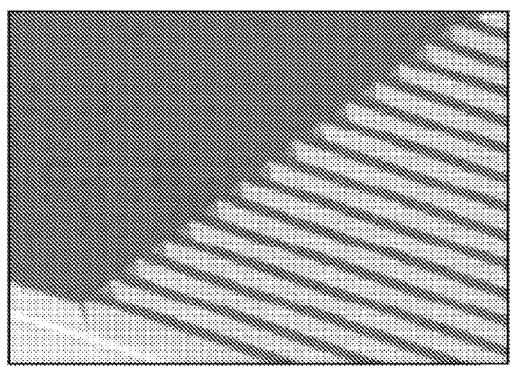
FIG. 3 provides photographs illustrating the effect of slow (FIG. 3A) and fast removal (FIG. 3B) of a PDMS stamp from micromachined silicon beams. Slow removal of a PDMS leaves the features intact (FIG. 3A) but the much higher adhesive force associated with fast (about 10 cm/s) stamp removal cleanly breaks the features from their anchor (FIG. 3B).
Figure 3B:
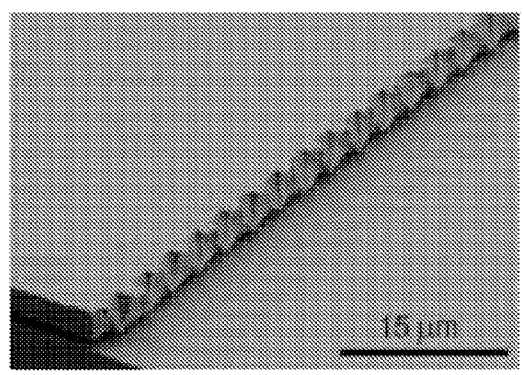

FIG. 3 provides an example of a feature that can be transferred from a donor substrate to a stamp. FIG. 3A shows freestanding silicon beams micromachined from a silicon-on-insulator (SOI) wafer, connected to an unetched part of the wafer that anchors their ends. Application and slow removal of a stamp from these robust, freestanding structures leaves them intact (FIG. 3A). Fast removal, however, fractures them cleanly at their ends (FIG. 3B) and leaves them adhered to the stamp. The stamp, thus 'inked' with the silicon beams, can transfer those beams by contact to and slow removal from a receiving substrate.

Figure 22:
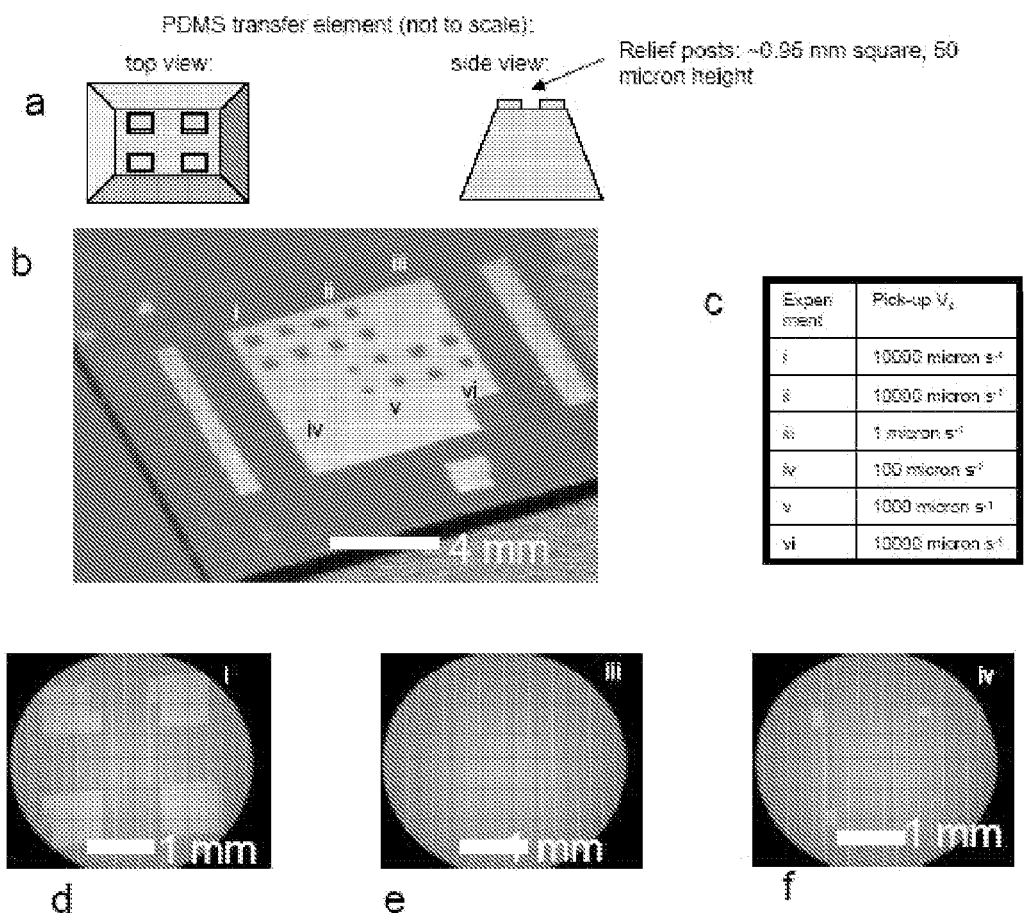
FIG. 22 demonstrates the influence of separation rate on the efficiency of retrieval of silicon features from a donor substrate using the actuator stage shown in FIG. 21 (a).
Figure 23:
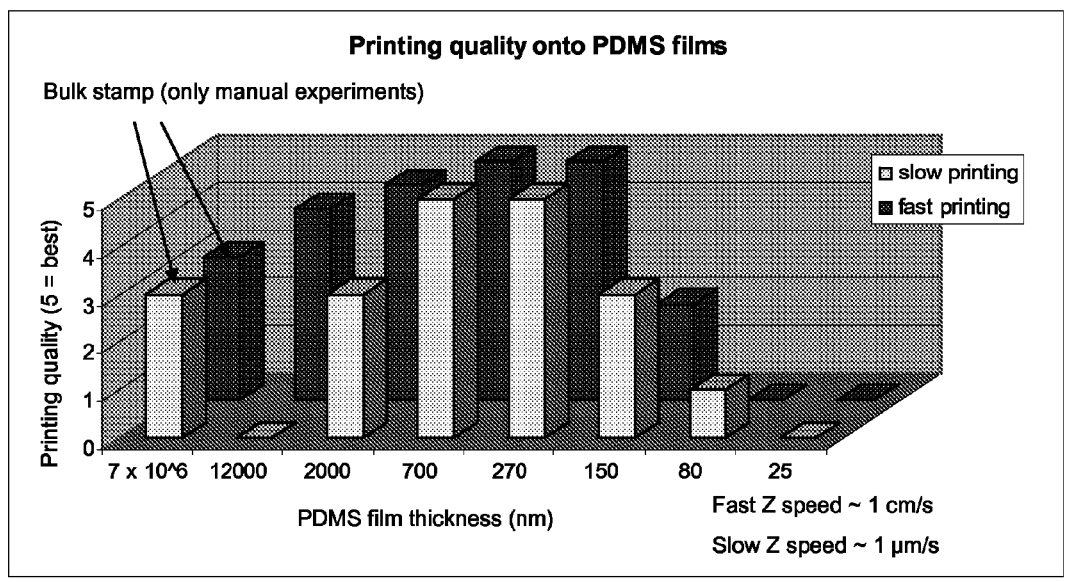
FIG. 23 demonstrates the effects of separation speed on the printing efficiency or quality of printing silicon features from a PDMS transfer element, as depicted in FIG. 22 (a) onto a silicon wafer coated with thin films of PDMS of various thicknesses. Printing quality is measured by the approximate fraction of microstructures transferred to the thin PDMS films on a scale from 0 to 5 (0: <1%; 1: 1% to 10%; 2: 11% to 50%; 3: 51% to 90%; 4: 91% to 99%; 5: >99%). The panels in B are micrographs showing printing efficiency associated with quality scale 0, 1, 2, 3, 4, 4.5, and 5.
Figure 23:
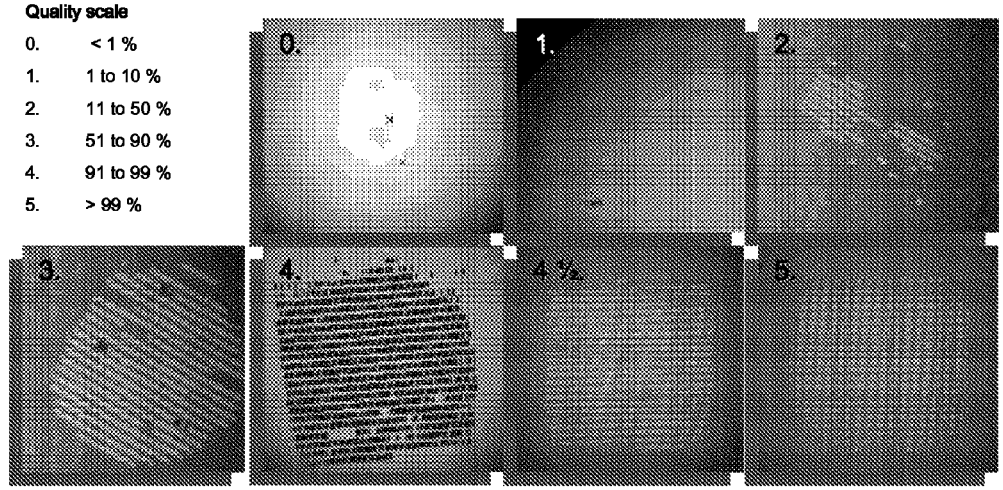
Figure 24:
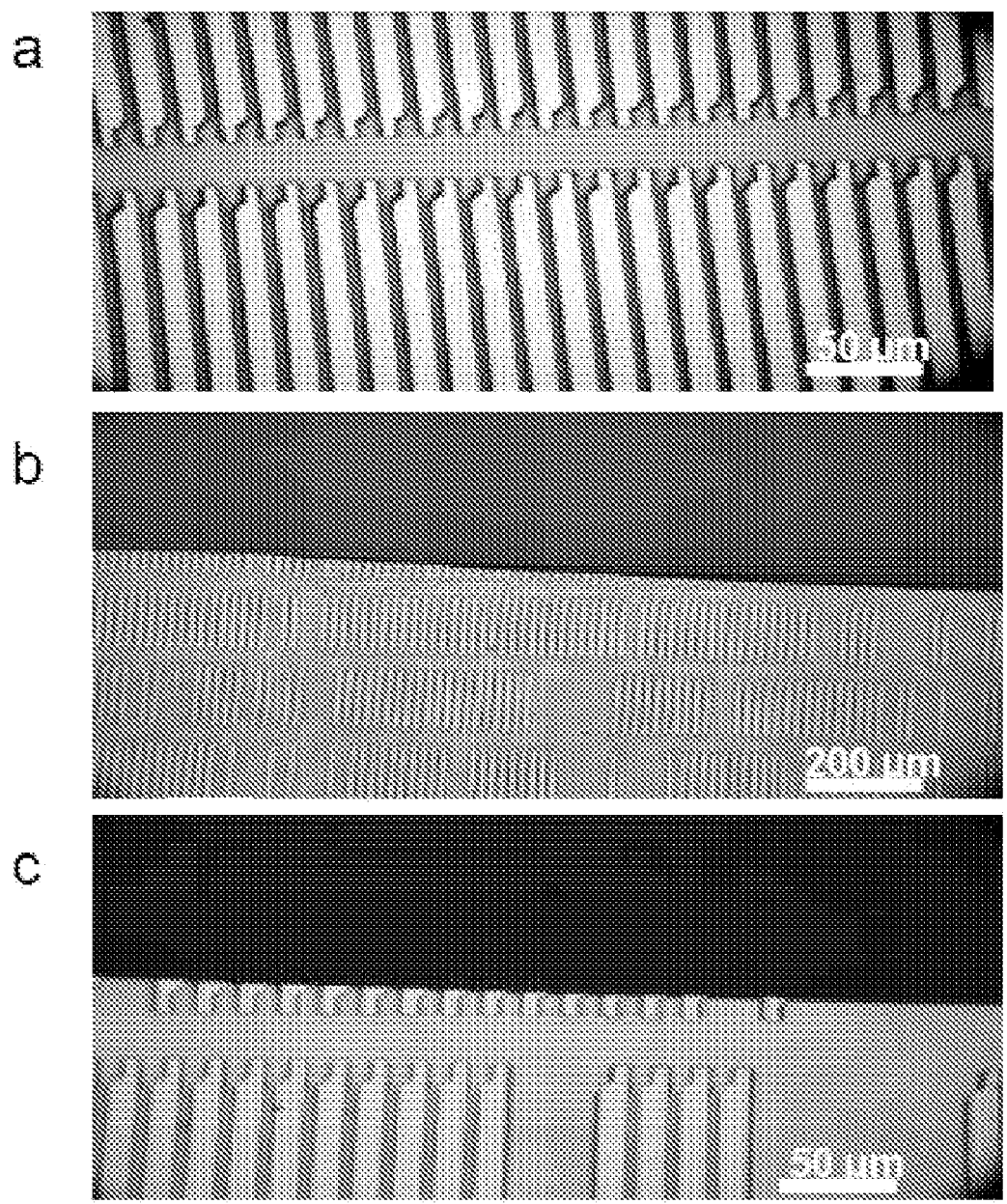
FIG. 24 shows micrographs of semiconductor (Si) features printed onto substrates using spin-on glass as a smoothing layer to facilitate transfer onto a receiving substrate. The smoothing layer allows (a) transfer with good efficiency and (b), (c) strong adhesion to the receiving substrate after suitable annealing. The micrographs in (b) and (c) show features transferred onto a silicon wafer coated with spin-on glass after annealing for several hours at 300° C. and subsequent breaking of the silicon wafer. The silicon features fracture along the same line as the fracture edge of the wafer, indicating robust binding between the wafer and the silicon features.
Figure 25:
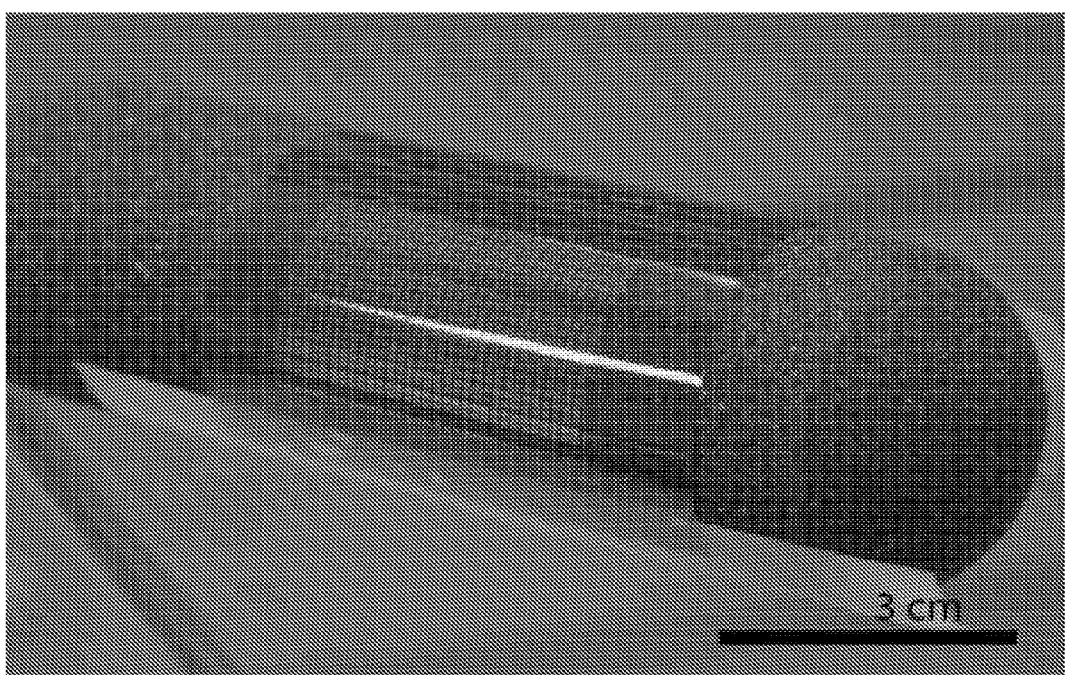
FIG. 25 shows a picture of a transfer element composed of a thin kapton backing coated with a thin layer of PDMS. The transfer element is used in a roller configuration by wrapping it around a foam paint roller. The transfer element has on it silicon features retrieved from a donor substrate.
Figure 26:
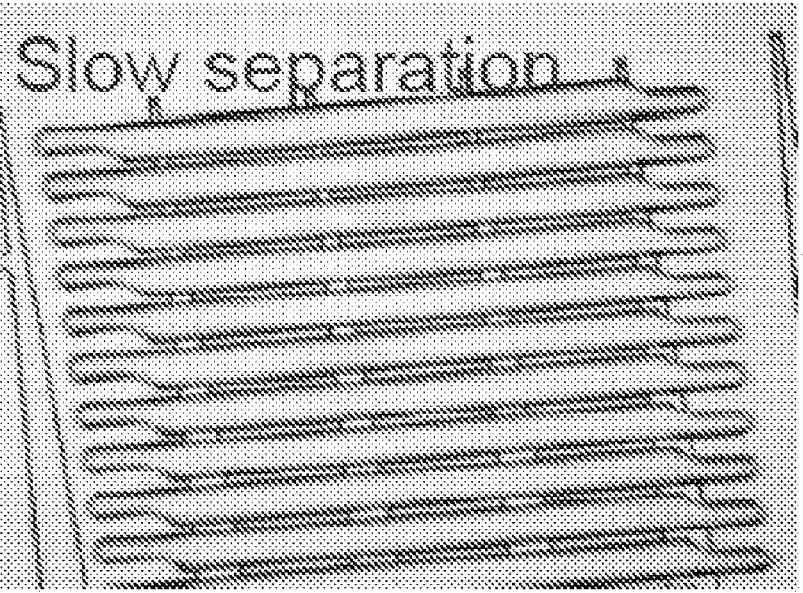
FIG. 26 demonstrates the ability to print a semiconductor feature onto a receiving substrate using a transfer element and a given separation rate (slow in this case) and to subsequently remove that feature using the same transfer element but with a different separation rate (in this case fast). (a) shows silicon features printed onto a topographically relief-structured silicon receiving substrate from a PDMS transfer element using slow (about 1 mm/s) separation speeds. (b) shows the same silicon topographically relief-structured silicon substrate after the printed silicon features have been removed using the same PDMS transfer element with a fast separation speed (greater than 10 cm/s).
Figure 26:
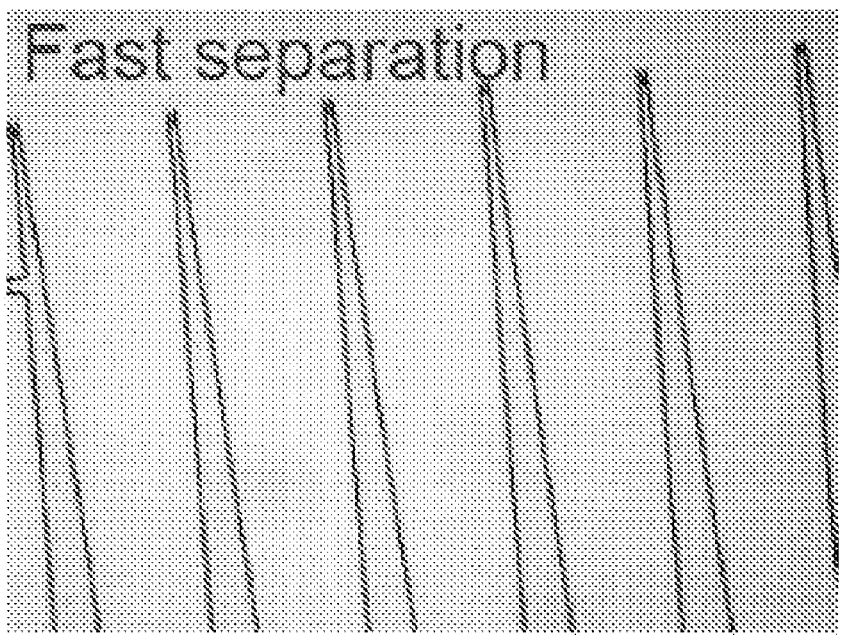
Figure 27:
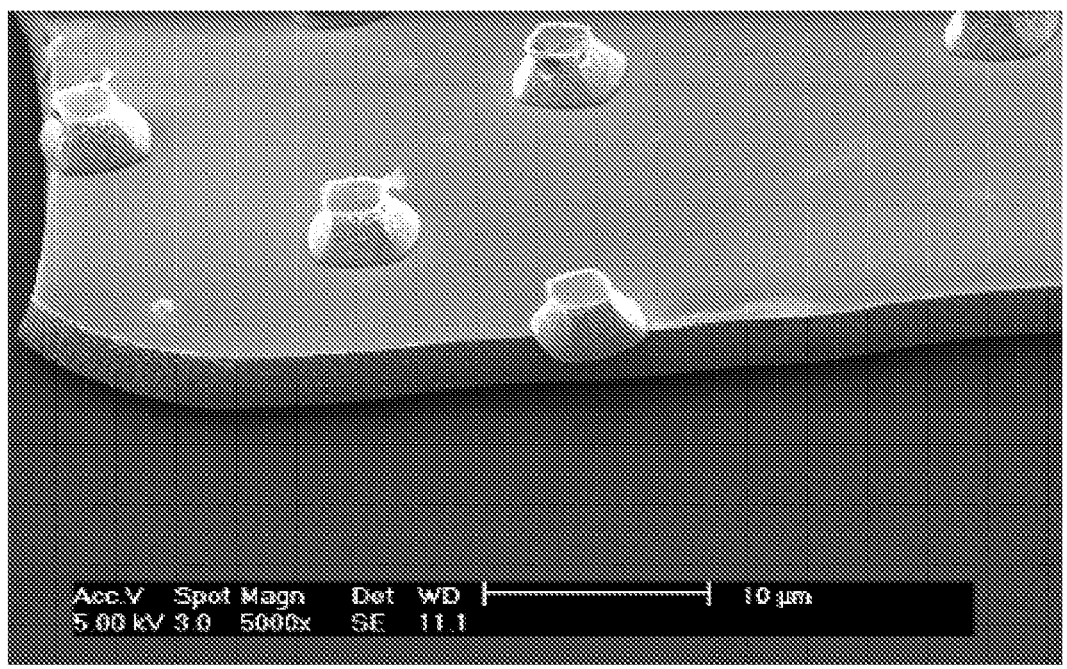
FIG. 27 shows silicon features (hut-shaped) printed onto silicon by means of a Scotch® tape transfer element and slow separation speeds.

The effect of separation speed on efficiency of feature removal is shown in FIGS. 22 and 23. At a higher separation speed, more features are removed (compare FIG. 22*d-f*). FIG. 23A also illustrates the effect of the thickness of an elastomer layer or film (in this case PDMS) on printing efficiency

EXAMPLE 1

Transfer Printing onto Semiconductor Wafers

Figure 4:
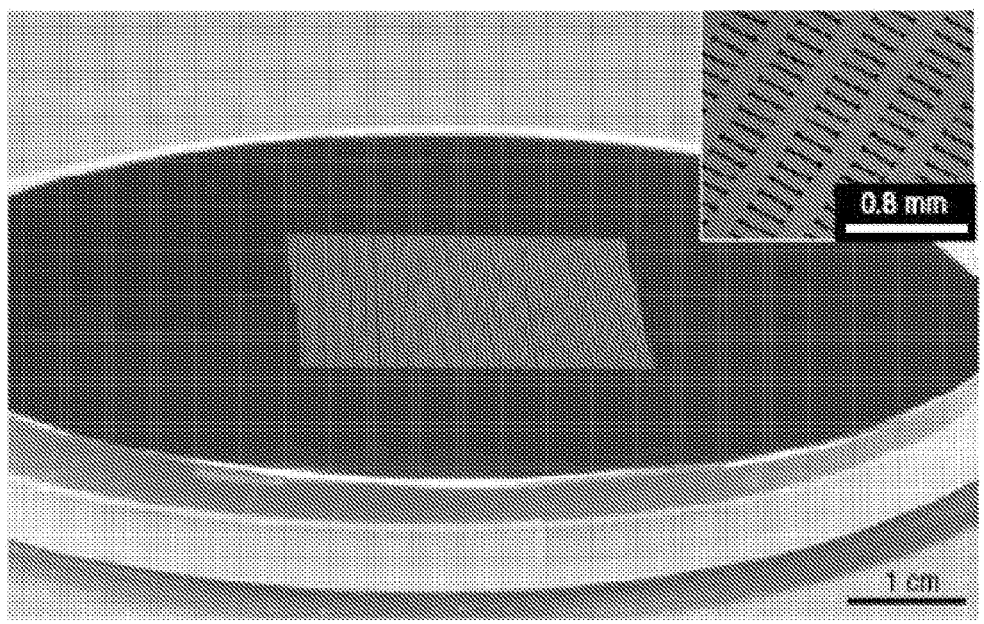
FIG. 4 is an image of a 30 mm×38 mm array of about 24,000 silicon microstructures printed onto a 100-mm GaAs wafer by a corresponding "inked" PDMS stamp. The inset is an SEM image of a portion of the wafer. Analysis of the SEM images indicate that fewer than 100 microstructures are missing from the printed array.

The present invention encompasses methods that transfer prints a plurality of structures from a donor substrate surface to a receiving substrate surface. For example, FIG. 4 shows a 30 mm×38 mm GaAs wafer printed with an array of I-shaped silicon microstructures (see inset) by a single elastomeric stamp. In a single step, an inked elastomeric stamp prints the pattern in ambient conditions directly onto a 100-mm GaAs wafer. This array contains about 24,000 microstructures; the yield of the entire process, including micromachining, pick-up and printing, is more than 99.5% (corresponding to fewer than 100 microstructures missing from the array). Particles on the surface of the receiving substrate are typically the most significant cause of defects. With care, including careful processing and handling of the receiving substrate, printing efficiency can approach 100%.

Figure 5:
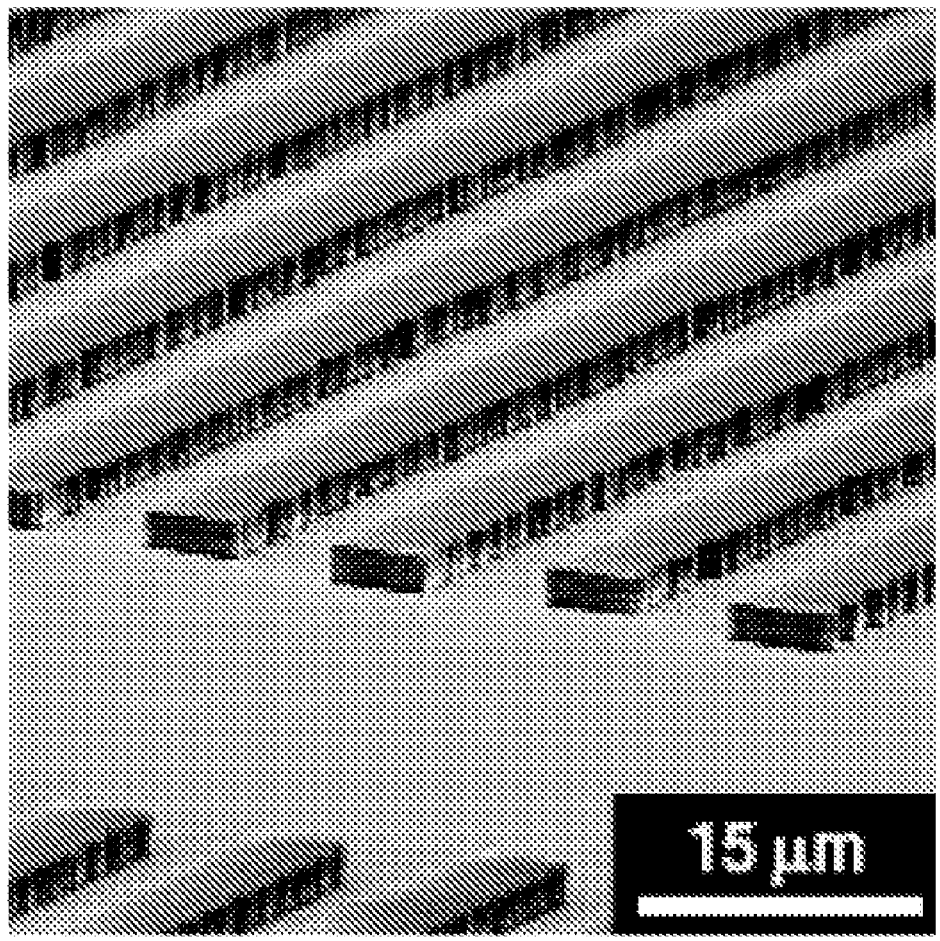
FIG. 5 is an SEM image of GaN ribbons printed onto a silicon (100) wafer using the process of the present invention.

Unlike wafer-bonding approaches to semiconductor materials integration, the printing processes disclosed herein have the potential for area multiplication, where a single donor substrate of a given area supplies microstructures to several receiving substrates of the same area or a single receiving substrate with a substantially larger area. This capability is important when the printed material is costly and where large-area, sparse coverage is desired. GaN microstructures (prepared as described hereinbelow) and printed onto silicon (100), as shown in FIG. 5, is an example of one of these systems.

Figure 6:
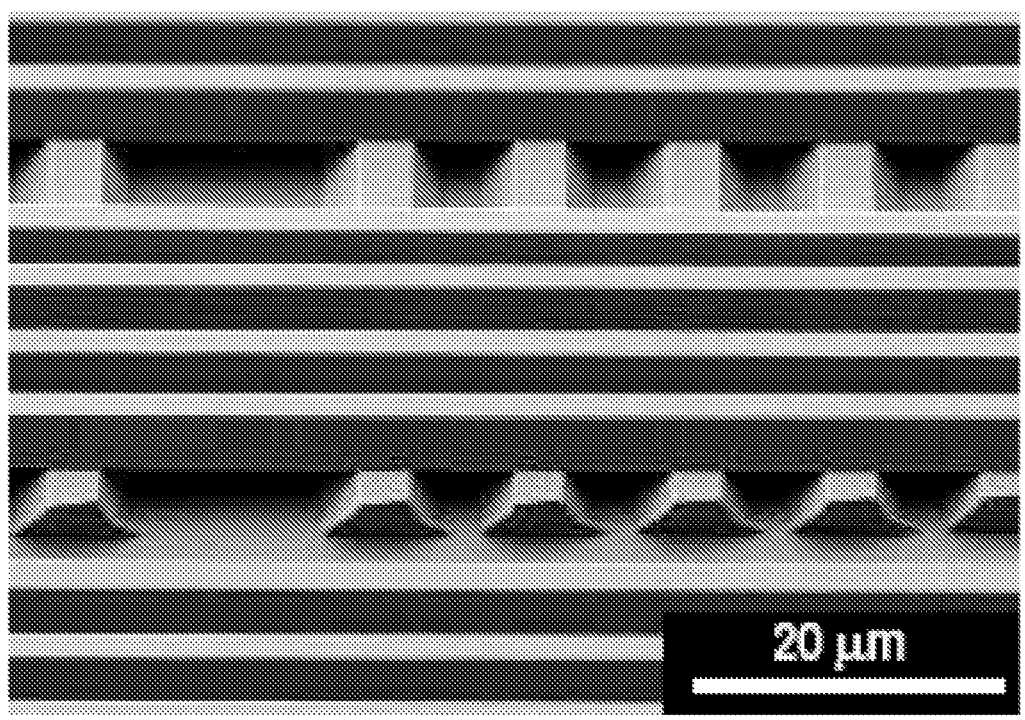
FIG. 6 is an SEM image of a multi-layer assembly generated by repeated printing of silicon features onto a silicon wafer.
Figure 7:
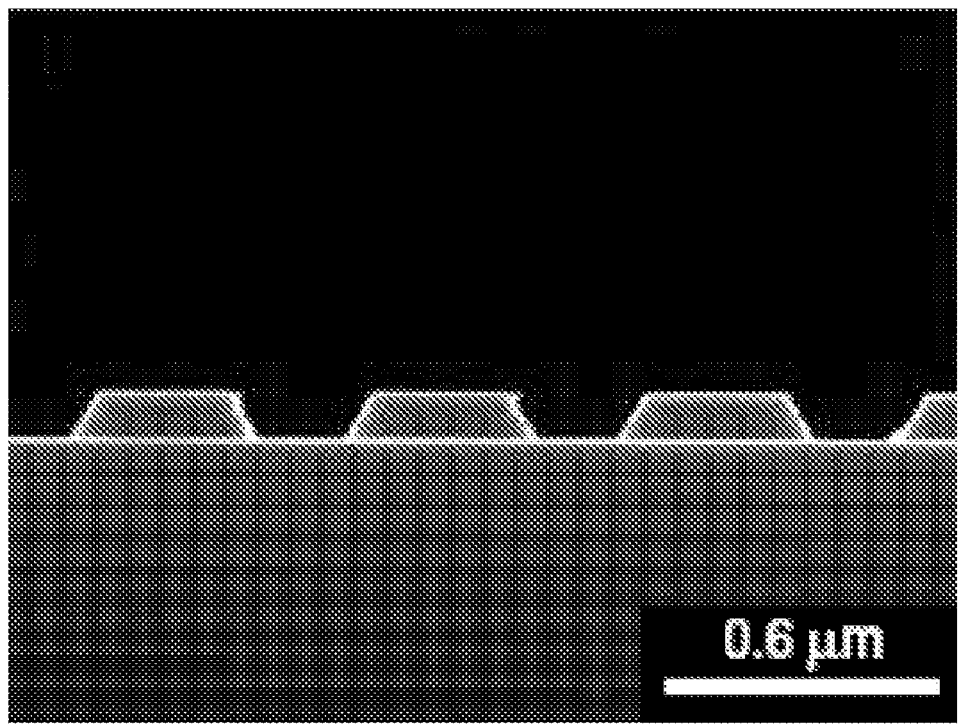
FIG. 7 is an SEM image of p-type silicon features printed onto InP substrate.

As the transfer process is purely additive, an embodiment of the present invention encompasses repeated printing. Such repeated printing steps, results in easy fabrication of large-area or even multilayer assemblies (FIG. 6) with few processing steps, and can be used in a variety of applications including, but not limited to, applications such as photonic bandgap materials or multilayer electronic systems. The techniques disclosed herein can print objects with a wide range of shapes and sizes onto virtually any smooth substrate. For example, FIG. 7 shows submicrometer (0.3 μm×20 μm×0.1 μm) silicon structures printed onto InP using the present invention. The ability of the present invention to deposit nanostructures and/or microstructures having scale on the order of nanometers and/or micrometers indicate that stamp-based transfer printing is useful for the production of device-scale or smaller objects.

Figure 8:
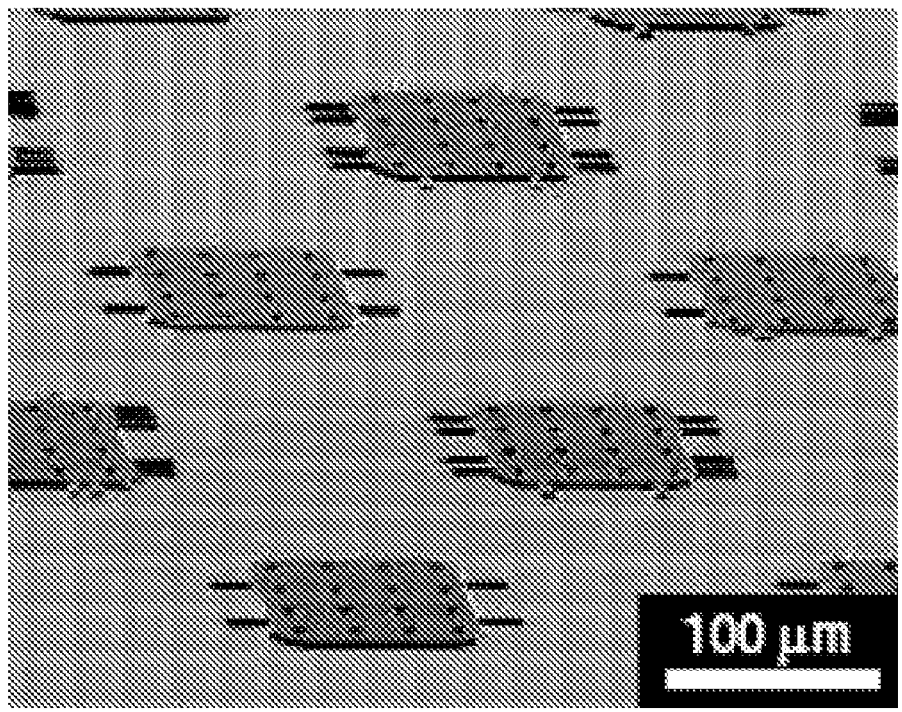
FIG. 8 is an SEM image of n-type silicon features printed onto p-type silicon substrate.
Figure 9:
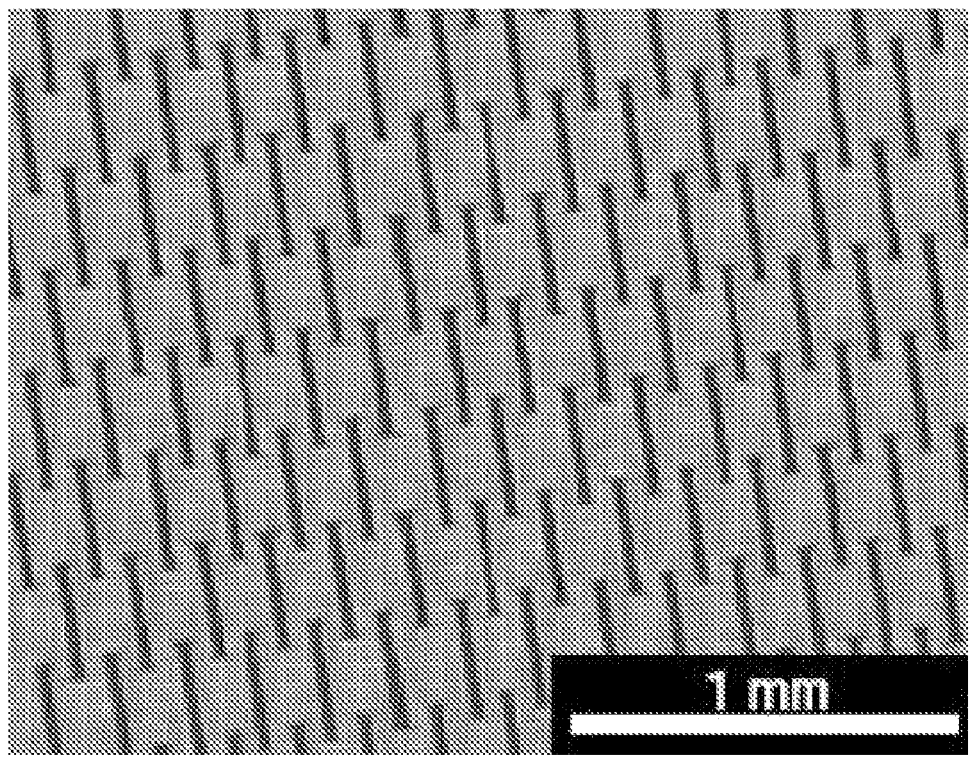
FIG. 9 is an image of silicon structures printed onto a translucent hydrophilic (MgO) substrate.

The invention encompasses printing larger sizes (e.g. 100 μm×100 μm×2.5 μm). Such printing size is useful for structures to support elaborate circuits (FIG. 8). Yields for printing large objects are generally lower than for small objects, as a single asperity between a printed object and receiving substrate can impede transfer. Nevertheless, yields of 95% or better are achievable for all of the wafer-generated geometries presented herein when the receiving substrate is smooth, even when the printing is performed outside a cleanroom environment. Substrates with surface roughness of less than about 3 nm over 1 μm$^2$ can function as effective surfaces for receiving structures from an elastomeric stamp, largely independent of chemical composition or surface energy. For example, silicon microstructures can reliably transfer onto either hydrophilic surfaces, such as $SiO_2$, NaCl and MgO (FIG. 9), or hydrophobic surfaces including, but not limited to, polystyrene or silicon freshly stripped of its native oxide. As surface roughness increases beyond 3 nm over 1 μm$^2$, yields generally decrease.

Figure 10:
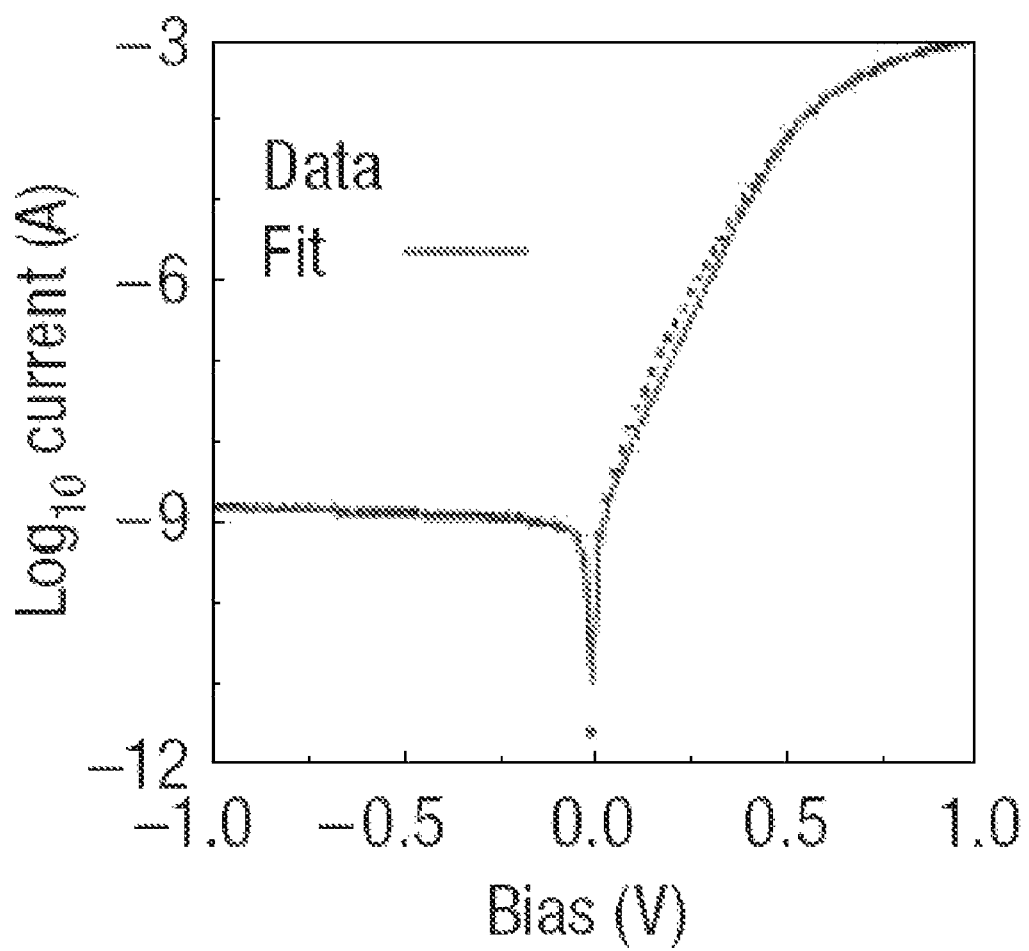
FIG. 10 is a plot of current (amps) against bias (volts) for n-type silicon features printed directly onto a p-type silicon wafer by the present invention. Such printing followed by annealing forms p-n junctions that can carry 6.7 amps/cm$^2$ at a forward bias of 1 volt. The line is a best-fit to the experimentally obtained data points.

The present invention provides reliable printing without the use of conventional adhesives or specialized surface chemistries. This is important in the context of wafer-based microstructure printing because it allows moderate-to-high-temperature processing (~150° C. and above) and good electrical contact between the printed structure and the receiving substrate. Printed p-n junctions formed by transferring n-type silicon microstructures to a p-type silicon substrate (FIG. 10) exploit both of these features. Annealing and metallization of the junction produces a rectifying device with characteristics reasonably well described by a fit for a monolithic p-n junction as the applied bias sweeps from −1 to 1 V (FIG. 10). The fit in FIG. 10 is characteristic of a diode with an ideality factor of 1.7 and a reverse saturation current of 0.9 nA shunted with a 2 GΩ resistor and in series with a 400Ω resistor. At 1 V bias, this printed junction supports a current of about 6.7 A cm$^{-2}$.

EXAMPLE 2

Transfer Printing of Sheet-Like Geometries

Figure 11:
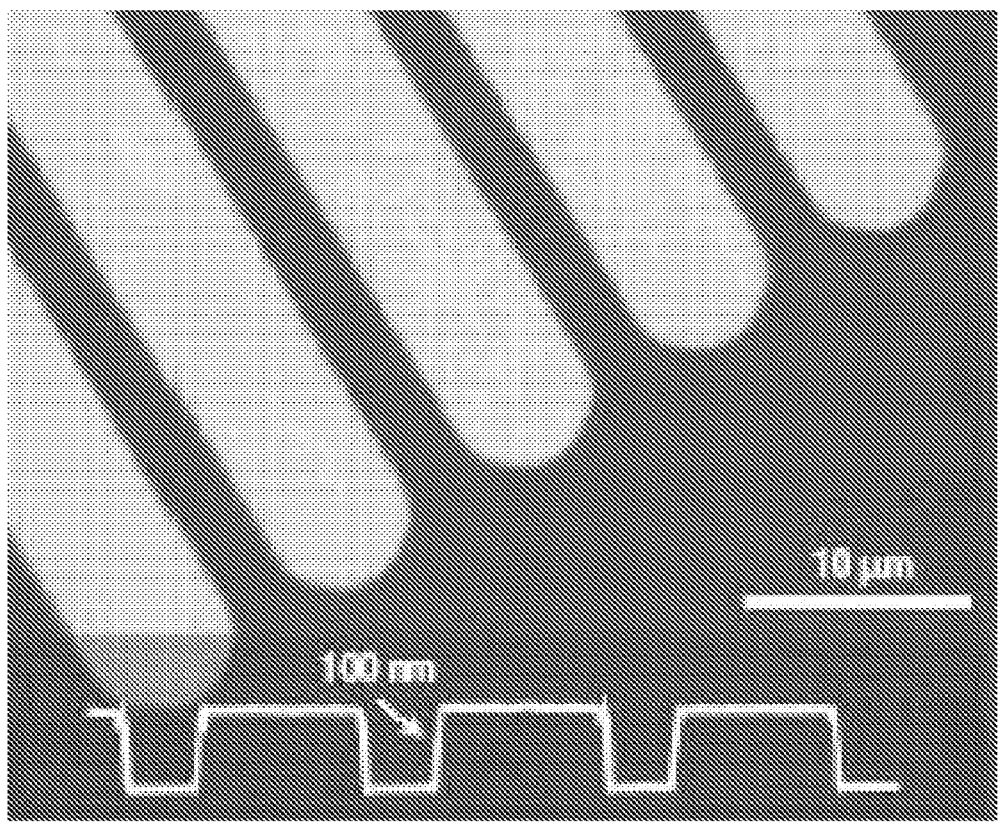
FIG. 11 is an image of 100-nm-thick muscovite (grade V-1 mica) ribbons cleaved at high separation rates from a mica substrate with a PDMS stamp, and then transfer-printed onto SiO$_2$ (blue) at a low separation rate. The inset profile outlines an AFM line trace of the structures printed onto SiO$_2$.
Figure 12:
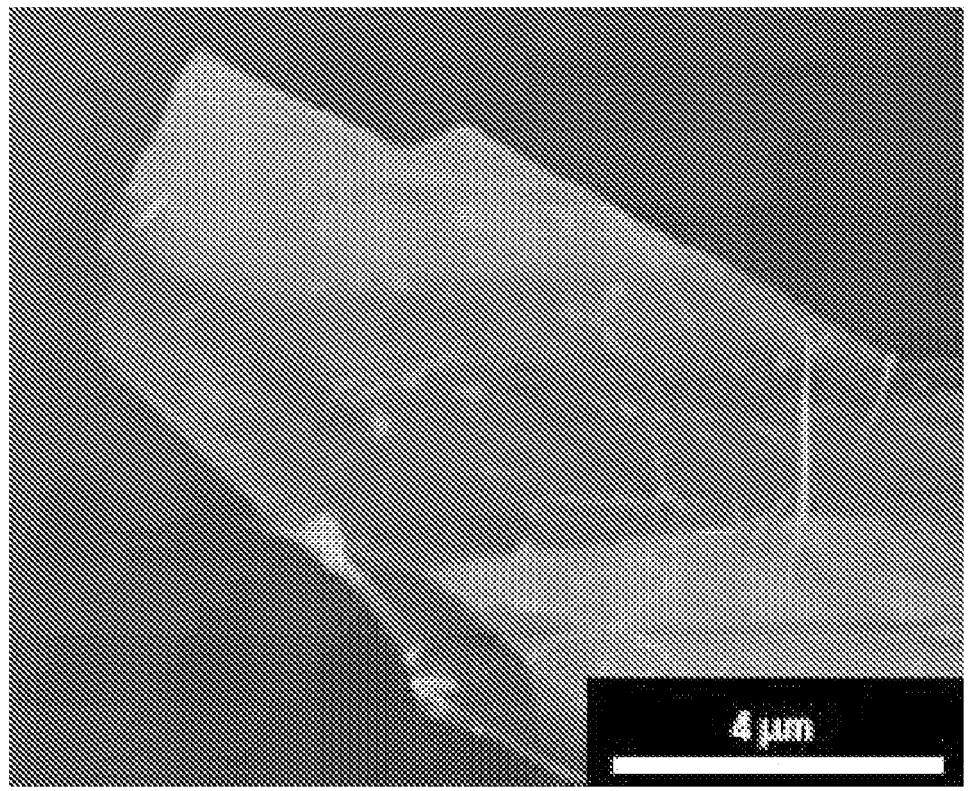
FIG. 12 is an image of a graphite sheet, ranging from less than about 3 to 12 nm thick, cleaved from a highly ordered pyrolytic graphite substrate and printed onto SiO$_2$ with a stamp using low separation rates.

The strong adhesion of features to the stamp at high separation rates is essential to achieve reliable, high-yield printing of the classes of objects illustrated in Example 1. This adhesion can be sufficiently strong, in fact, to remove material structures that are ionically bonded to the donor substrate along their entire lengths. FIG. 11 shows, as an example, a pattern of thin high-quality muscovite (grade V-1 mica) printed by removing a stamp in contact with the mica at sufficiently high separation rates to cleave patterned ribbons from a donor substrate of bulk mica. PDMS stamps can also cleave sheets from unpatterned grade V-1 mica or graphite (FIG. 12) and lift off mica sheets bonded to $SiO_2$, indicating that the stamp-microstructure interface is strong enough at high separation rates to remove structures bound to a donor substrate at least as strongly as 6 J/m$^2$. The high adhesive strength present at high separation rates reduces to minimal levels at low rates.

EXAMPLE 3

Transfer Printing of Globular Geometries

Figure 13:
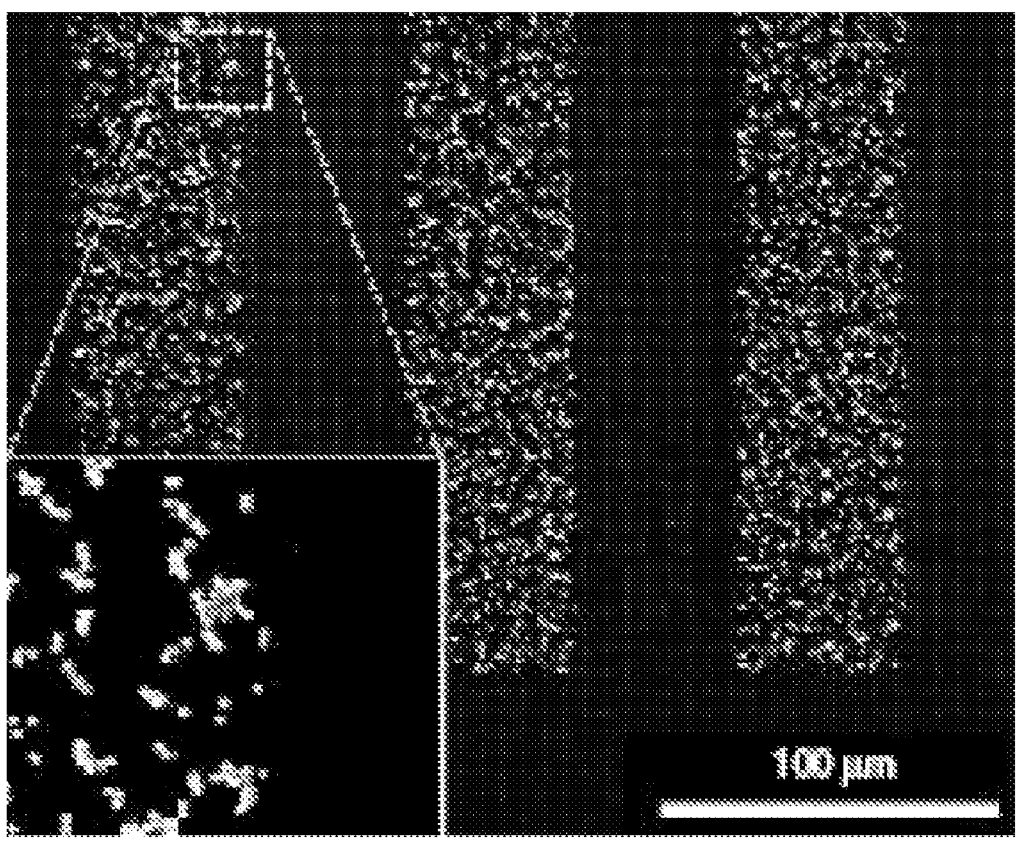
FIG. 13 is an image of silica microspheres picked up from and subsequently printed onto silicon wafers by means of PDMS stamps and controlled separation rates. Relief features in the stamp define the stripe pattern on the substrate surface.
Figure 14:
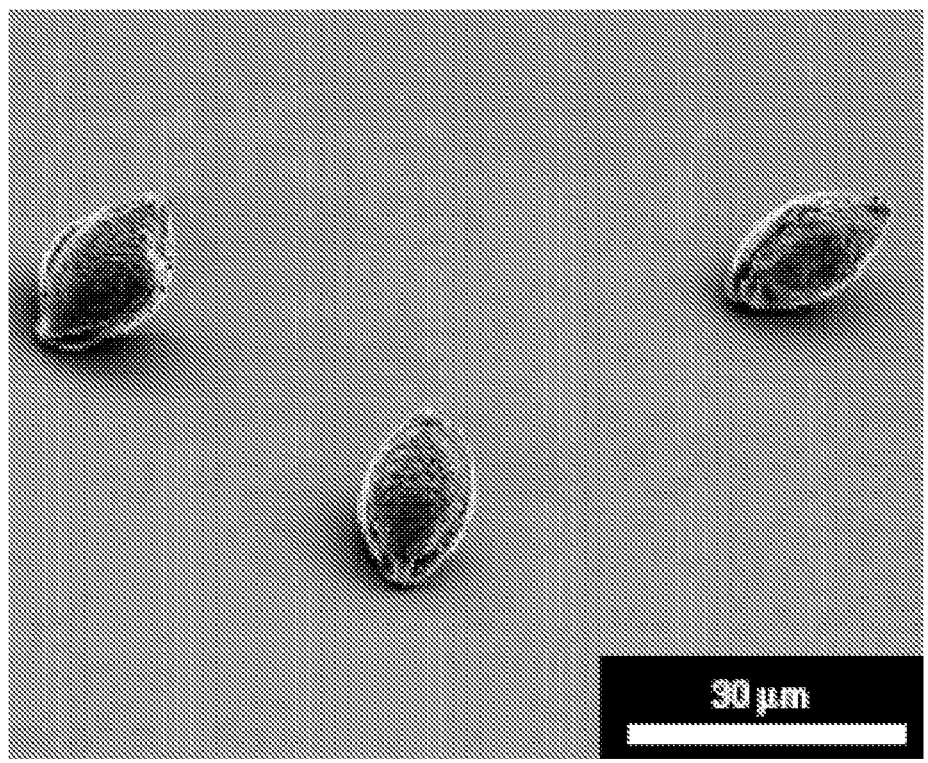
FIG. 14 is an image of African Violet pollen grains picked up from and subsequently printed onto silicon wafers by means of PDMS stamps and controlled separation rates.

The transfer devices disclosed herein can pick-up and release, for example, highly non-planar, globular structures, such as silica microspheres (FIG. 13) and grains of pollen (FIG. 14), which have very small areas of contact to rigid receiving substrates.

EXAMPLE 4

Figure 15:
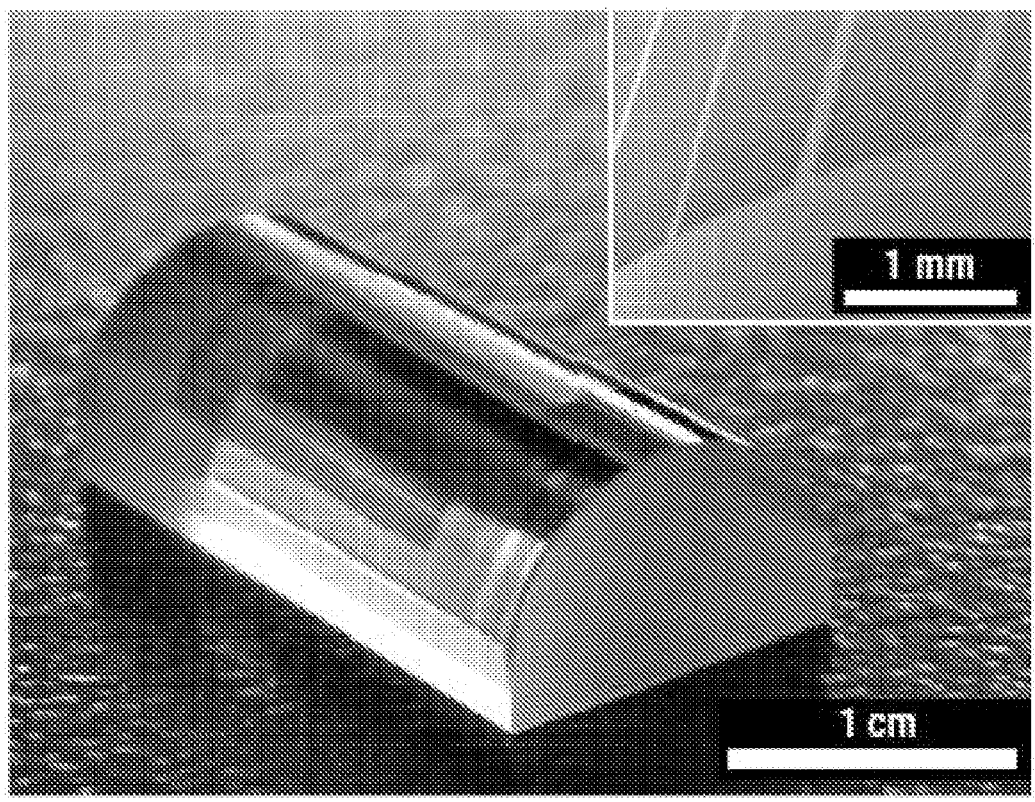
FIG. 15 is an image of a printed array formed by rolling a cylindrical glass lens across a stamp inked with microstructures. The inset is an SEM image of the stamp inked with microstructures.
Figure 16:
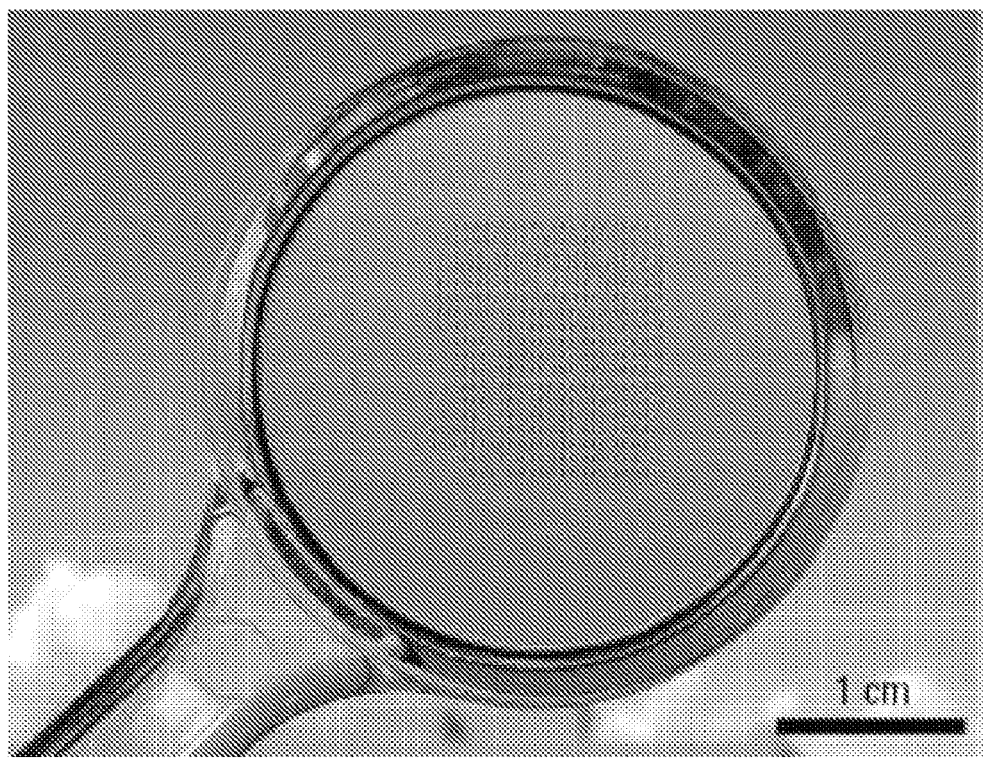
FIG. 16 is an image of a printed array formed by pressing a double-convex polycarbonate magnifying glass into the soft, inked stamp.
Figure 17:
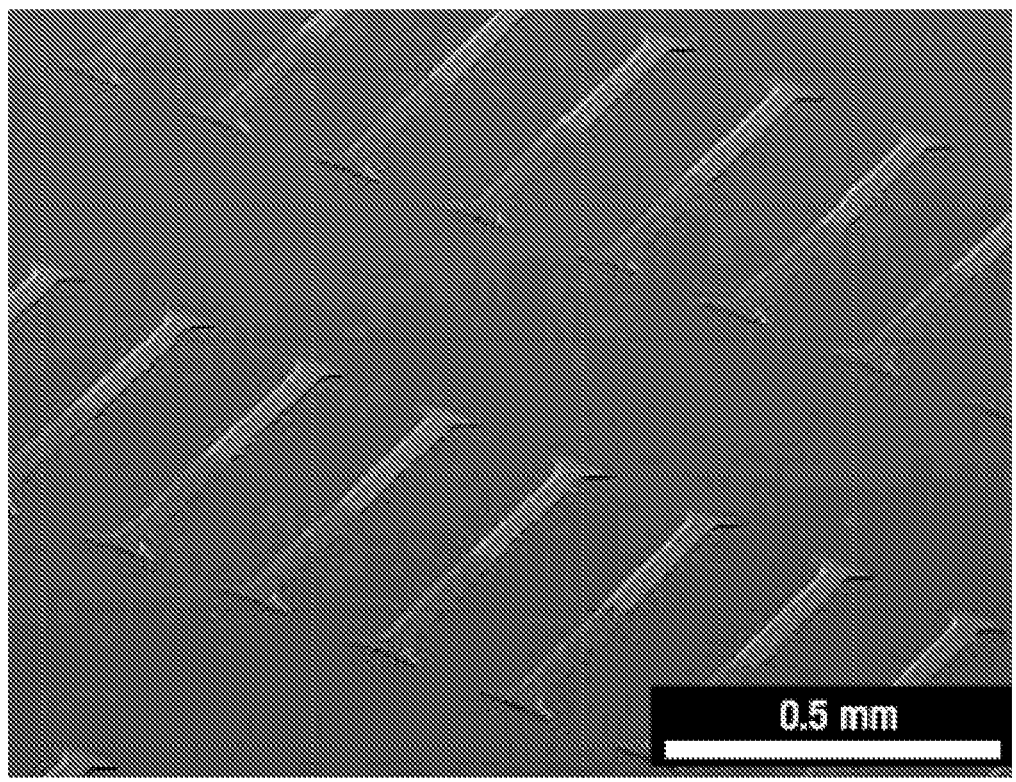
FIG. 17 is an image of silicon photodiodes printed on a spherical glass surface (p-doped regions seem brighter).
Figure 18:
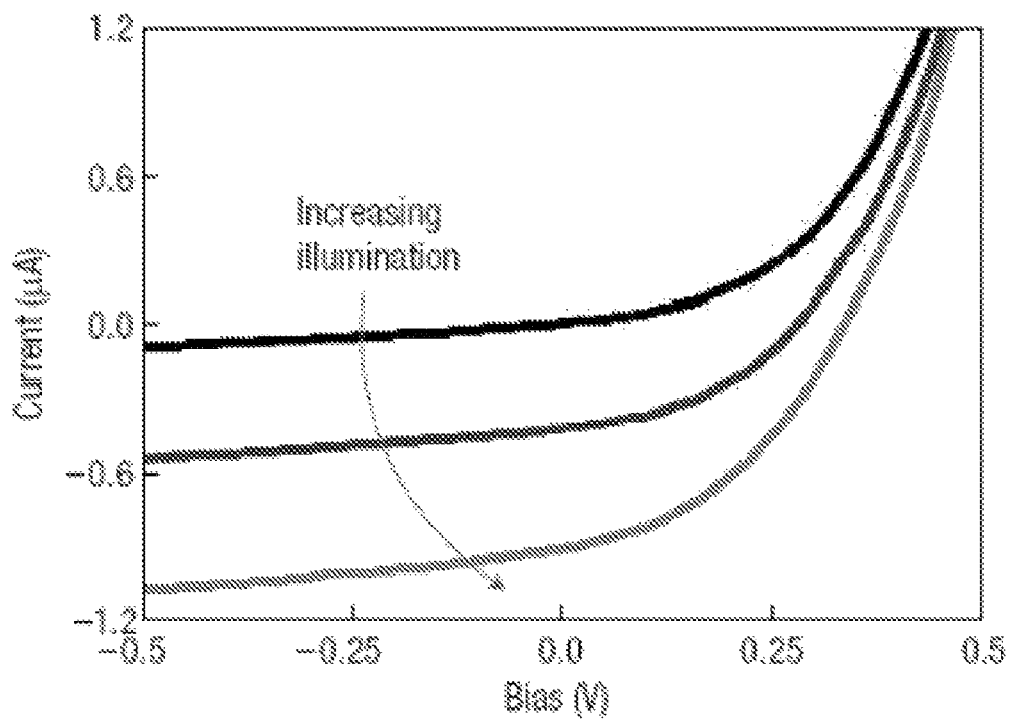
FIG. 18 is a plot of current as a function of voltage bias for various illumination conditions of printed silicon photodiodes similar to those in FIG. 17.
Figure 19:
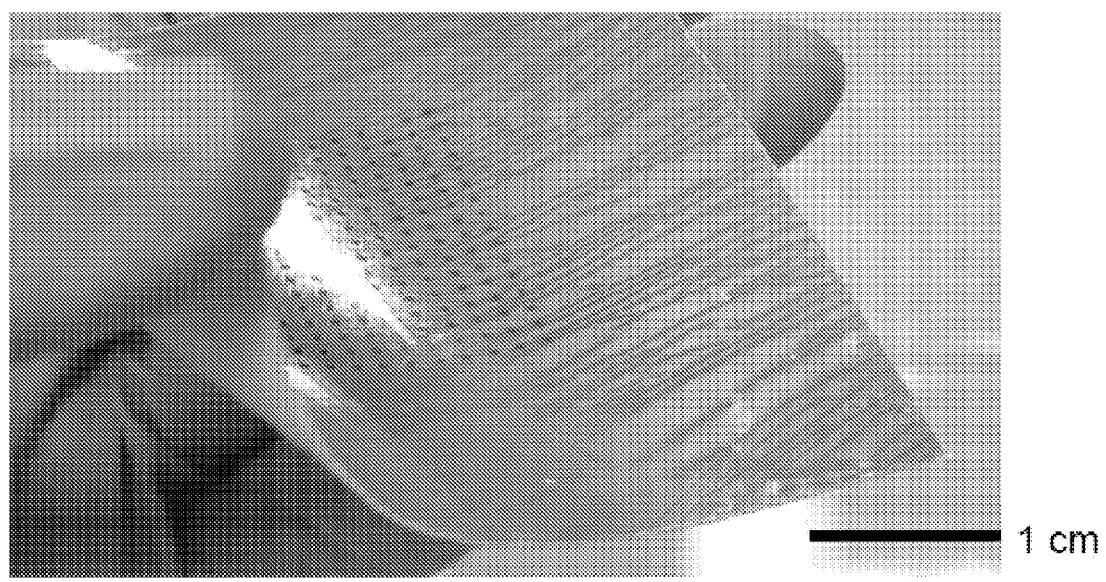
FIG. 19 is an image of relatively large (about 1 mm) silicon features printed onto paper. Silicon features were removed from a donor substrate using fast separation rates to enable efficient retrieval onto a PDMS transfer element and then printed onto paper coated with a thin (about 10 micron) coat of PDMS coated with Ti/Au. The bottom surfaces of the silicon features were coated with Ti/Au such that strong binding between the paper and the features occurred through gold cold-welding.

Transfer Printing of Silicon Microstructures and Solar Cells onto Curved Surfaces by Rolling and Pressing The transfer printing processes disclosed herein have many applications in established technologies: its unusual capabilities create other device opportunities. To illustrate one such capability, silicon structures and photodiodes are printed onto the curved surfaces of lenses. Non-planar printing proceeds by rolling a cylindrical substrate across, or by pressing a spherical substrate against, a flat, compliant stamp. FIG. 15 shows arrays of silicon microstructures printed onto a cylindrical glass lens. FIG. 16 shows arrays of silicon microstructures printed onto a low-cost spherical polycarbonate lens. FIG. 17 illustrates fully functional single-crystal silicon photodiodes printed onto a glass lens with the current-voltage characteristics of a typical device (FIG. 18). Such non-planar microfabrication is valuable for applications including light detection and energy generation on curved focusing or imaging optics.

Donor Substrate Preparation: In an embodiment, silicon microstructures are generated from SOI wafers (Shin-Etsu, top silicon 3.0 µm, buried oxide 1.1 µm, n-type resistivity 5-20 Ωcm; or Soitec, top silicon 100 nm, buried oxide 200 nm, p-type) patterned by conventional photolithography and phase-shift photolithography[27] with Shipley 1805 photoresist (PR). The top silicon is etched by $SF_6$ plasma (30 mtorr, 40 s.c.c.m. SF6, 50W) using PR as an etch mask or by aqueous KOH (20 wt %, 100° C.) using an etch mask of Ti/Au (3/30 nm) deposited by electron-beam evaporation. Ti/Au etch masks are removed after KOH etching using $KI/I_2$ (2.67/0.67 wt %) in water. The buried oxide is then etched in concentrated HF.

GaN microstructures are generated from a GaN-on-silicon (111) wafer (Nitronex). The nitride is etched in an inductively coupled plasma reactive ion etcher (3 mtorr, 15 s.c.c.m. $Cl_2$, 5 s.c.c.m. Ar, −100 V bias) using PECVD $SiO_x$ (500 nm) and Cr (150 nm) as an etch mask. Microstructures are then undercut by etching the silicon in aqueous KOH (20 wt %, 100° C.).

Mica (grade V-1, Structure Probe) is softened in an inductively coupled plasma reactive ion etcher (3 mtorr, 15 s.c.c.m. $BCl_3$, 5 s.c.c.m. Ar, −90 V bias) using electron-beam evaporated Cr (100 nm) and PR as a mask. Unpatterned grade V-1 mica and graphite substrates (grade SPI-1, Structure Probe) are used as-received.

Silica microsphere films are prepared by casting droplets of IPA and an aqueous suspension of microspheres onto a silicon wafer and allowing them to dry. Pollen films are also prepared by suspension casting and drying on a silicon wafer.

PDMS Transfer Preparation: PDMS stamps (Dow-Sylgard 184) are cast against flat substrates (for example, polystyrene petri dishes, Fisher Scientific) and cut to dimensions typically about 2 cm×2 cm×7 mm thick. Stamps are laminated against donor substrates such that conformal contact is achieved and subsequently removed manually in a peeling manner such that the delamination front traveled at 10 cm/s or faster. The stamps thus 'inked' with objects from the donor are then laminated against receiving substrates and subsequently removed by slow (about 1 mm/s) manual separation or peeling to complete the transfer-printing process.

Printed Junction Diode Fabrication: SOI chips (Shin-Etsu) are heavily n-doped at the top surface with spin-on-dopant (Zhue et al.) (P509, Filmtronics) and activation at 950° C. for 5 s. Microstructures generated as described above are printed onto boron-doped test-grade silicon chips (Montco, resistivity 1-100 Ωcm). Before printing, the receiving substrate is dipped in about 1% HF to remove native oxide, rinsed with deionized water and dried in $N_2$. The printed junction is then annealed for 2 min at 600° C. in $N_2$. Metal contacts are defined by photolithography with Shipley 1818 and lift-off of electron-beam-evaporated Al/Au (20/50 nm). The contacts are made non-rectifying by 4 min of annealing at 500° C.

Photodiode Fabrication Silicon photodiodes are generated from an n-type SOI wafer (Shin-Etsu) with selected areas highly n-doped (P509, Filmtronics) and other areas highly p-doped (B-75x, Honeywell). Doped regions are defined using windows in a spin-on glass (700B, Filmtronics) and the dopants are activated by annealing as described above (Zhu et al.) for the printed junction fabrication, first n-type, then p-type. Structures are subsequently micromachined using SF6 plasma and undercut with HF.

EXAMPLE 5

Transfer Printing of Layered Patterns with Kinetically-Controllable Depth

Figure 28:
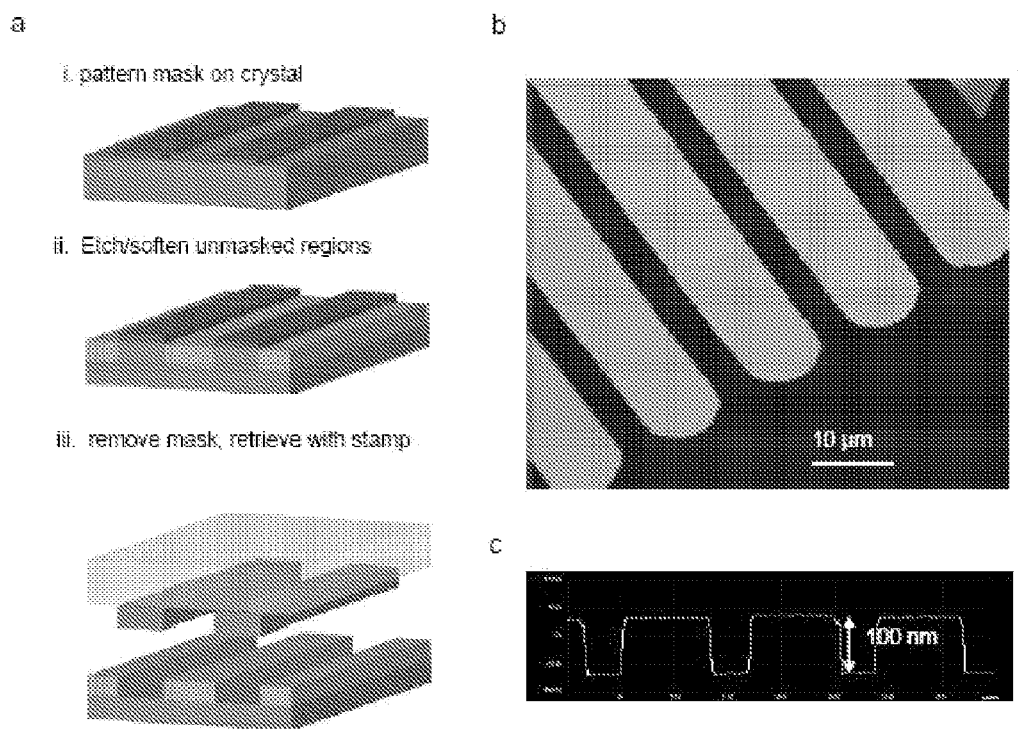
FIG. 28A illustrates a process for removing layers by applying a pattern mask on crystal (panel i); etching/softening unmasked regions (panel ii); contacting and removing the pattern layer with a kinetically-controllable elastomeric stamp (panel iii). B. is an SEM of thin mica printed onto SiO2 using the process outlined in A. C. is an AFM line trace of the cross-section of the mica ribbons printed onto $SiO_2$ using the process outlined in A.

Another aspect of the invention is using the elastomeric and/or viscoelastic transfer devices of the present invention to transfer layers, wherein the depth or thickness of the transferred layer is kinetically controllable (FIG. 28). Generally, the faster the separation rate, the greater the transfer layer thickness. Accordingly, by controlling the separation rate, the thickness or depth of the transfer layer is controlled.

The composition of the transfer layer is a material that comprises layers including, but not limited to, graphite, graphene and mica. The layers can have a structure comprising a series of repeating planar layers, as for graphite, wherein the layers are bound by van der Waals interactions. The present methods are also useful for transferring material and structures from materials comprising a series of nonplanar layers. The layers can also be bound by any one or more of other forces, including London, hydrogen bonding, covalent bonding and ionic bonding. The magnitude of bonding between layers will affect the separation rate required to lift-off a layer of a certain depth, with layers having stronger adhesion requiring higher separation rates.

FIG. 28A summarizes the general process. First, an appropriate external surface of a substrate comprising a layered structure, such as graphite, graphene or mica, for example, is patterned masked. In an embodiment, the pattern is one or more masked regions having selected physical dimensions, spatial orientations and positions. Exemplary patterns comprise ribbons, platelets, strips, discs or any combination of these. The geometry and physical dimensions of the mask regions in this embodiment defines the geometry and physical dimensions of the features that are to be transferred. The unmasked regions are then etched and/or softened by dry or wet processes to chemically alter the unmasked region. The mask on the external surface of the substrate can be optionally removed. An elastomeric device is brought into contact with the pattern for lifting off or releasing the pattern. By varying the separation rate of the transfer surface with the pattern, the thickness of the transfer pattern is varied. This is shown for a graphite layer (FIG. 12), as well as a mica layer (FIGS. 28b and c).

The depth of the lift-off pattern or layer(s) depends on a number of factors, including: (i) the physical dimension of the masked region; (ii) the composition of the pattern; (iii) the etching or chemical alternation system employed; and (iv) the kinetic rate or separation rate of the transfer device from the donor surface containing the pattern, with faster pull-off rates resulting in a larger number of layers that lift-off and are transferred to the transfer surface device.

STATEMENTS REGARDING INCORPORATION BY REFERENCE AND VARIATIONS

All references cited throughout this application, for example patent documents including issued or granted patents or equivalents; patent application publications; and non-patent literature documents or other source material are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Every formulation or combination of components described or exemplified herein can be used to practice the invention, unless otherwise stated.

Whenever a range is given in the specification, for example, a temperature range, a size range, a conductivity range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein. All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, materials, reagents, synthetic methods, purification methods, analytical methods, assay methods, and methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

REFERENCES

1. Georgakilas, A. et al. Wafer-scale integration of GaAs optoelectronic devices with standard Si integrated circuits using a low-temperature bonding procedure. Appl. Phys. Lett. 81, 5099-5101 (2002).
2. Yeh, H.-J. J. & Smith, J. S. Fluidic self-assembly for the integration of GaAs light-emitting diodes on Si substrates. IEEE Photon. Technol. Lett. 6, 706-708 (1994).
3. Ambrosy, A., Richter, H., Hehmann, J. & Ferling, D. Silicon motherboards for multichannel optical modules. IEEE Trans. Compon. Pack. A 19, 34-40 (1996).
4. Lambacher, A. et al. Electrical imaging of neuronal activity by multi-transistor-array (MTA) recording at 7.8 µm resolution. Appl. Phys. A 79, 1607-1611 (2004).
5. Menard, E., Lee, K. J., Khang, D.-Y., Nuzzo, R. G. & Rogers, J. A. A printable form of silicon for high performance thin film transistors on plastic substrates. Appl. Phys. Lett. 84, 5398-5400 (2004).
6. Zhu, Z.-T., Menard, E., Hurley, K., Nuzzo, R. G. & Rogers, J. A. Spin on dopants for high-performance single-crystal silicon transistors on flexible plastic substrates. Appl. Phys. Lett. 86, 133507 (2005).
7. Sun, Y. & Rogers, J. A. Fabricating semiconductor nano/microwires and transfer printing ordered arrays of them onto plastic substrates. Nano Lett. 4, 1953-1959 (2004).
8. Jacobs, H. O., Tao, A. R., Schwartz, A., Gracias, D. H. & Whitesides, G. M. Fabrication of a cylindrical display by patterned assembly. Science 296, 323-325 (2002).
9. Reuss, R. H. et al. Macroelectronics: Perspectives on technology and applications. Proc. IEEE 93, 1239-1256 (2005).
10. Haisma, J. & Spierings, G. A. C. M. Contact bonding, including direct-bonding in a historical and recent context of materials science and technology, physics and chemistry-historical review in a broader scope and comparative outlook. Mater. Sci. Eng. R 37, 1-60 (2002).
11. Zheng, W. & Jacobs, H. O. Shape- and solder-directed self-assembly to package semiconductor device segments. Appl. Phys. Lett. 85, 3635-3637 (2004).
12. Bowden, N., Terfort, A., Carbeck, J. & Whitesides, G. M. Self-assembly of mesoscale objects into ordered two-dimensional arrays. Science 276, 233-235 (1997).
13. O'Riordan, A., Delaney, P. & Redmond, G. Field configured assembly: programmed manipulation and self-assembly at the mesoscale. Nano Lett. 4, 761-765 (2004).
14. Tanase, M. et al. Magnetic trapping and self-assembly of multicomponent nanowires. J. Appl. Phys. 91, 8549-8551 (2002).
15. Hsia, K. J. et al. Collapse of stamps for soft lithography due to interfacial adhesion. Appl. Phys. Lett. 86, 154106 (2005).
16. Huang, Y. Y. et al. Stamp collapse in soft lithography. Langmuir 21, 8058-8068 (2005).
17. Roberts, A. D. Looking at rubber adhesion. Rubber Chem. Technol. 52, 23-42 (1979).
18. Barquins, M. Adherence, friction and wear of rubber-like materials. Wear 158, 87-117 (1992).
19. Shull, K. R., Ahn, D., Chen, W.-L., Flanigan, C. M. & Crosby, A. J. Axisymmetric adhesion tests of soft materials. Macromol. Chem. Phys. 199, 489-511 (1998).
20. Brown, H. R. The adhesion between polymers. Annu. Rev. Mater. Sci. 21, 463-489 (1991).
21. Deruelle, M., L'eger, L. & Tirrell, M. Adhesion at the solid-elastomer interface: influence of interfacial chains. Macromolecules 28, 7419-7428 (1995).
22. Hutchinson, J. W. & Suo, Z. Mixed mode cracking in layered materials. Adv. Appl. Mech. 29, 63-191 (1992).
23. Lee, K. J. et al. Large-area, selective transfer of microstructured silicon (µs-Si): a printing-based approach to high-performance thin-film transistors supported on flexible substrates. Adv. Mater. 17, 2332-2336 (2005).

24. Aoki, K. et al. Microassembly of semiconductor three dimensional photonic crystals. Nature Mater. 2, 117-121 (2003).
25. Noda, S., Yamamoto, N. & Sasaki, A. New realization method for three-dimensional photonic crystal in optical wavelength region. Jpn J. Appl. Phys. 35, L909-L912 (1996).
26. Horn, R. G. & Smith, D. T. Contact electrification and adhesion between dissimilar materials. Science 256, 362-364 (1992).
27. Rogers, J. A., Paul, K. E., Jackman, R. J. & Whitesides, G. M. Using an elastomeric phase mask for sub-100 nm photolithography in the optical near field. Appl. Phys. Lett. 70, 2658-2660 (1997).

We claim:

1. A method of transferring a feature from a donor substrate surface to a receiving surface of a receiving substrate, said method comprising:
   providing an elastomeric transfer device having a transfer surface;
   providing a donor substrate having a donor surface, said donor surface having at least one feature;
   contacting at least a portion of said transfer surface with at least a portion of said feature;
   separating said transfer surface from said donor surface at a first separation rate such that at least a portion of said feature is transferred from said donor surface to said transfer surface, thereby forming said transfer surface having said feature disposed thereon;
   contacting at least a portion of said feature disposed on said transfer surface with said receiving surface of said receiving substrate; and
   separating said transfer surface from said feature at a second separation rate, wherein said first separation rate is larger than said second separation rate, thereby transferring said feature to said receiving surface.

2. The method of claim 1 wherein said elastomeric transfer device comprises at least one elastomer layer having a Young's Modulus selected over the range of about 1 MPa to about 20 MPa.

3. The method of claim 1 wherein said elastomeric transfer device comprises at least one elastomer layer having a thickness selected over the range of about 1 micron to about 100 microns.

4. The method of claim 1 wherein said elastomeric transfer device comprises an elastomeric stamp, elastomeric mold or elastomeric mask.

5. The method of claim 1 wherein said elastomeric transfer device comprises polydimethylsiloxane.

6. The method of claim 1 wherein conformal contact is established between the transfer surface of said elastomeric transfer device and an external surface of said feature.

7. The method of claim 1 wherein conformal contact is established between the transfer surface having said feature disposed thereon and said receiving surface of said receiving substrate.

8. The method of claim 1 wherein said first separation rate is at least 10 times larger than said second separation rate.

9. The method of claim 1 wherein said first separation rate is greater than or equal to about 1 cm second$^{-1}$.

10. The method of claim 1 wherein said second separation rate is less than or equal to about 1 mm second$^{-1}$.

11. The method of claim 1 wherein said feature has a length selected over the range of about 100 nanometers to about 1000 microns, a width selected over the range of about 100 nanometers to about 1000 microns and a thickness selected over the range of about 1 nanometer to about 1000 microns, wherein said first separation rate is selected over the range of about 100 cm second$^{-1}$ to 0.1 mm second$^{-1}$.

12. The method of claim 1 wherein said feature has a length selected over the range of about 100 nanometers to about 1000 microns, a width selected over the range of about 100 nanometers to about 1000 microns and a thickness selected over the range of about 1 nanometer to about 1000 microns, wherein said second separation rate is selected over the range of about 0.1 mm second$^{-1}$ to 100 cm second$^{-1}$.

13. The method of claim 1 wherein said first separation rate is selected so as to generate a separation energy between said feature and said transfer surface of said elastomeric transfer device per unit area equal to or greater than 1 J/meter$^2$.

14. The method of claim 1 wherein said first separation rate, said second separation rate or both is substantially constant as a function of separation time.

15. The method of claim 1 wherein said first separation rate, said second separation rate or both varies selectively as a function of time.

16. The method of claim 1 wherein said feature is connected to said donor surface, and wherein said first separation rate is large enough so as to cause release of said feature from said donor surface.

17. The method of claim 1 wherein said feature is connected to said donor surface via at least one bridge element, wherein said first separation rate is large enough to cause fracture of said bridge element, thereby resulting in release of said feature from said donor surface.

18. The method of claim 1 wherein said feature is a free standing structure supported by said donor surface, wherein said first separation rate is large enough to release said structure from said donor surface.

19. The method of claim 1 wherein said feature is a micro-sized structure or a nano-sized structure.

20. The method of claim 1 wherein said feature is a printable semiconductor element.

21. The method of claim 1 wherein said feature is selected from the group consisting of: an electronic device, a component of an electronic device, a diode, a transistor, a photovoltaic device, a sensor, a light emitting diode, a microelectromechanical device, a nanoelectromechanical device, a photodiode, a wire, a small container, a pill, a laser, and a P-N junction.

22. The method of claim 1 wherein said feature comprises a pattern of microstructures, nanostructures or both, said method further comprising transferring said pattern of microstructures, nanostructures or both from said donor surface to said receiving surface.

23. The method of claim 1 wherein said receiving substrate is a material selected from the group consisting of: a polymer, a semiconductor wafer, a ceramic material, a glass, a metal, paper, a dielectric material, and any combination of these.

24. The method of claim 1 wherein said receiving surface is planar or contoured.

25. The method of claim 1 further comprising the step of providing an adhesive layer on said receiving surface, wherein said feature disposed on said transfer surface contacts said adhesive layer.

26. The method of claim 25 wherein the adhesive layer provides separation-rate dependent adhesive capabilities.

27. The method of claim 1 wherein said steps of: contacting at least a portion of said transfer surface with at least a portion of said feature; separating said transfer surface from said donor surface at said first separation rate; contacting at least a portion of said feature disposed on said transfer surface with said receiving surface of said receiving substrate; separating said transfer surface from said feature at a second separation rate or any combination of these steps is carried out via an actuator operationally connected to said transfer device.

28. The method of claim 1 comprising a method of registered transfer of said feature from said donor surface to said receiving surface.

29. The method of claim 1 wherein said feature comprises a pattern of structures wherein substantially all the structures in contact with said transfer surface are transferred to said receiving surface.

30. The method of claim 1 further comprising repeating at least a portion of said steps so as to generate multi-layered features on said receiving surface.

31. A method of assembling a printable semiconductor element on a receiving surface of a receiving substrate, said method comprising:
    providing an elastomeric transfer device having a transfer surface;
    providing a donor substrate having a donor surface, said donor surface having at least one printable semiconductor element, wherein said printable semiconductor element is connected to said donor substrate via at least one bridge element;
    contacting at least a portion of said transfer surface with at least a portion of said printable semiconductor element;
    separating said transfer surface from said donor surface at a first separation rate such that said bridge element is fractured and said printable semiconductor element is transferred from said donor surface to said transfer surface, thereby forming said transfer surface having said printable semiconductor element disposed thereon;
    contacting at least a portion of said printable semiconductor element disposed on said transfer surface with said receiving surface of said receiving substrate; and
    separating said transfer surface from said feature at a second separation rate, wherein said first separation rate is larger than said second separation rate, thereby transferring said printable semiconductor element to said receiving surface.

32. The method of claim 31 comprising a method of registered transfer of said printable semiconductor from said donor surface to said receiving surface.

33. The method of claim 31 further comprising the steps of: providing a plurality of printable semiconductor elements wherein each of said printable semiconductor element is connected to said donor substrate via at least one bridge element; said method further comprising the steps of:
    contacting at least a portion of said transfer surface with at least a portion of said pattern of printable semiconductor element;
    separating said transfer surface from said donor surface at a first separation rate such that at least a portion of said bridge elements are fractured and at least a portion of said pattern of printable semiconductor elements is transferred from said donor surface to said transfer surface, thereby forming said transfer surface having said printable semiconductor elements disposed thereon;
    contacting at least a portion of said printable semiconductor elements disposed on said transfer surface with said receiving surface of said receiving substrate; and
    separating said transfer surface from said feature at a second separation rate, wherein said first separation rate is larger than said second separation rate, thereby transferring at least a portion of said pattern of printable semiconductor elements to said receiving surface.

34. The method of claim 33 wherein said portion of said pattern of printable semiconductor elements is transferred with good fidelity.

35. The method of claim 33 wherein said portion of said pattern of printable semiconductor elements is transferred to a selected region of said receiving surface with a placement accuracy greater than or equal to about 25 microns over a receiving surface area equal to about 5 cm$^2$.

36. The method of claim 33 comprising a method of making an electronic device, array of electronic devices or component of an electronic device selected from the group consisting of: a p-n junction; a photodiode, a transistor, a light emitting diode, a laser, a photovoltaic device, a memory device, a microelectromechanical device; a nanoelectromechanical device; and a complementary logic circuit.

37. A method of transferring a printable semiconductor element from a donor substrate surface to a transfer surface of an elastomeric transfer device, said method comprising:
    providing an elastomeric transfer device having said transfer surface;
    providing a donor substrate having a donor surface, said donor surface having said printable semiconductor element;
    contacting at least a portion of said transfer surface with at least a portion of said printable semiconductor element;
    separating said transfer surface from said donor surface at a rate greater than or equal to about 1 cm second$^{-1}$ such that at least a portion of said printable semiconductor element is transferred from said donor surface to said transfer surface.

38. The method of claim 37 wherein said printable semiconductor element is connected to said donor substrate via one or more bridge elements, wherein said separation rate is large enough to cause fracture of said bridge element, thereby resulting in release of said printable semiconductor element from said donor surface.

39. A method of transferring an array of printable semiconductor elements from a donor substrate surface to a transfer surface of an elastomeric transfer device, said method comprising:
    providing an elastomeric transfer device having said transfer surface;
    providing a donor substrate having a donor surface, said donor surface having said array of printable semiconductor elements;
    contacting at least a portion of said transfer surface with at least a portion of said array printable semiconductor elements;
    separating said transfer surface from said donor surface at a rate greater than or equal to about 1 cm second$^{-1}$ such that at least a portion of said array of printable semiconductor elements is transferred from said donor surface to said transfer surface.

40. A method of temporarily transferring a feature from a donor substrate surface to a receiving surface of a receiving substrate for processing, said method comprising:
    providing an elastomeric transfer device having a transfer surface;
    providing a donor substrate having a donor surface, said donor surface having at least one feature;
    contacting at least a portion of said transfer surface with at least a portion of said feature;
    separating said transfer surface from said donor surface at a first separation rate such that at least a portion of said feature is transferred from said donor surface to said transfer surface, thereby forming said transfer surface having said feature disposed thereon;

contacting at least a portion of said feature disposed on said transfer surface with said receiving surface of said receiving substrate;

separating said transfer surface from said feature at a second separation rate, wherein said first separation rate is larger than said second separation rate, thereby transferring said feature to said receiving surface;

processing said feature on said receiving surface to generate a processed feature;

contacting at least a portion of said transfer surface with at least a portion of said processed feature; and separating said transfer surface from said receiving surface at a third separation rate such that at least a portion of said processed feature is transferred to said transfer surface.

* * * * *